(12) United States Patent
Masuoka et al.

(10) Patent No.: US 12,096,608 B2
(45) Date of Patent: Sep. 17, 2024

(54) PILLAR-SHAPED SEMICONDUCTOR DEVICE AND MANUFACTURING METHOD THEREOF

(71) Applicant: Unisantis Electronics Singapore Pte. Ltd., Singapore (SG)

(72) Inventors: Fujio Masuoka, Tokyo (JP); Nozomu Harada, Tokyo (JP); Yisuo Li, Singapore (SG)

(73) Assignee: UNISANTIS ELECTRONICS SINGAPORE PTE. LTD., Singapore (SG)

(*) Notice: Subject to any disclaimer, the term of this patent is extended or adjusted under 35 U.S.C. 154(b) by 507 days.

(21) Appl. No.: 17/493,251

(22) Filed: Oct. 4, 2021

(65) Prior Publication Data
US 2022/0028869 A1    Jan. 27, 2022

Related U.S. Application Data

(63) Continuation of application No. PCT/JP2019/015146, filed on Apr. 5, 2019.

(51) Int. Cl.
*H10B 10/00* (2023.01)
*H10K 59/121* (2023.01)

(52) U.S. Cl.
CPC ........... *H10B 10/12* (2023.02); *H10K 59/121* (2023.02); *G09G 2300/0819* (2013.01); *G09G 2300/0823* (2013.01)

(58) Field of Classification Search
CPC ..... H10K 59/121–1216; G09G 3/3655; G09G 2300/0819–0823
See application file for complete search history.

(56) References Cited

U.S. PATENT DOCUMENTS

| 5,416,350 A | 5/1995 | Watanabe |
| 5,692,884 A | 12/1997 | Allen et al. |
| 8,154,086 B2 | 4/2012 | Masuoka et al. |

(Continued)

FOREIGN PATENT DOCUMENTS

| JP | 02-188966 A | 7/1990 |
| JP | 06-268173 A | 9/1994 |

(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991).

(Continued)

*Primary Examiner* — Amar Movva
(74) *Attorney, Agent, or Firm* — Crowell & Moring LLP

(57) ABSTRACT

In a SRAM cell, a Si pillar, which is a selection SGT in upper row of Si pillars, is located on the left end in X direction. A Si pillar, which is a selection SGT in lower row of Si pillars, is located on the right end. The Si pillar of the lower row is present in a width of an area extended from a contact hole in Y direction in planar view. Then, the Si pillar of the upper row is present in a width of an area extended from a contact hole in Y direction in planar view. In each of the upper row and the lower row, a TiN layer, which is a gate electrode for a loading SGT and a driving SGT, is formed to contact at side surface of entire gate region in a vertical direction between the corresponding Si pillars.

10 Claims, 54 Drawing Sheets

(56) References Cited

U.S. PATENT DOCUMENTS

| 8,378,425 B2 | 2/2013 | Masuoka et al. |
| 2010/0219483 A1 | 9/2010 | Masuoka et al. |
| 2011/0018056 A1 | 1/2011 | Takeuchi |
| 2012/0181622 A1 | 7/2012 | Masuoka et al. |

FOREIGN PATENT DOCUMENTS

| JP | 2014-003325 A | 1/2014 |
| JP | 2014-099664 A | 5/2014 |
| JP | 2016-046271 A | 4/2016 |
| WO | WO2009/128337 A | 10/2009 |

OTHER PUBLICATIONS

C.Y.Ting, V.J.Vivalda, and H.G.Schaefer: "Study of planarized sputter-deposited SiO2", J.Vac.Sci. Technol. 15(3), pp. 1105-1112, May/Jun. 1978.

A.Raley, S.Thibaut, N. Mohanty, K. Subhadeep, S. Nakamura, et al. : "Self-aligned quadruple patterning integration using spacer on spacer pitch splitting at the resist level for sub-32nm pitch applications" Proc. Of SPIE vol. 9782, 2016.

International Preliminary Report on Patentability in Application No. PCT/JP2019/015146 dated Oct. 29, 2019, 5 pages.

English translation of International Preliminary Report on Patentability, in Application No. PCT/JP2019/015146, dated Oct. 7, 2021, 5 pages.

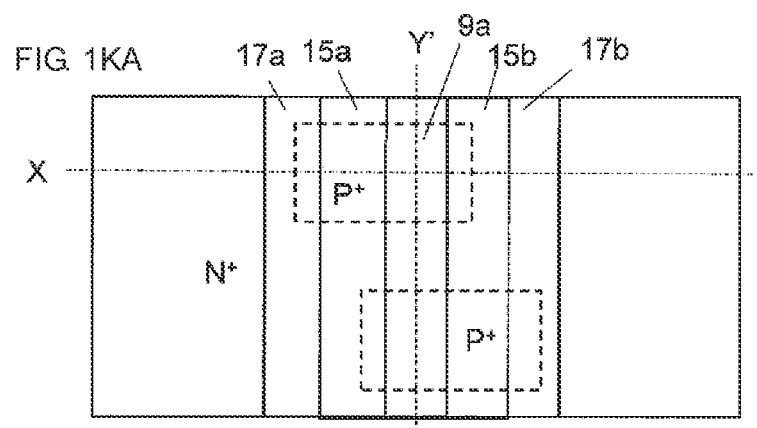
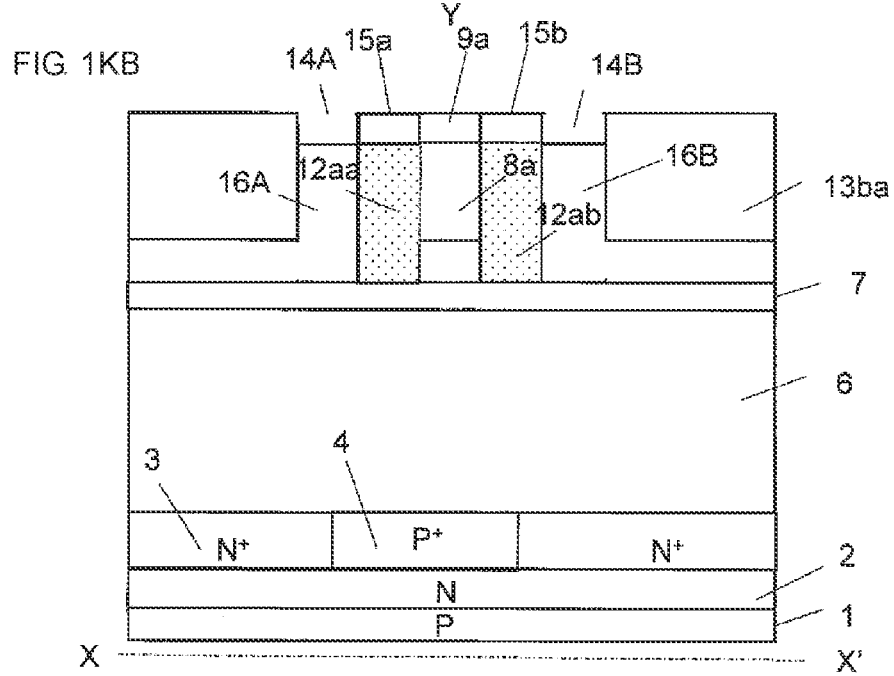
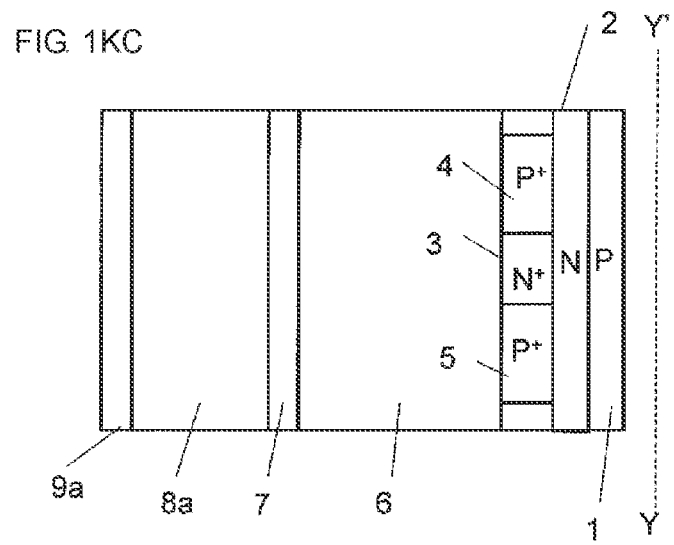

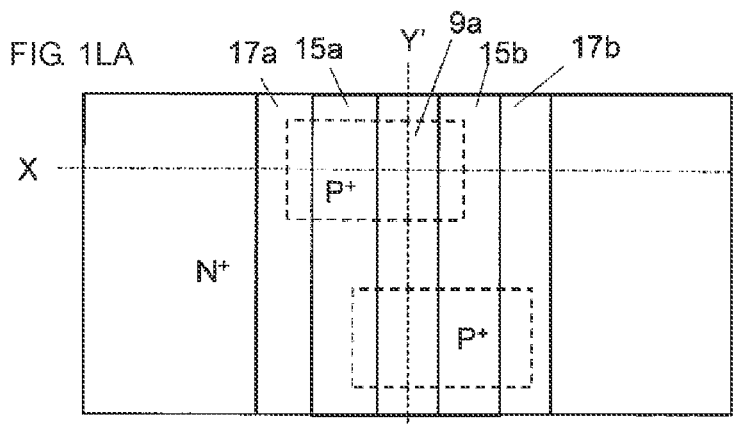
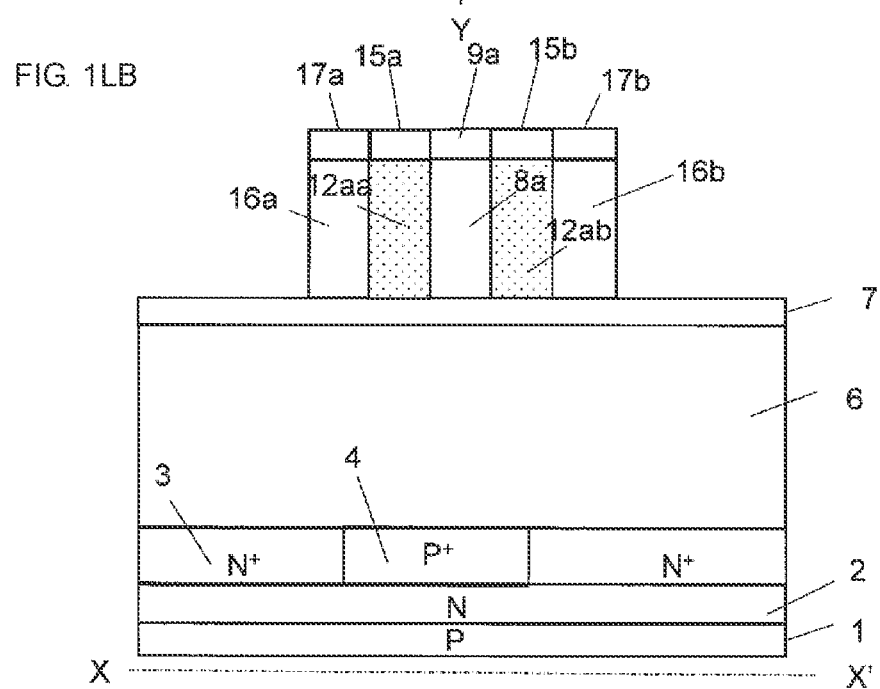
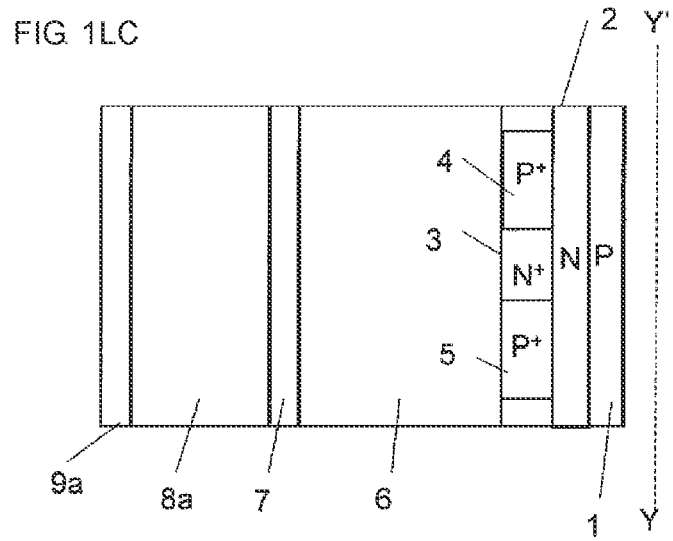

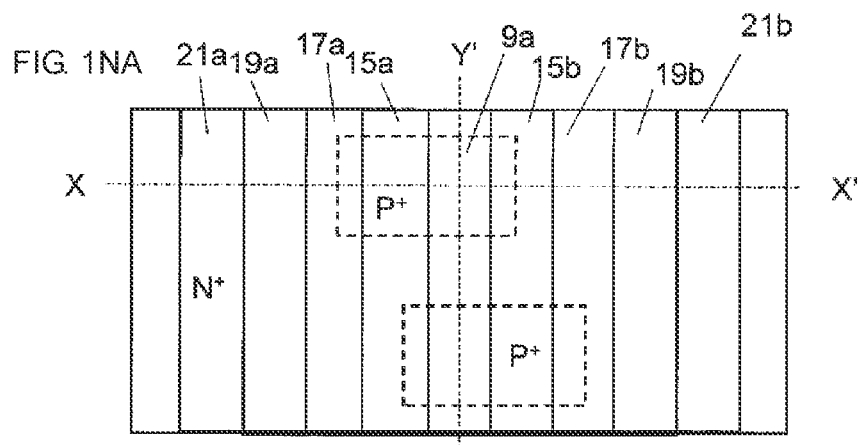
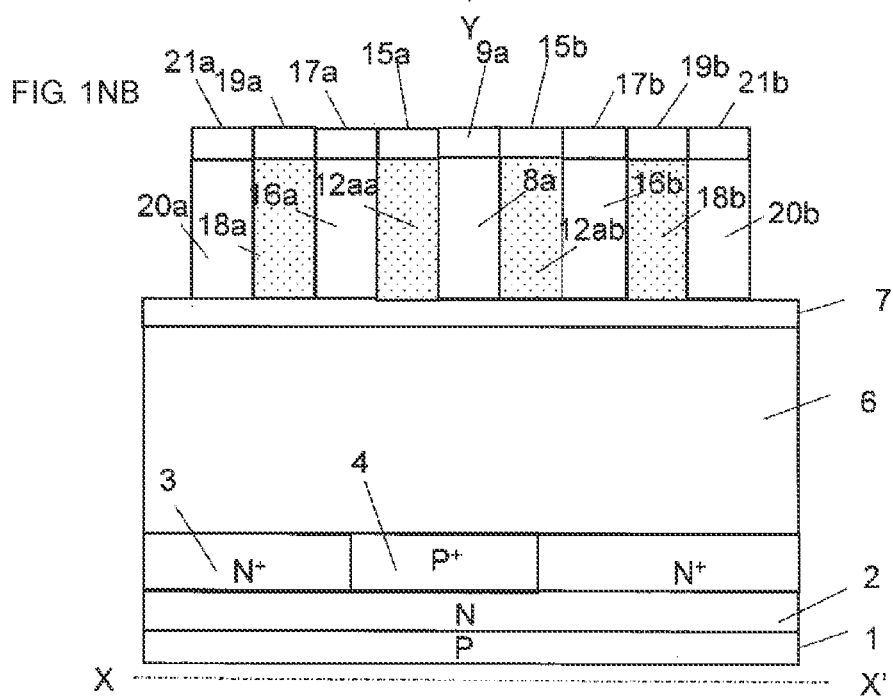
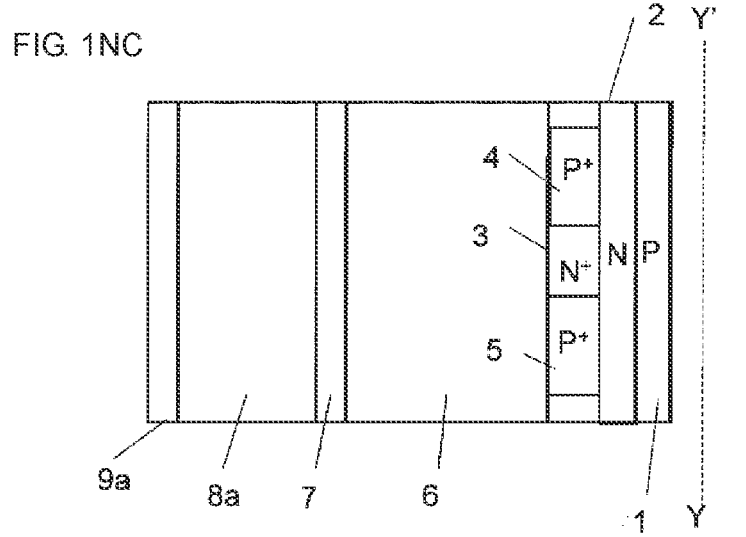

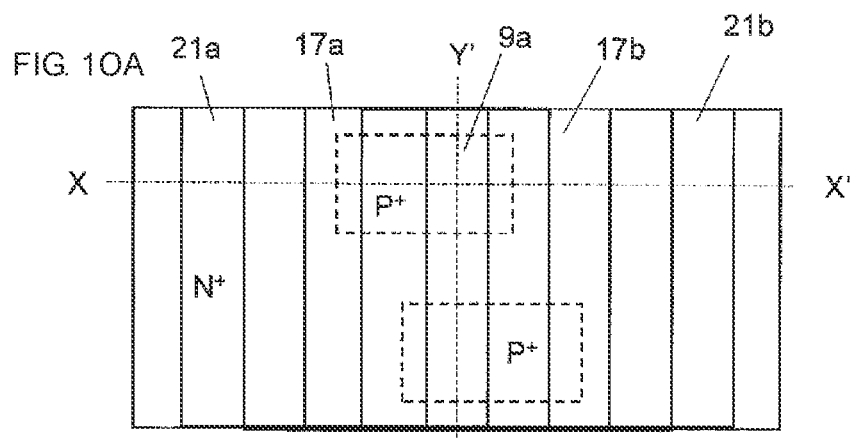
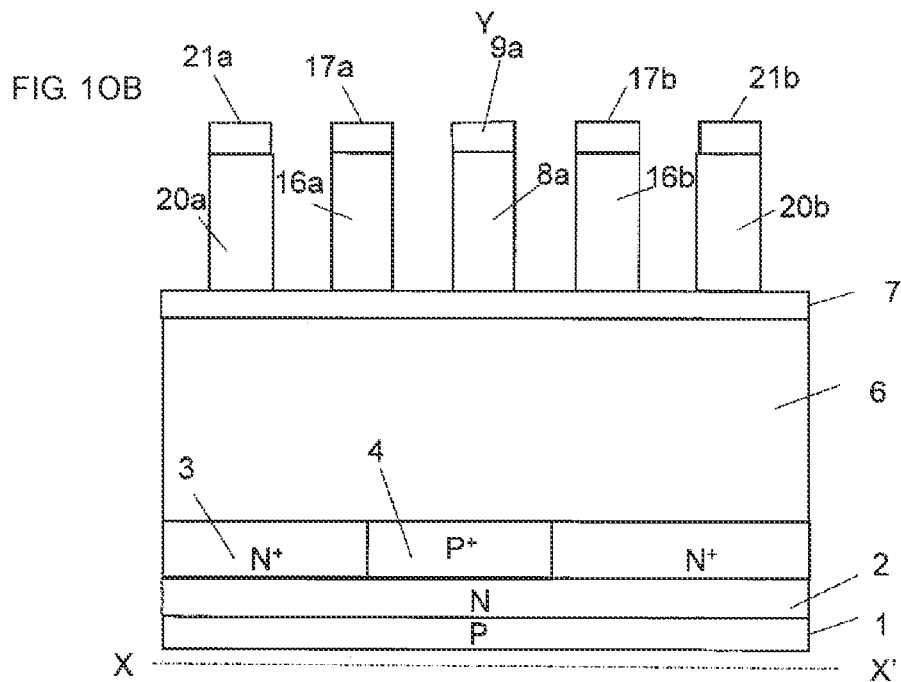
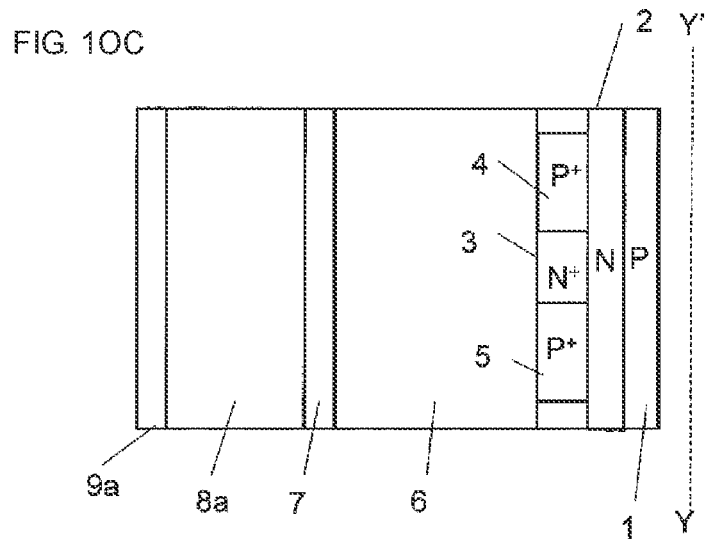

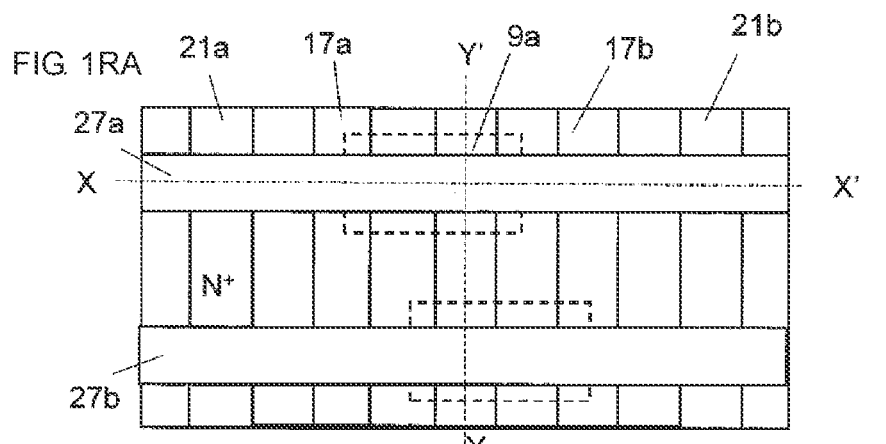
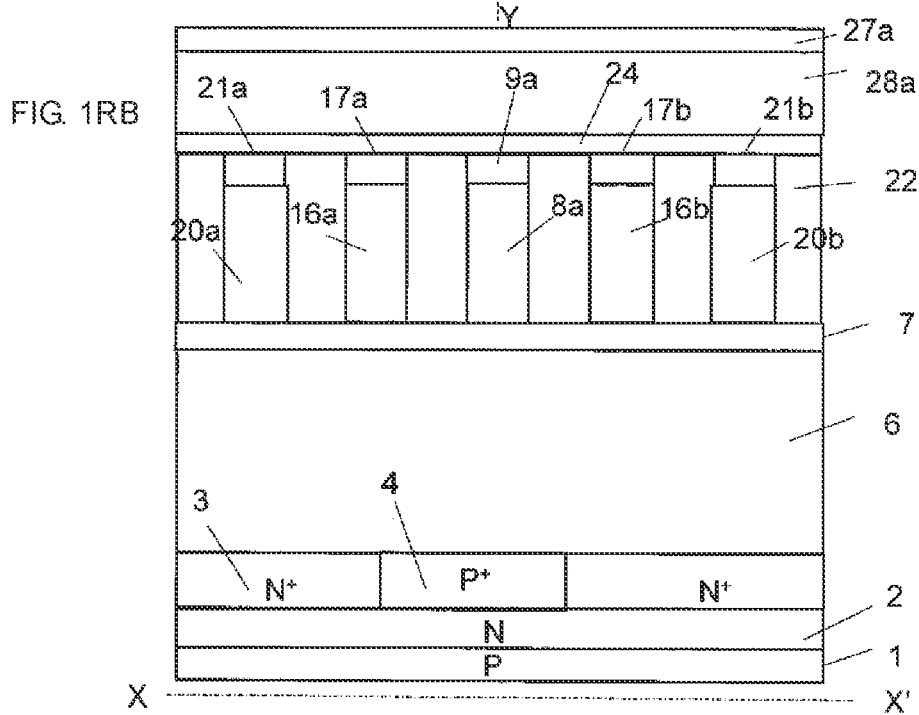
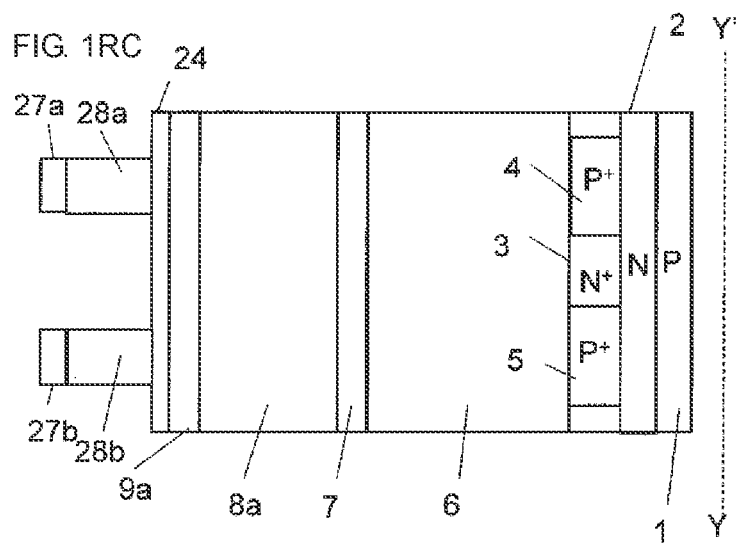

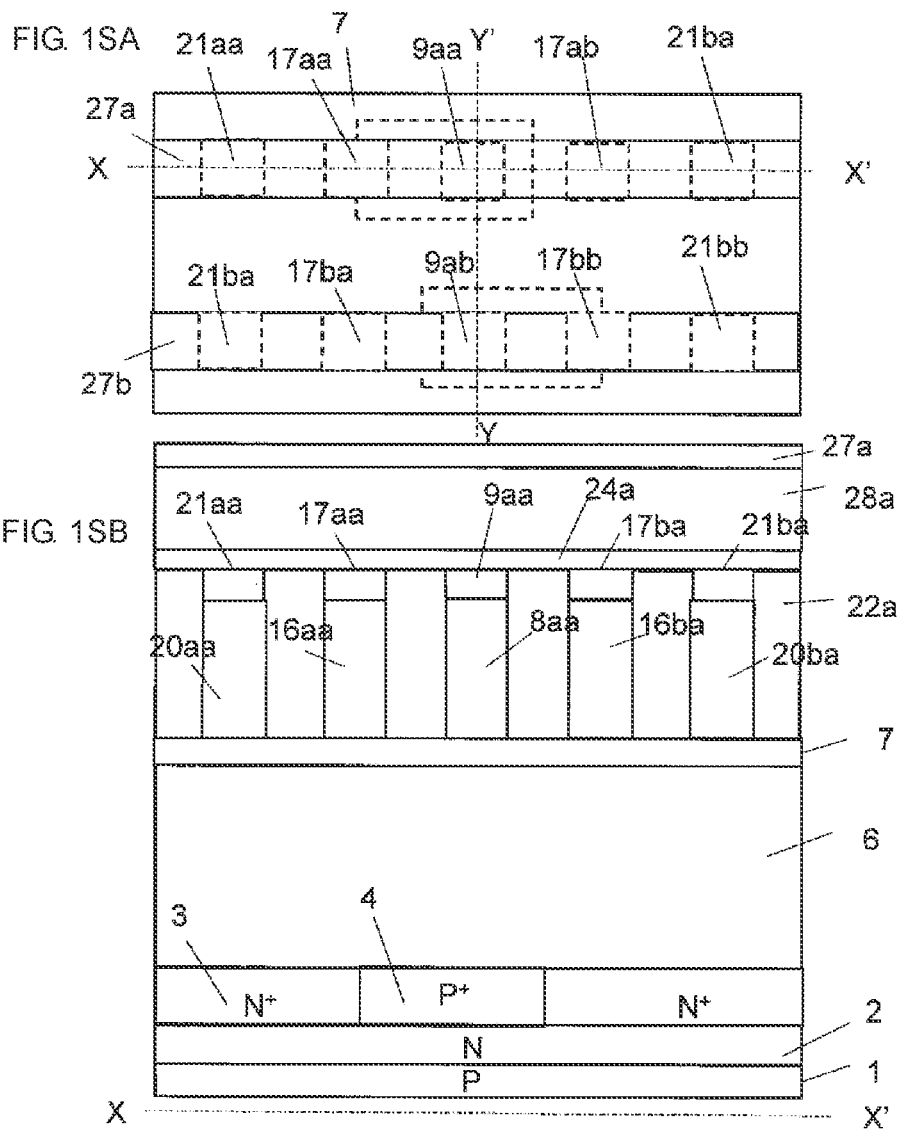
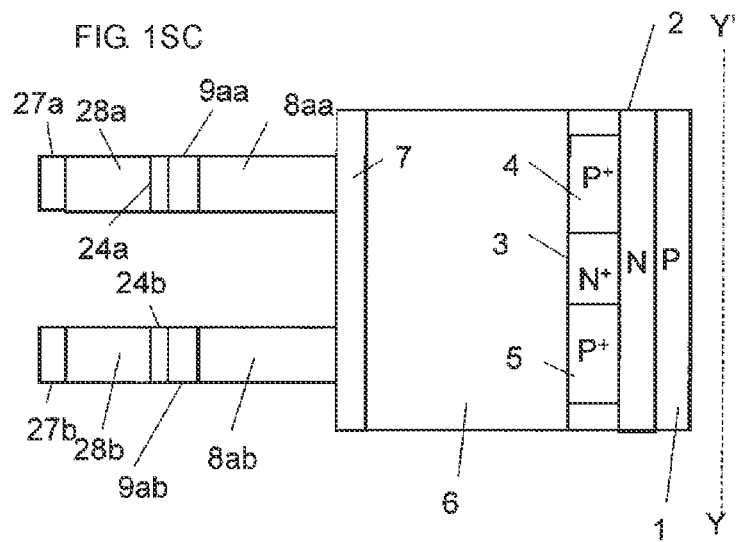

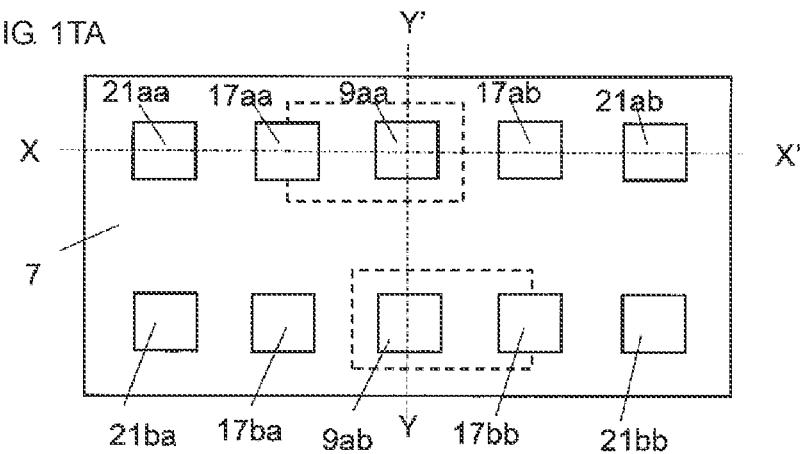
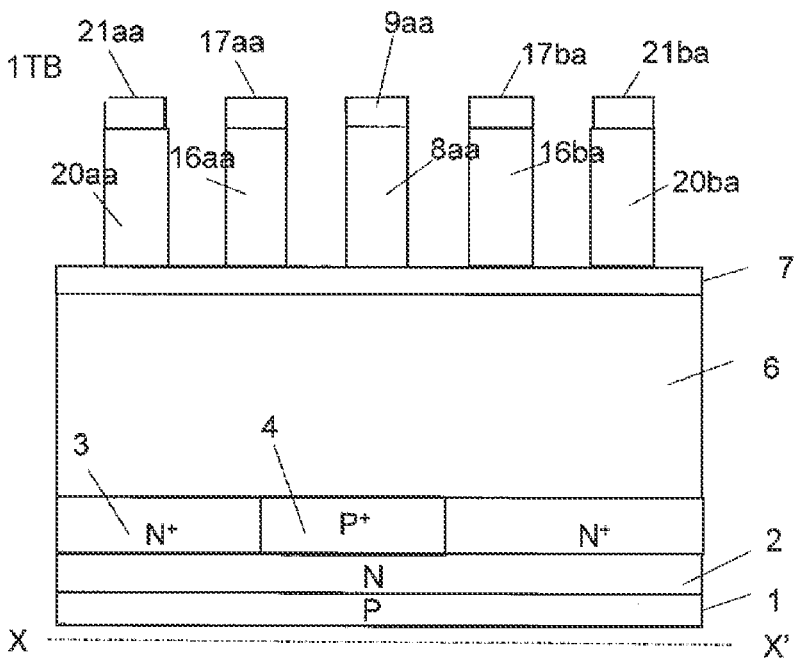
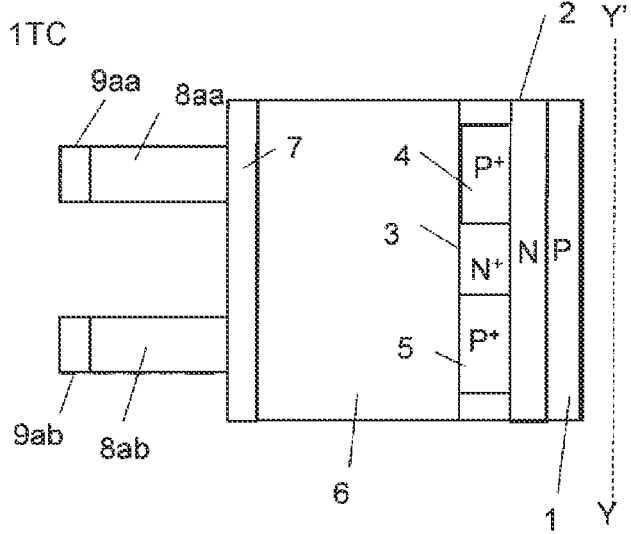

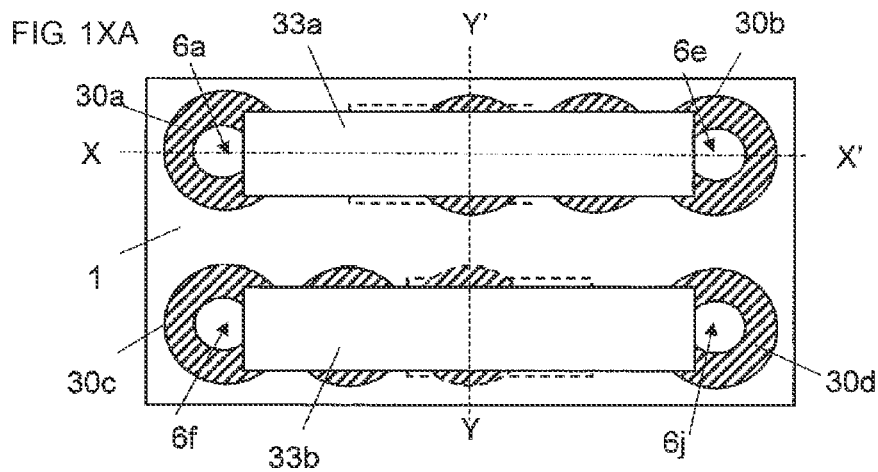
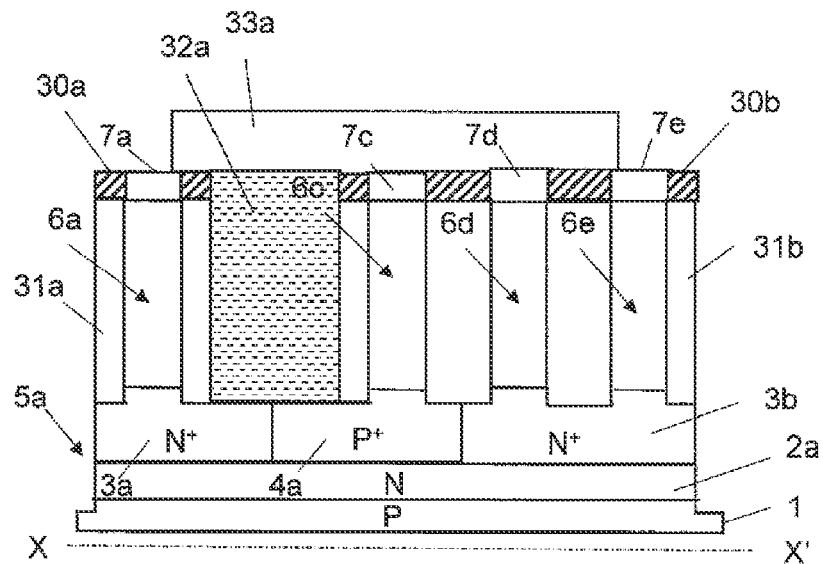
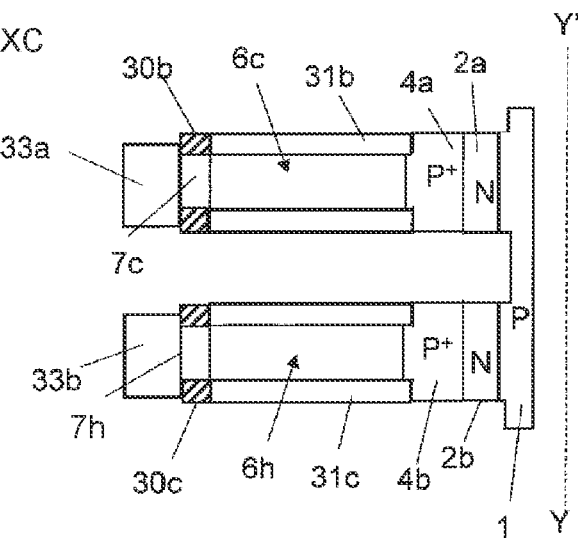

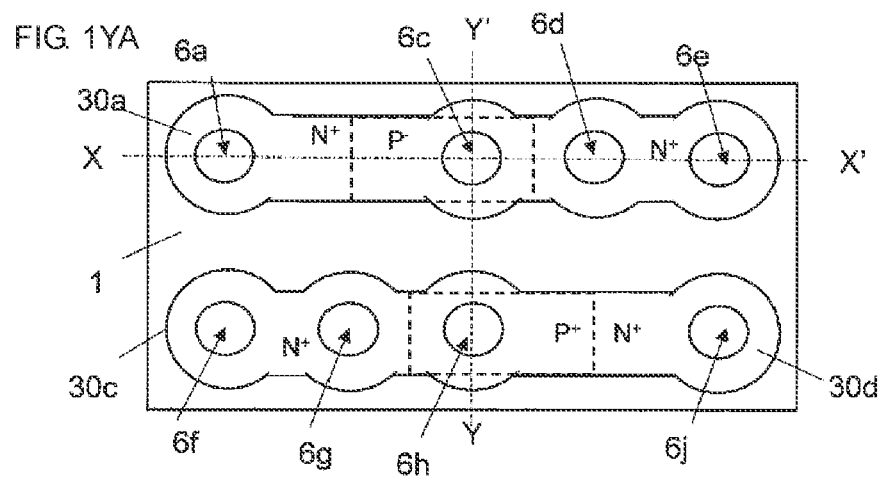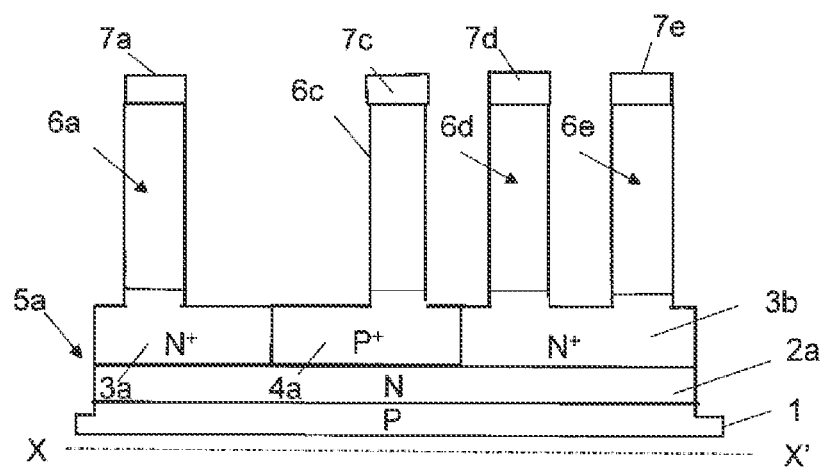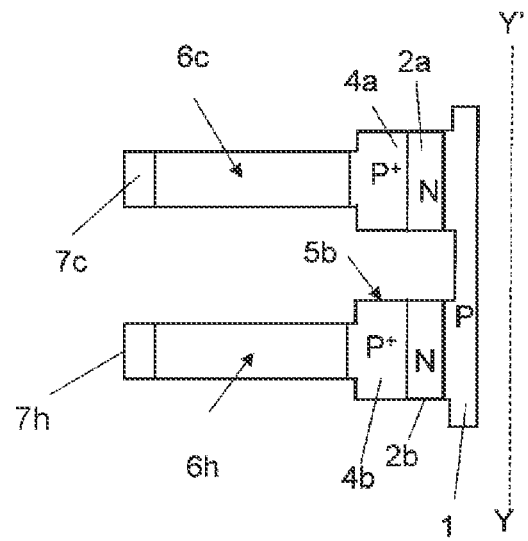

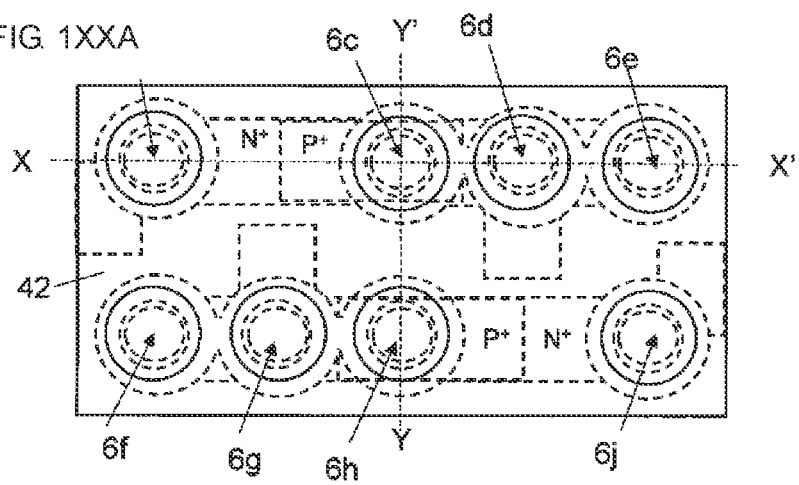
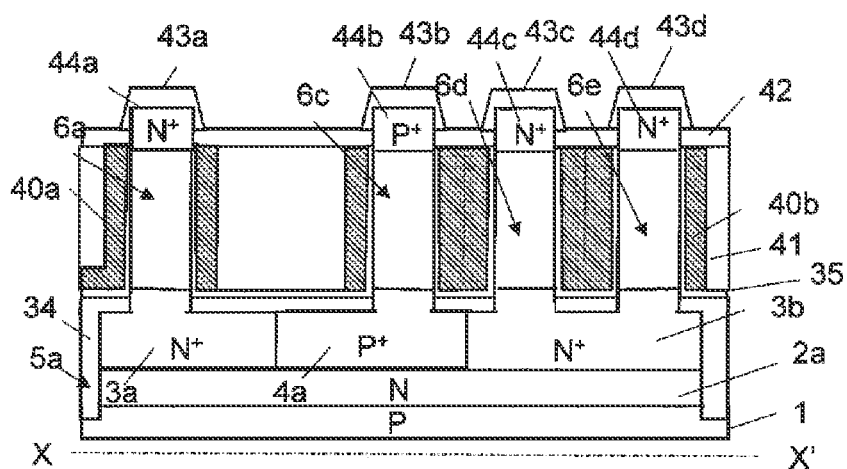
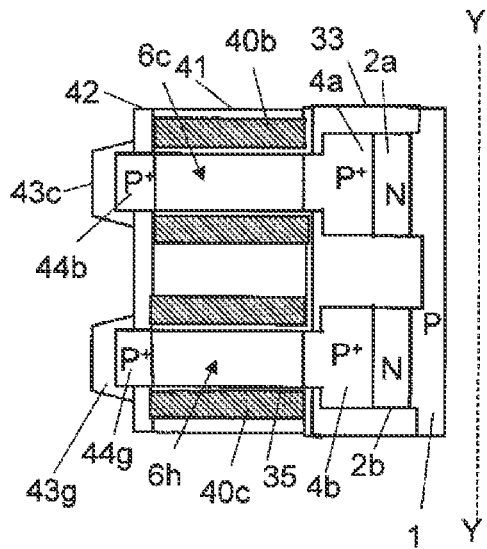

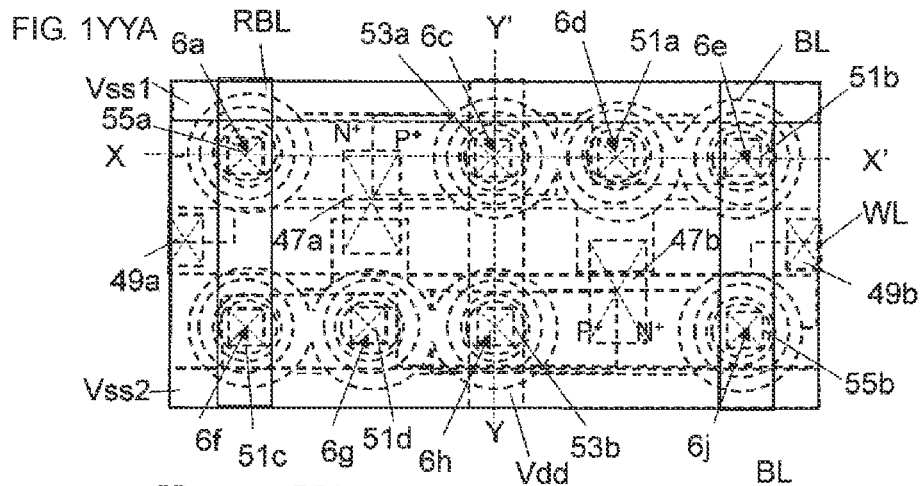
FIG. 1YYA
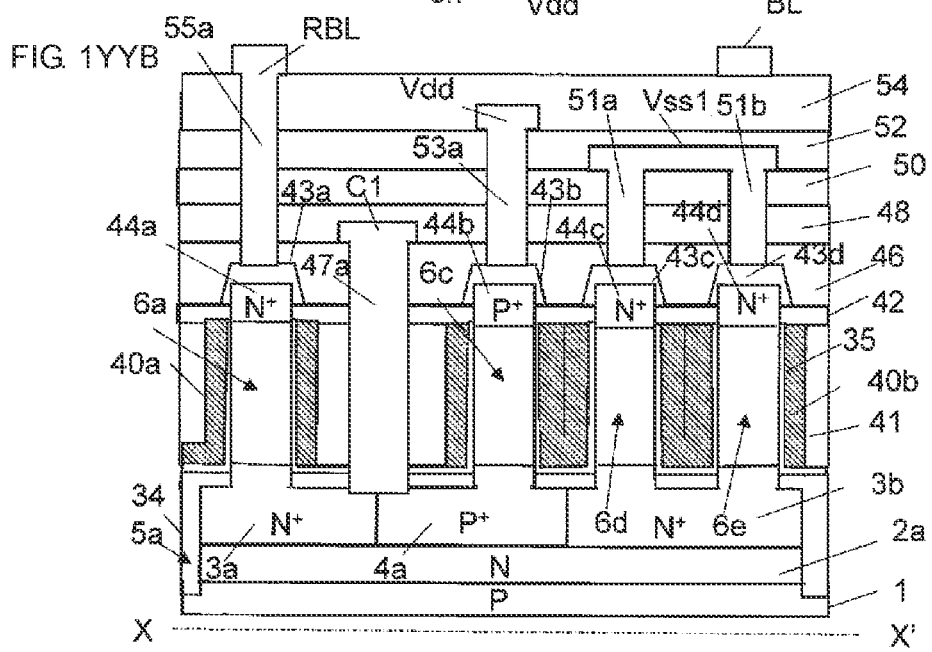
FIG. 1YYB
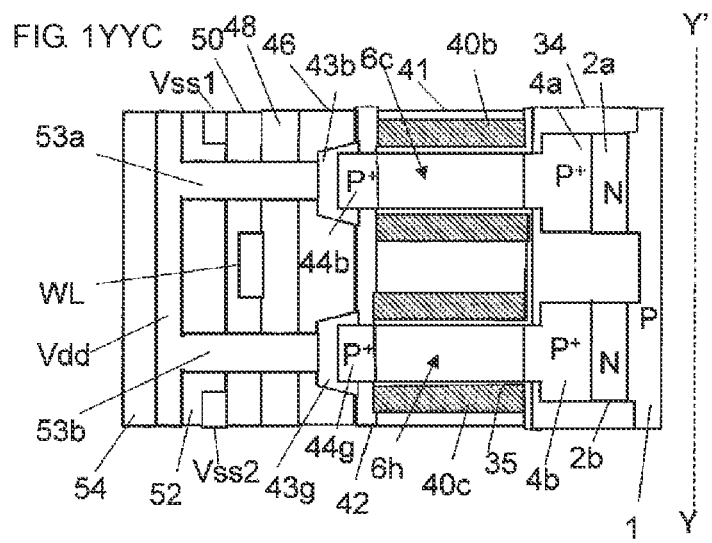
FIG. 1YYC

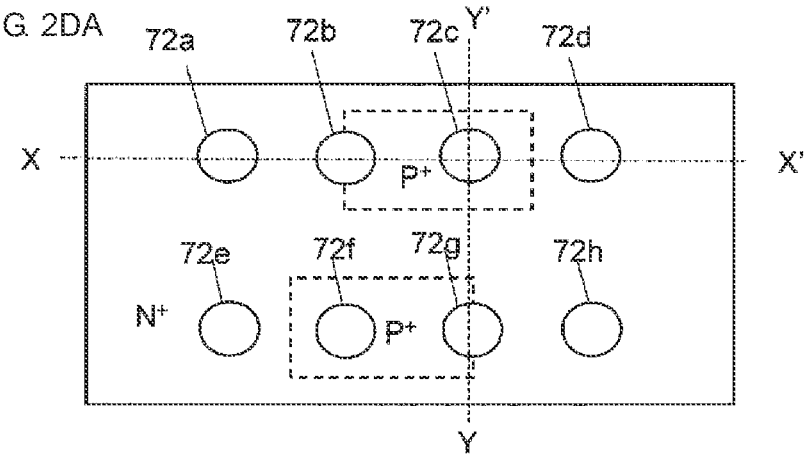
FIG. 2DA
FIG. 2DB
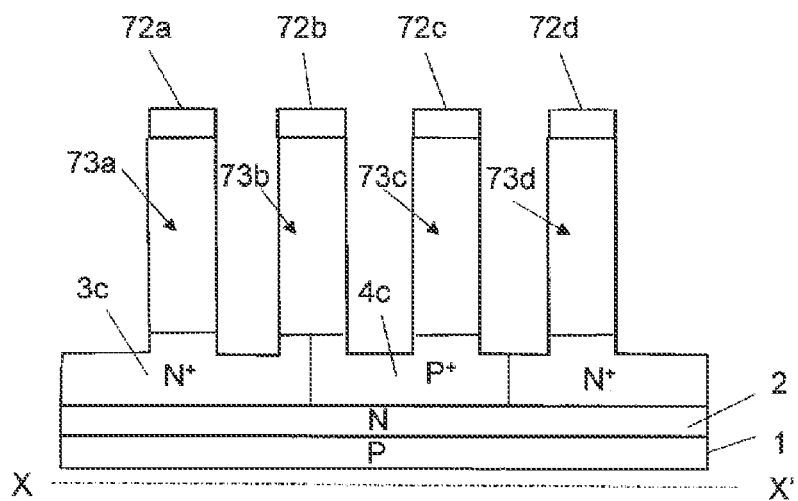
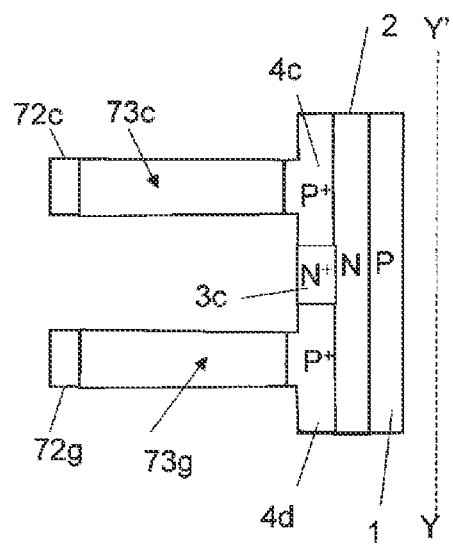
FIG. 2DC

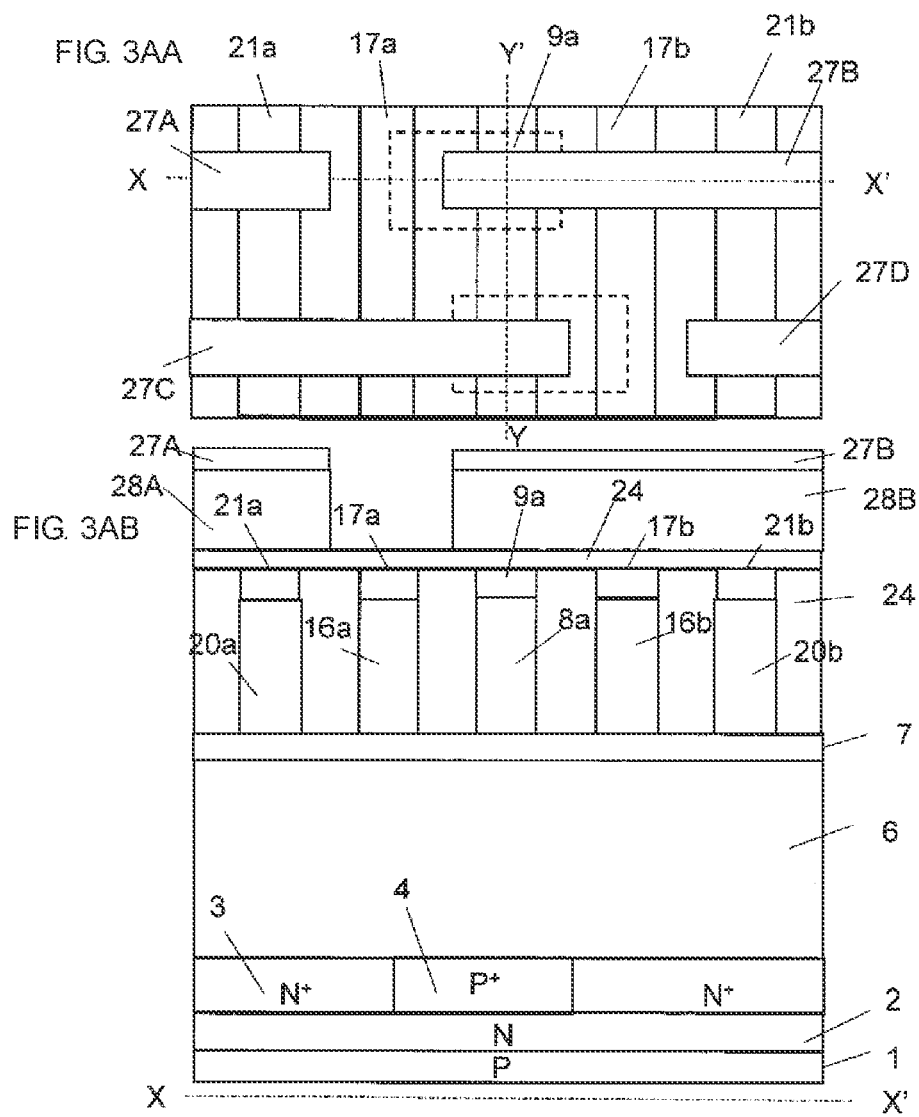
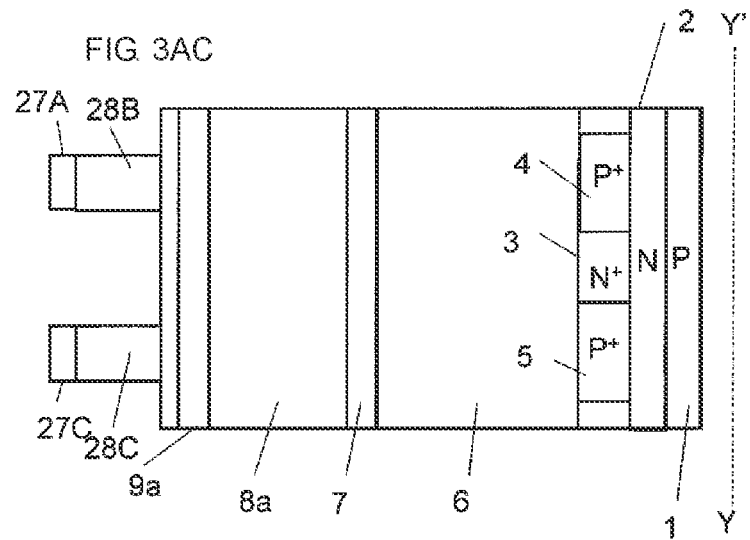

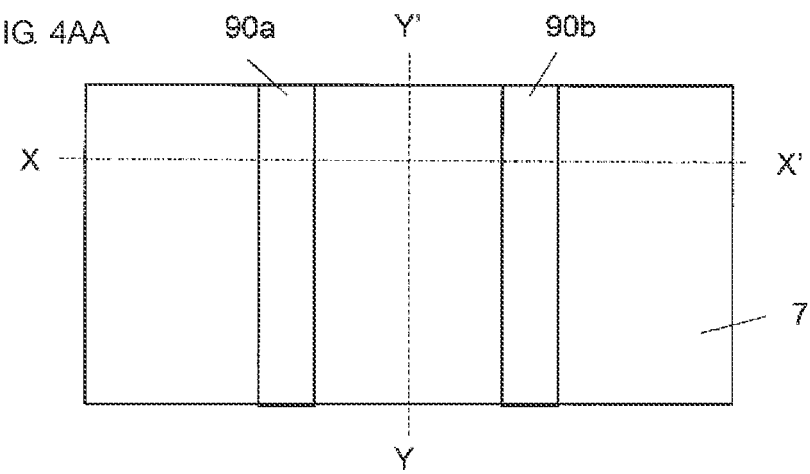
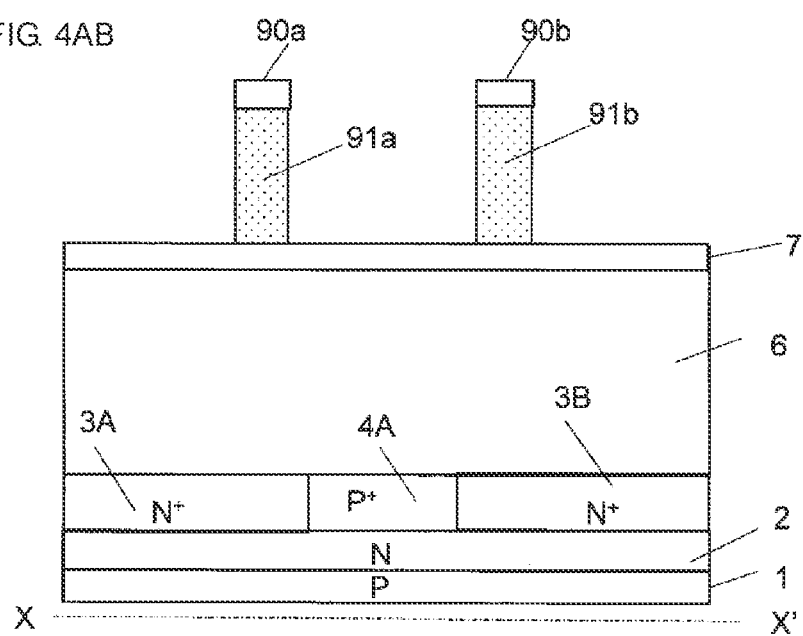
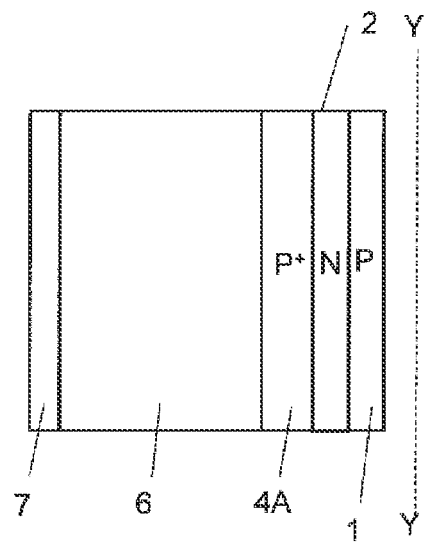

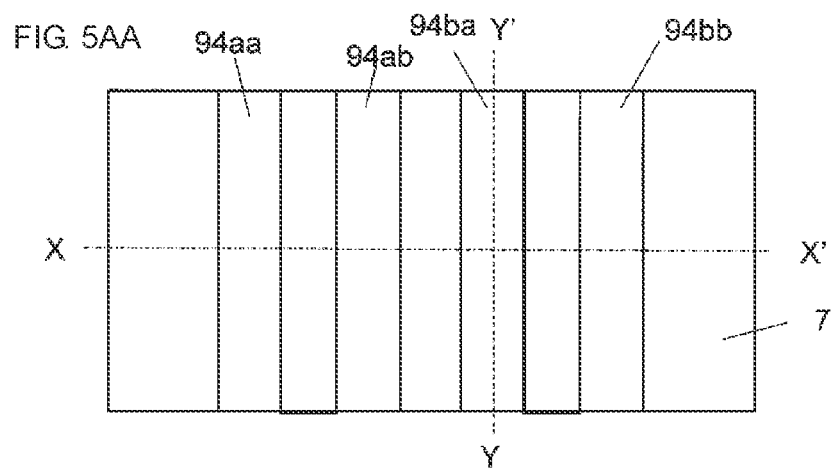
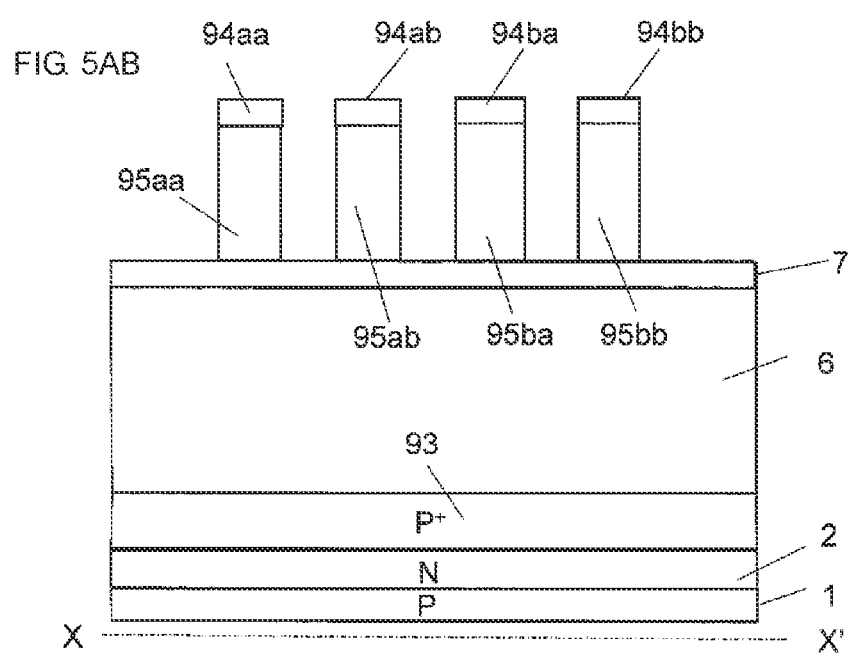
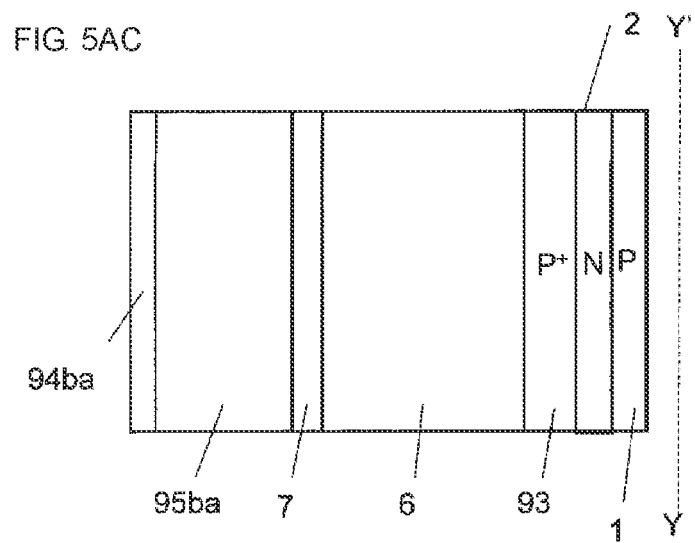

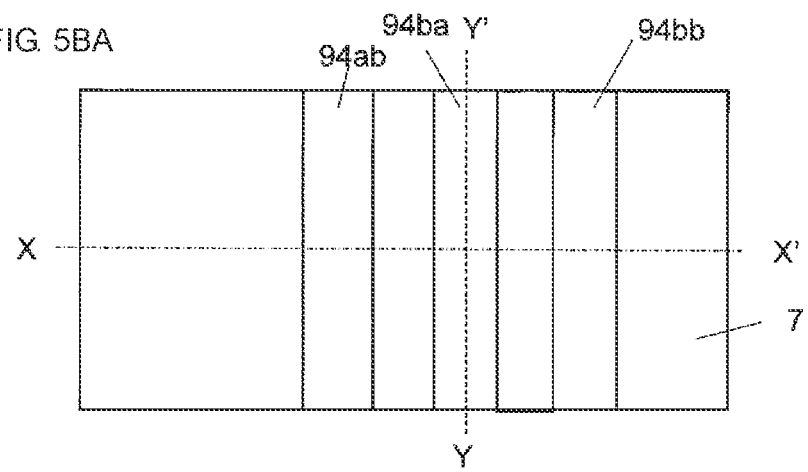
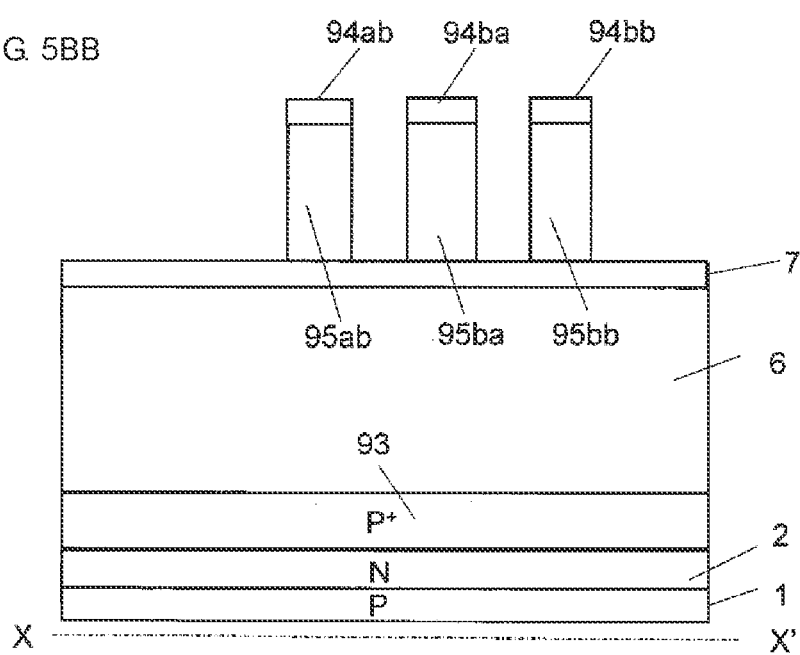
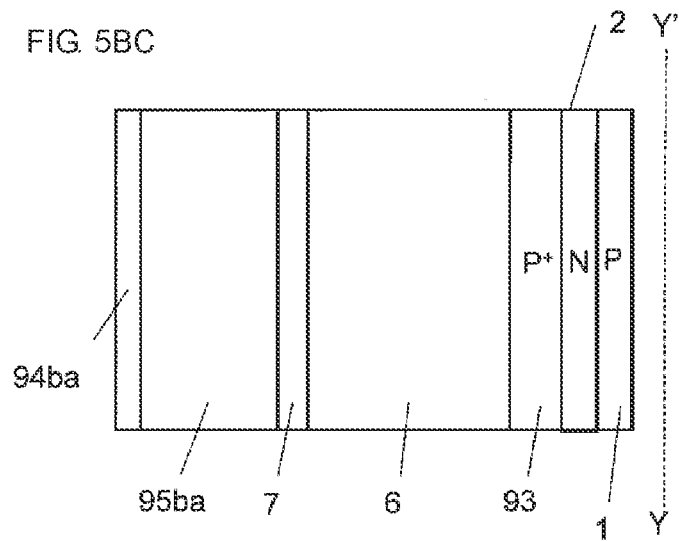

PILLAR-SHAPED SEMICONDUCTOR DEVICE AND MANUFACTURING METHOD THEREOF

RELATED APPLICATIONS

The present application is a continuation application of PCT/JP2019/015146, filed Apr. 5, 2019, the entire contents of which are incorporated herein by reference.

BACKGROUND OF THE INVENTION

1. Field of the Invention

The present invention relates to a pillar-shaped semiconductor device and a manufacturing method thereof.

2. Description of the Related Art

Recently, three-dimensional structure transistors are used for LSI (Large Scale Integration). Among them, SGT (Surrounding Gate Transistor), which is a pillar-shaped semiconductor device, has been attracting attention as a semiconductor element providing a highly integrated semiconductor device. In addition, higher integration and higher performance of semiconductor devices having SGTs are in need.

A conventional planar MOS transistor has channels extending in a horizontal direction along an upper surface of a semiconductor substrate. On the contrary, channels of the SGT extend in a direction vertical to an upper surface of a semiconductor substrate (refer for example to Laid-Open Japanese Patent Application Publication: JP H02-188966A, and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Thus, density of the semiconductor device in the SGT can be increased more than that of the planar MOS transistor.

FIG. 9 shows a schematic structural view of an N channel SGT. $N^+$ layers 121a, 121b (hereinafter, a semiconductor region containing donor impurity at high concentration is referred as "$N^+$ layer") in which when one is source, the other is drain, are each formed upper and lower parts in a Si pillar 120 (hereinafter, a silicon semiconductor pillar is referred as "Si pillar") having a conductivity type of P-type or i-type (intrinsic type). A part of the Si pillar 120 between the $N^+$ layers 121a, 121b, which are the source and the drain, becomes a channel region 122. A gate insulating layer 123 is formed surrounding the channel region 122. A gate conductor layer 124 is formed surrounding the gate insulating layer 123. In the SGT, the $N^+$ layers 121a, 121b, which are the source and the drain, the channel region 122, the gate insulating layer 123, and the gate conductor layer 124 are together formed into a pillar. Thus, in planar view, a footprint of the SGT corresponds to a footprint of a single source or drain $N^+$ layer of the planar MOS transistor. Therefore, a circuit chip having the SGT allows for achieving further reduction in chip size compared to a circuit chip having the planar MOS transistor.

FIG. 10 shows a circuit diagram of a SRAM cell (Static Random Access Memory). The SRAM cell circuit includes two inverter circuits. One inverter circuit is configured from a P channel SGT_Pc1 as a loading transistor and an N channel SGT_Nc1 as a driving transistor. Another inverter circuit is configured from a P channel SGT_Pc2 as a loading transistor and an N channel SGT_Nc2 as a driving transistor. A gate of the P channel SGT_Pc1 is connected to a gate of the N channel SGT_Nc1. A drain of the P channel SGT_Pc2 is connected to a drain of the N channel SGT_Nc2. A gate of the P channel SGT_Pc2 is connected to a gate of the N channel SGT_Nc2. A drain of the P channel SGT_Pc1 is connected to a drain of the N channel SGT_Nc1.

As shown in FIG. 10, a source of the P channels SGT_Pc1, Pc2 is connected to a supply terminal Vdd. In addition, a source of the N channels SGT_Nc1, Nc2 is connected to a ground terminal Vss. Each of selective N channels SGT_SN1, SN2 is located at each side of two inverter circuits. Gates of the selective N channels SGT_SN1, SN2 are each connected to a word line terminal WLt. Source and drain of the selective N channel SGT_SN1 are connected to drains of N channel SGT_Nc1 and P channel SGT_Pc1, and a bit line terminal BLt. Source and drain of the selective N channel SGT SN2 are connected to drains of N channel SGT_Nc2 and P channel SGT_Pc2 and a reverse bit line terminal BLRt. Thus, the circuit having the SRAM cell are configured from total of six SGTs consisting of two P channels SGT_Pc1, Pc2, and four N channels SGT_Nc1, Nc2, SN1, and SN2 (refer for example to US patent Application Publication: 2010/0219483). In addition, a plurality of driving transistors can be connected in parallel to allow for increase in speed of the SRAM circuit. In general, SGTs configuring memory cells of the SRAM are respectively formed into different semiconductor pillars. High integration of SRAM cell circuit is facilitated by making a SRAM cell area consisting of a plurality of SGTs smaller.

SUMMARY OF THE INVENTION

High integration of a SRAM circuit using SGTs is in need.

A manufacturing method of a pillar-shaped semiconductor device according to a first aspect of the present invention, in forming a SRAM (Static Random Access Memory) circuit configuring one cell area by six or eight SGTs (Surrounding Gate Transistor) on a substrate, includes steps of: forming a first material layer over a semiconductor layer; forming four or five band-like first mask material layers which are parallel to and separated from each other in a first direction in planar view over the first material layer in the cell area; with two band-like second mask material layers, which are parallel to and separated from each other in a direction orthogonal to the first direction in planar view, being formed in the cell area located below or above the band-like first mask material layers, forming a third mask material layer consisting of a part or all of the first material layer, the band-like first mask material layer, and the band-like second mask material layer on a part where the band-like first mask material layer and the band-like second mask material layer are overlapped; etching the semiconductor layer with the third mask material layer as a mask to form a first set of semiconductor pillars aligned on a first line, and a second set of semiconductor pillars aligned on a second line parallel to the first line; wherein arrangement is made such that a first semiconductor pillar is present on one end on the first line in the first set of semiconductor pillars, a second semiconductor pillar is present on an end opposite to the one end on the second line in the second set of semiconductor pillars, and a third semiconductor pillar is present as having a center at a point where a first center line extending through a center of the first semiconductor pillar, orthogonal to the first line and the second line cross; and a fourth semiconductor pillar is present as having a center at a point where a second center line extending through a center of the second semiconductor pillar, orthogonal to the second line and the first line cross, a fifth semiconductor pillar is present as having a center on the first line and being adjacent to the fourth semiconductor pillar, and a sixth semiconductor pillar is present as having a center on the second line and being adjacent to the third semiconductor pillar; wherein arrangement is made such that, in planar view, a first semiconductor pillar-absent area having no semiconductor pillar of the first set of semiconductor pillars is present in, at least a part being overlapped on, a first band area, the first band area being an extension of insides of two tangential lines of periphery of the sixth semiconductor pillar, the two tangential lines being parallel to the first center line, and a second semiconductor pillar-absent area having no semiconductor pillar of the second set of semiconductor pillars is present in, at least a part being overlapped on, a second band area, the second band area being an extension of insides of two tangential lines of periphery of the fifth semiconductor pillar, the two tangential lines being parallel to the second center line; forming a gate insulating layer surrounding the first set of semiconductor pillars and the second set of semiconductor pillars; forming a first gate conductor layer surrounding the gate insulating layer of the third semiconductor pillar and the sixth semiconductor pillar, and being linked, a second gate conductor layer surrounding the gate insulating layer of the fourth semiconductor pillar and the fifth semiconductor pillar, and being linked, a third gate conductor layer surrounding the gate insulating layer of the first semiconductor pillar, and a fourth gate conductor layer surrounding the gate insulating layer of the second semiconductor pillar; and forming a first contact hole connecting a first impurity area formed as being linked to a bottom of the first set of semiconductor pillars and the first gate conductor layer on the first semiconductor pillar-absent area, and forming a second contact hole connecting a second impurity area formed as being linked to a bottom of the second set of semiconductor pillars and the second gate conductor layer on the second semiconductor pillar-absent area; wherein the first gate conductor layer is formed such that it contacts at entire side surface of a first channel region of the third semiconductor pillar and the sixth semiconductor pillar in a vertical direction, and the second gate conductor layer is formed such that it contacts at entire side surface of a second channel region of the fourth semiconductor pillar and the fifth semiconductor pillar in a vertical direction.

It is desirable in the manufacturing method that, in the step of forming the SRAM circuit configuring one cell area by the eight SGTs, a seventh semiconductor pillar and an eighth semiconductor pillar are formed on two overlapping areas where the one central band-like first mask material layer located at a center among the five band-like first mask material layers, which are parallel to and separated from each other, in the first direction, and the two band-like second mask material layers, which are parallel to and separated from each other, in the direction orthogonal to the first direction, are overlapped, in planar view, by same steps for forming the first semiconductor pillar, the second semiconductor pillar, the third semiconductor pillar, the fourth semiconductor pillar, the fifth semiconductor pillar, and the sixth semiconductor pillar.

It is desirable in the manufacturing method that a ninth semiconductor pillar and a tenth semiconductor pillar are formed on the first semiconductor pillar-absent area and the second semiconductor pillar-absent area simultaneously with forming the first set of semiconductor pillars and the second set of semiconductor pillars, and then, the ninth semiconductor pillar and the tenth semiconductor pillar are removed to form the first semiconductor pillar-absent area and the second semiconductor pillar-absent area.

It is desirable in the manufacturing method that any or all of the first material layer, the band-like first mask material layer, and the band-like second mask material layer of the first semiconductor pillar-absent area and the second semiconductor pillar-absent area are removed before forming the first set of semiconductor pillars and the second set of semiconductor pillars to form the first semiconductor pillar-absent area and the second semiconductor pillar-absent area.

It is desirable in the manufacturing method that the step of forming the band-like first mask material layers includes at least steps of: forming a second band-like material layer having a first band-like material layer on its top, extended in the direction orthogonal to the first direction in planar view, over the first material layer; forming a second material layer and a third material layer from below, covering entire area; smoothing the second material layer and the third material layer such that their upper surface positions come to an upper surface position of the first band-like material layer; forming a third band-like material layer between side surfaces of the smoothed third material layer and the first band-like material layer on top of the smoothed second material layer; removing the smoothed third material layer; etching the second material layer with the first band-like material layer and the third band-like material layer as a mask to form a fourth band-like material layer in contact with each side surface of the second band-like material layer; forming a fourth material layer and a fifth material layer from below, covering entire area; smoothing the fourth material layer and the fifth material layer such that their upper surface positions come to the upper surface position of the first band-like material layer; forming a fifth band-like material layer between side surfaces of the smoothed fifth material layer and the third band-like material layer on top of the smoothed fourth material layer; removing the fifth material layer; etching the fourth material layer with the first band-like material layer, the third band-like material layer, and the fifth band-like material layer as a mask to form a sixth band-like material layer in contact with side surface of the fourth band-like material layer; and removing the third band-like material layer and the fourth band-like material layer.

It is desirable in the manufacturing method that the step of forming the third band-like material layer includes steps of: etching a top of the second material layer with the first band-like material layer and the smoothed third material layer as a mask to form a first recess; and forming the third band-like material layer filling the first recess and its upper surface position being the same as the upper surface position of the first band-like material layer.

It is desirable in the manufacturing method that the step of forming the fifth band-like material layer includes steps of: etching a top of the fourth material layer with the first band-like material layer, the third band-like material layer, and the fifth material layer as a mask to form a second recess; and forming the fifth band-like material layer filling the second recess and its upper surface position being the same as the upper surface position of the first band-like material layer.

It is desirable in the manufacturing method that the step of forming the band-like second mask material layers includes steps of: forming a ninth band-like material layer having an eighth band-like material layer on its top, extended in the first direction in planar view; forming a sixth material layer and a seventh material layer from below, covering entire area; smoothing the sixth material layer and the seventh material layer such that their upper surface positions come to an upper surface position of the eighth band-like material layer; etching a top of the smoothed sixth material layer with the eighth band-like material layer and the seventh material layer as a mask to form a third recess; forming a tenth band-like material layer filling the third recess and its upper surface position being the same as the upper surface position of the eighth band-like material layer; removing the seventh material layer; etching the sixth material layer with the eighth band-like material layer and the tenth band-like material layer as a mask to form an eleventh band-like material layer in contact with each side surface of the ninth band-like material layer; and removing the eighth band-like material layer and the ninth band-like material layer; wherein the band-like second mask material layers are formed by the tenth band-like material layer and the eleventh band-like material layer.

It is desirable in the manufacturing method that either one of the second band-like material layer or the fourth band-like material layer is formed wider than the other in planar view.

It is desirable in the manufacturing method that the step of forming band-like first mask material layers includes steps of: forming two band-like mask material layers, a band-like fifth mask material layer and a band-like sixth mask material layer, parallel to each other in the first direction; forming a band-like seventh mask material layer in contact with each side of the band-like fifth mask material layer, having a same width in planar view, and simultaneously with forming the band-like seventh mask material layer, forming a band-like eighth mask material layer in contact with each side of the band-like sixth mask material layer, having a same width in planar view; and removing the band-like fifth mask material layer and the band-like sixth mask material layer; wherein the band-like seventh mask material layer and the band-like eighth mask material layer are formed separated from each other in planar view; and wherein the band-like first mask material layers are formed by the band-like seventh mask material layer and the band-like eighth mask material layer.

It is desirable in the manufacturing method that the step of forming the band-like first mask material layers includes steps of: forming two band-like mask material layers, a band-like ninth mask material layer and a band-like tenth mask material layer, parallel to each other in the first direction; forming a band-like eleventh mask material layer in contact with each side of the band-like ninth mask material layer, having a same width in planar view, and simultaneously with forming the band-like eleventh mask material layer, forming a band-like twelfth mask material layer in contact with each side of the band-like tenth mask material layer, having a same width in planar view; forming a band-like thirteenth mask material layer between and at each side of the band-like eleventh mask material layer and the band-like twelfth mask material layer, having a same width in planar view; and removing the band-like eleventh mask material layer and the band-like twelfth mask material layer; wherein the band-like first mask material layers are formed by the band-like ninth mask material layer, the band-like tenth mask material layer, and the band-like thirteenth mask material layer.

It is desirable in the manufacturing method that a width between the band-like eleventh mask material layer and the band-like twelfth mask material layer is formed differently from a width between the band-like ninth mask material layer and the band-like tenth mask material layer, in planar view.

It is desirable in the manufacturing method that, in forming one logic circuit area separate from the SRAM circuit on the substrate, in planar view, the method includes a step of: in parallel with forming the first semiconductor pillar, the second semiconductor pillar, the third semiconductor pillar, the fourth semiconductor pillar, the fifth semiconductor pillar, and the sixth semiconductor pillar in a direction of a first line extending in the first direction or the direction orthogonal to the first line, forming at least two adjacent semiconductor pillars, a ninth semiconductor pillar and a tenth semiconductor pillar, having space the same as that of the third semiconductor pillar and the sixth semiconductor pillar, or that of the fourth semiconductor pillar and the fifth semiconductor pillar; wherein a third gate conductor layer surrounding the ninth semiconductor pillar and the tenth semiconductor pillar contacts at entire side surface of a third channel region of the ninth semiconductor pillar and the tenth semiconductor pillar in a vertical direction.

It is desirable in the manufacturing method that the method includes steps of: forming at least three third band-like mask material layers in a direction of the first line extending in the first direction or in the direction orthogonal to the first line in parallel with forming the band-like first mask material layers; in parallel with forming the first semiconductor pillar-absent area and the second semiconductor pillar-absent area, forming a third semiconductor pillar-absent area where a semiconductor pillar is not formed in at least one area of the third band-like material layer in planar view; and forming a third contact hole for connecting to at least one of the third gate conductor layer, and a third impurity area being linked to each bottom of the ninth semiconductor pillar and the tenth semiconductor pillar on the third semiconductor pillar-absent area in planar view.

It is desirable in the manufacturing method that a first connecting area linking the first impurity area being linked to each bottom of the first set of semiconductor pillars, and a second connecting area linking the second impurity area being linked to each bottom of the second set of semiconductor pillars are formed by a metal layer, an alloy layer, or a semiconductor layer containing donor or acceptor impurity atoms.

It is desirable in the manufacturing method that a third connecting area linking the third impurity area is formed by a metal layer, an alloy layer, or a semiconductor layer containing donor or acceptor impurity atoms.

It is desirable in the manufacturing method that shape of the ninth semiconductor pillar and the tenth semiconductor pillar in planar view is each formed as a circular, elliptic, or elongated shape.

It is desirable in the manufacturing method that the first semiconductor pillar, the second semiconductor pillar, the third semiconductor pillar, and the fourth semiconductor pillar are provided as a first set, and the fifth semiconductor pillar and the sixth semiconductor pillar are provided as a second set; and each planar shape of the first set and the second set is a circular shape, or an elliptic or elongated shape having a long side in the first line direction.

It is desirable in the manufacturing method that each planar shape of the seventh semiconductor pillar and the eighth semiconductor pillar is a circular shape, or an elliptic or elongated shape having a long side in the first line direction.

A pillar-shaped semiconductor device according to a second aspect of the present invention, in a SRAM (Static Random Access Memory) circuit consisting of SGTs (Surrounding Gate Transistor) configuring one cell from a first set of SGTs in which three or four SGTs are arranged on a first line, and a second set of SGTs in which three or four SGTs are arranged on a second line parallel to the first line, in planar view, on a substrate, is configured such that: a first selection SGT is present at a first semiconductor pillar on the substrate at one end on the first line within the first set of SGTs; and a second selection SGT is present at a second semiconductor pillar on the substrate at an end opposite to the one end on the second line within the second set of SGTs; the pillar-shaped semiconductor device including: a third semiconductor pillar of a third SGT for driving or loading having a center at a point where a first center line extending through a center of the first semiconductor pillar orthogonal to the first line and the second line cross; a fourth semiconductor pillar of a fourth SGT for driving or loading having a center at a point where a second center line extending through a center of the second semiconductor pillar orthogonal to the second line and the first line cross; a fifth semiconductor pillar of a fifth SGT for driving or loading having a center on the first line and being adjacent to the fourth semiconductor pillar; a sixth semiconductor pillar of a sixth SGT for driving or loading having a center on the second line and being adjacent to the third semiconductor pillar; wherein a first gate conductor layer of the linked third SGT and the sixth SGT is connected at side surface of entire first channel region of the third semiconductor pillar and the sixth semiconductor pillar in a vertical direction; a first contact hole for electrically connecting a first impurity area extended on the first line and connected to each bottom of the first semiconductor pillar, the fourth semiconductor pillar, and the fifth semiconductor pillar, and the first gate conductor layer, at least a part being overlapped on a first band area, the first band area being an extension of insides of two tangential lines of periphery of the sixth semiconductor pillar, the two tangential lines being parallel to the first center line, in planar view; wherein a second gate conductor layer of the linked fourth SGT and the fifth SGT is connected at side surface of entire second channel region of the fourth semiconductor pillar and the fifth semiconductor pillar in the vertical direction; and a second contact hole for electrically connecting a second impurity area extended on the second line and connected to each bottom of the second semiconductor pillar, the third semiconductor pillar, and the sixth semiconductor pillar, and the second gate conductor layer, at least a part being overlapped on a second band area, the second band area being an extension of insides of two tangential lines of periphery of the fifth semiconductor pillar, the two tangential lines being parallel to the second center line, in planar view; wherein, in planar view, the first gate conductor layer is at least overlapped on the first band area and protrudes toward the first line, and the second gate conductor layer is at least overlapped on the second band area and protrudes toward the second line.

It is desirable in the pillar-shaped semiconductor device that, in the SRAM circuit in which the first set of SGTs and the second set of SGTs each consists of the three SGTs: when the third SGT is for driving, the fourth SGT is for driving, and the fifth SGT and the sixth SGT are for loading; and when the third SGT is for loading, the fourth SGT is for loading, and the fifth SGT and the sixth SGT are for driving.

It is desirable in the pillar-shaped semiconductor device that, in the SRAM circuit in which the first set of SGTs and the second set of SGTs each consists of four SGTs, the pillar-shaped semiconductor device includes: a seventh semiconductor pillar of a seventh SGT between the fifth semiconductor pillar and the first contact hole, with its center on the first line; an eighth semiconductor pillar of an eighth SGT between the sixth semiconductor pillar and the second contact hole, with its center on the second line; wherein the center of the seventh semiconductor pillar and the center of the eighth semiconductor pillar are on a third center line parallel to the first center line; wherein when the seventh SGT is for driving, the eighth SGT is for driving; or wherein when the seventh SGT is for loading, the eighth SGT is for loading; wherein a third gate conductor layer of the linked third SGT, the sixth SGT, and the eighth SGT is connected at side surface of entire third channel region of the third semiconductor pillar, the sixth semiconductor pillar, and the eighth SGT in a vertical direction; wherein a fourth gate conductor layer of the linked fourth SGT, the fifth SGT, and the seventh SGT is connected at side surface of entire fourth channel region of the fourth semiconductor pillar, the fifth semiconductor pillar, and the seventh SGT in a vertical direction; and a third impurity area connected to a bottom of the seventh semiconductor pillar linked to the first impurity area connected to each bottom of the first semiconductor pillar, the fourth semiconductor pillar, and the fifth semiconductor pillar, and a fourth impurity area connected to a bottom of the eighth semiconductor pillar linked to the second impurity area connected to each bottom of the second semiconductor pillar, the third semiconductor pillar, and the sixth semiconductor pillar.

It is desirable in the pillar-shaped semiconductor device that: in planar view, a center line orthogonal to the first line of the first contact hole is deviated to one side from a center point between the center of the first semiconductor pillar and the center of the fifth semiconductor pillar; in planar view, a center line orthogonal to the second line of the second contact hole is deviated in a direction opposite to the one side from a center point between the center of the second semiconductor pillar and the center of the sixth semiconductor pillar; and deviation of the center line of the first contact hole on the first line and deviation of the center line of the second contact hole on the second line have a same length.

It is desirable in the pillar-shaped semiconductor device that the pillar-shaped semiconductor device is in a logic circuit of one circuit area apart from the SRAM circuit on the substrate, and includes a ninth semiconductor pillar and a tenth semiconductor pillar having space at least the same as that of the third semiconductor pillar and the sixth semiconductor pillar in a direction the same as the first line, or a direction orthogonal to the first line; and a fifth gate conductor layer linked to each of a ninth SGT formed in the ninth semiconductor pillar and a tenth SGT formed in the tenth semiconductor pillar is connected at side surface of entire third channel region of the ninth semiconductor pillar and the tenth semiconductor pillar in a vertical direction.

It is desirable in the pillar-shaped semiconductor device that each shape of the ninth semiconductor pillar and the tenth semiconductor pillar in planar view is circular, rectangular, or elliptic.

It is desirable in the pillar-shaped semiconductor device that: in planar view, a linked second circuit area is present in a direction the same as the first line, or a direction orthogonal to the first line of the one circuit area; the pillar-shaped semiconductor device including an eleventh semiconductor pillar and a twelfth semiconductor pillar having space at least the same as that of the third semiconductor pillar and the sixth semiconductor pillar in a direction the same as the first line or a direction orthogonal to the first line; wherein a sixth gate conductor layer linked to each of an eleventh SGT formed in the eleventh semiconductor pillar and a twelfth SGT formed in the twelfth semiconductor pillar is connected at side surface of entire fourth channel region of the eleventh semiconductor pillar and the twelfth semiconductor pillar in a vertical direction.

It is desirable in the pillar-shaped semiconductor device that a first connecting area linking the first impurity area being linked to each bottom of the first set of semiconductor pillars, and a second connecting area linking the second impurity area being linked to each bottom of the second set of semiconductor pillars are formed by a metal layer, an alloy layer, or a semiconductor layer containing donor or acceptor impurity atoms.

It is desirable in the pillar-shaped semiconductor device that the first semiconductor pillar, the second semiconductor pillar, the third semiconductor pillar, and the fourth semiconductor pillar are provided as a first set, and the fifth semiconductor pillar and the sixth semiconductor pillar are provided as a second set; and each planar shape of the first set and the second set is a circular shape, or an elliptic or elongated shape having a long side in the first line direction.

It is desirable in the pillar-shaped semiconductor device that each planar shape of the seventh semiconductor pillar and the eighth semiconductor pillar is a circular shape, or an elliptic or elongated shape having a long side in the first line direction.

According to the present invention, a pillar-shaped semiconductor device at high density is achieved.

BRIEF DESCRIPTION OF THE DRAWINGS

FIG. 1IA and FIGS. 1IB and 1IC are respectively a plane view and cross-sectional structural views for describing a manufacturing method of a pillar-shaped semiconductor device having SGTs according to the first embodiment.

FIG. 1KA and FIGS. 1KB and 1KC are respectively a plane view and cross-sectional structural views for describing a pillar-shaped semiconductor device having SGTs according to the first embodiment.

FIG. 1LA and FIGS. 1LB and 1LC are respectively a plane view and cross-sectional structural views for describing a manufacturing method of a pillar-shaped semiconductor device having SGTs according to the first embodiment.

FIG. 1NA and FIGS. 1NB and 1NC are respectively a plane view and cross-sectional structural views for describing a manufacturing method of a pillar-shaped semiconductor device having SGTs according to the first embodiment.

FIG. 1OA and FIGS. 1OB and 1OC are respectively a plane view and cross-sectional structural views for describing a manufacturing method of a pillar-shaped semiconductor device having SGTs according to the first embodiment.

FIG. 1RA and FIGS. 1RB and 1RC are respectively a plane view and cross-sectional structural views for describing a manufacturing method of a pillar-shaped semiconductor device having SGTs according to the first embodiment.

FIG. 1SA and FIGS. 1SB and 1SC are respectively a plane view and cross-sectional structural views for describing a manufacturing method of a pillar-shaped semiconductor device having SGTs according to the first embodiment.

FIG. 1TA and FIGS. 1TB and 1TC are respectively a plane view and cross-sectional structural views for describing a manufacturing method of a pillar-shaped semiconductor device having SGTs according to the first embodiment.

FIG. 1XA and FIGS. 1XB and 1XC are respectively a plane view and cross-sectional structural views for describing a manufacturing method of a pillar-shaped semiconductor device having SGTs according to the first embodiment.

FIG. 1YA and FIGS. 1YB and 1YC are respectively a plane view and cross-sectional structural views for describing a manufacturing method of a pillar-shaped semiconductor device having SGTs according to the first embodiment.

FIG. 1XXA and FIGS. 1XXB and 1XXC are respectively a plane view and cross-sectional structural views for describing a manufacturing method of a pillar-shaped semiconductor device having SGTs according to the first embodiment.

FIG. 1YYA and FIGS. 1YYB and 1YYC are respectively a plane view and cross-sectional structural views for describing a manufacturing method of a pillar-shaped semiconductor device having SGTs according to the first embodiment.

FIG. 2DA and FIGS. 2DB and 2DC are respectively a plane view and cross-sectional structural views for describing a manufacturing method of a pillar-shaped semiconductor device having SGTs according to the second embodiment of the present invention.

FIG. 3AA and FIGS. 3AB and 3AC are respectively a plane view and cross-sectional structural views for describing a manufacturing method of a pillar-shaped semiconductor device having SGTs according to the third embodiment of the present invention.

FIG. 4AA and FIGS. 4AB and 4AC are respectively a plane view and cross-sectional structural views for describing a manufacturing method of a pillar-shaped semiconductor device having SGTs according to the fourth embodiment of the present invention.

FIG. 5AA and FIGS. 5AB and 5AC are respectively a plane view and cross-sectional structural views for describing a manufacturing method of a pillar-shaped semiconductor device having SGTs according to the fifth embodiment of the present invention.

FIG. 5BA and FIGS. 5BB and 5BC are respectively a plane view and cross-sectional structural views for describing a manufacturing method of a pillar-shaped semiconductor device having SGTs according to the fifth embodiment of the present invention.

DETAILED DESCRIPTION OF THE PREFERRED EMBODIMENTS

Hereinafter, the manufacturing method of a pillar-shaped semiconductor device according to embodiments of the present invention is described with reference to drawings.

First Embodiment

Hereinafter, a SRAM circuit having SGTs according to the first embodiment of the present invention is described with reference to FIGS. 1AA to 1YYC. In the figures, figures suffixed with A are plan views, figures suffixed with B are cross-sectional structural views taken along lines X-X' in the corresponding figures suffixed with A, and figures suffixed with C are cross-sectional structural views taken along lines Y-Y' in the corresponding figures suffixed with A.

Figure 1A:
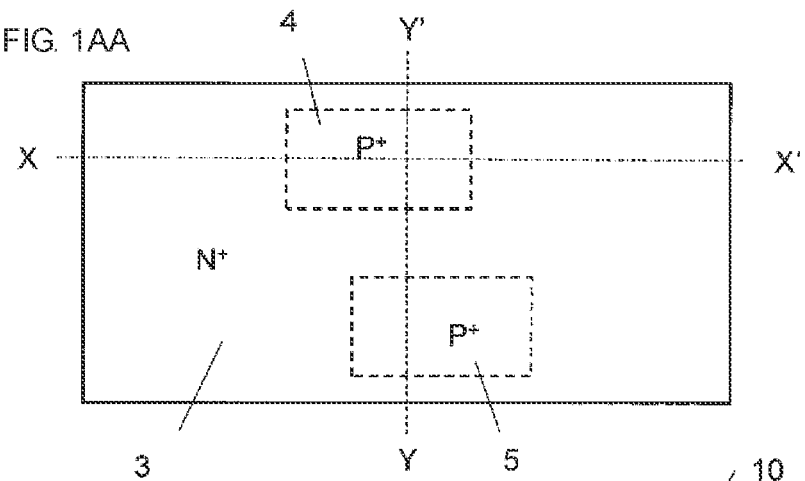
FIG. 1AA and FIGS. 1AB and 1AC are respectively a plane view and cross-sectional structural views for describing a manufacturing method of a pillar-shaped semiconductor device having SGTs according to the first embodiment.
Figure 1A:
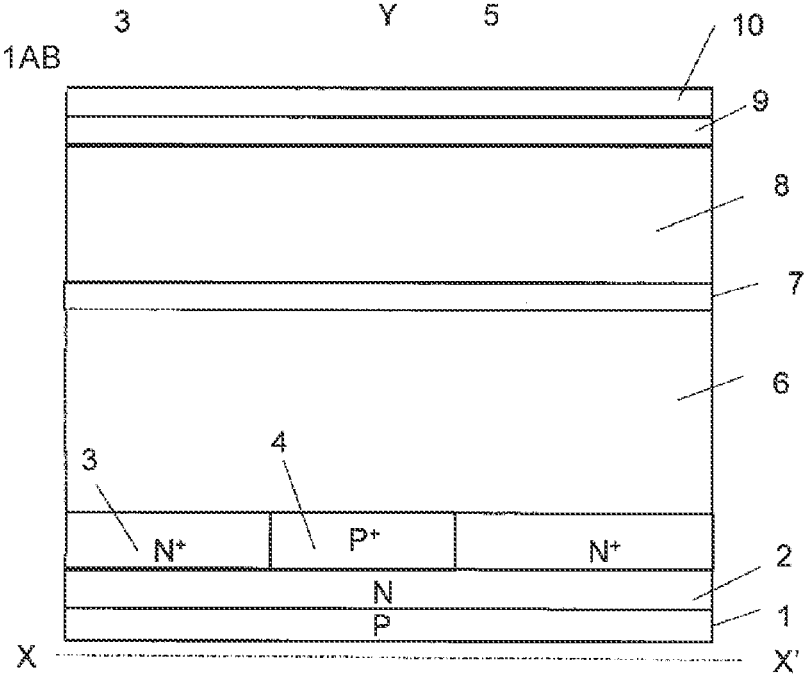
Figure 1A:
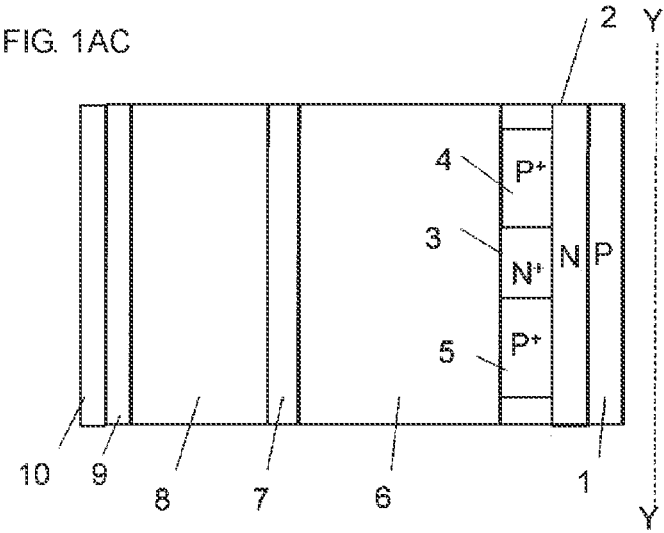

As shown in FIGS. 1AA to 1AC, an N layer 2 is formed on a P layer substrate 1 by an epitaxial crystal growth method. Then, an $N^+$ layer 3 and $P^+$ layers 4, 5 are formed on a surface layer of the N layer 2 by an ion implantation method. Then, an i layer (intrinsic Si layer) 6 is formed. Then, a mask material layer 7 consisting of, for example, a $SiO_2$ layer, an aluminum oxide ($Al_2O_3$, hereinafter referred as AlO) layer and a $SiO_2$ layer is formed. Also, the i layer 6 may be formed by N-type or P-type Si, which contains a small amount of donor or acceptor impurity. Then, a silicon nitride (SiN) layer 8 is deposited. Then, a mask material layer 9 consisting of a $SiO_2$ layer is deposited. Then, a mask material layer 10 consisting of a SiN layer is deposited.

Figure 1B:
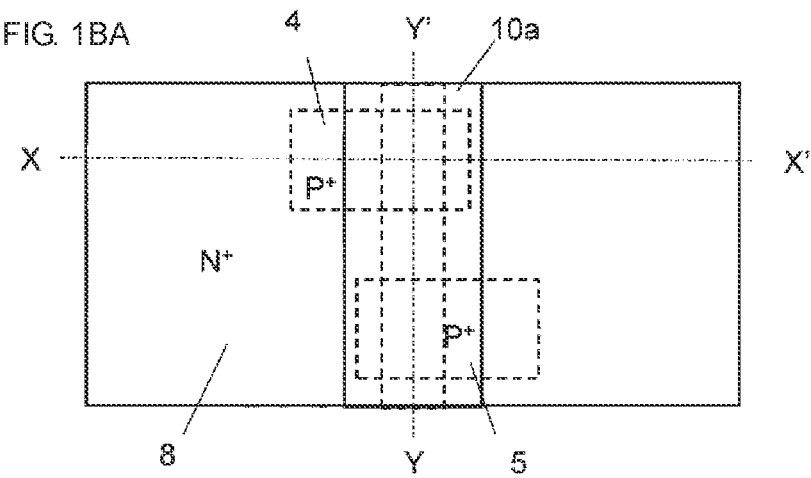
FIG. 1BA and FIGS. 1BB and 1BC are respectively a plane view and cross-sectional structural views for describing a manufacturing method of a pillar-shaped semiconductor device having SGTs according to the first embodiment.
Figure 1B:
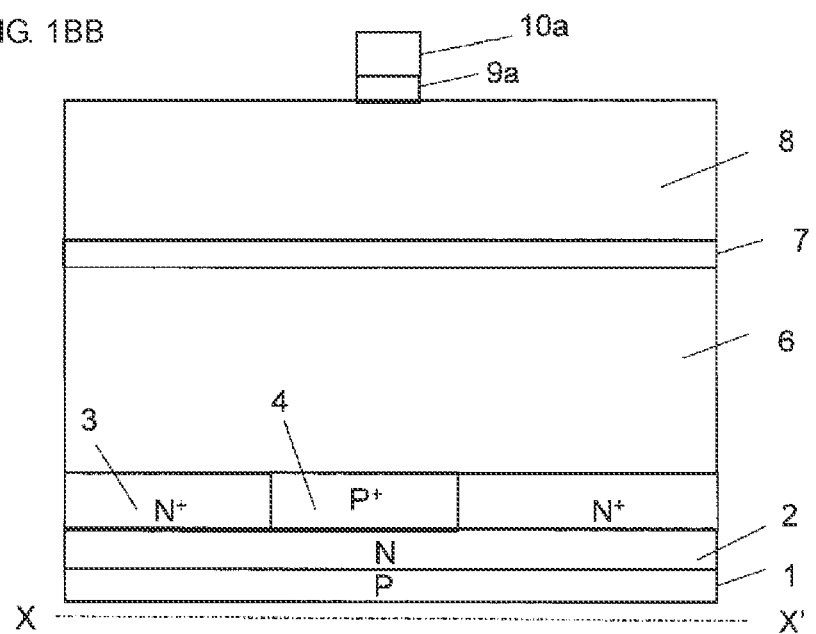
Figure 1B:
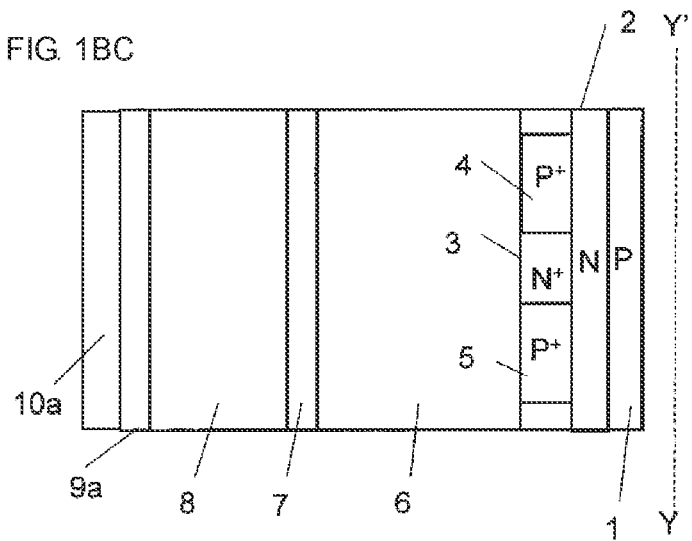

Next, as shown in FIGS. 1BA to 1BC, the mask material layer 10 is etched with a lithographically formed band-like resist layer (not shown) extended in Y direction in planar view as a mask. A band-like mask material layer 10a extended in the Y direction in planar view is thus formed. Here, the band-like mask material layer 10a may be subjected to an isotropic etching such that the width of the band-like mask material layer 10a is formed to become smaller than the width of the resist layer. Thus, it may be possible to form a band-like mask material layer 10a having a width smaller than the smallest width of a resist layer which can be formed lithographically. Then, the mask material layer 9 is etched, for example by RIE (Reactive Ion Etching), with the band-like mask material layer 10a as an etching mask, to form a band-like mask material layer 9a. While the band-like mask material layer 10a formed by the isotropic etching has a trapezoidal cross section with its bottom width being wider than its top width, the band-like mask material layer 9a is etched by RIE, and thus has a rectangular cross section. This rectangular cross section leads an enhanced precision of etching pattern, which is etched with the band-like mask material layer 9a as a mask.

Figure 1C:
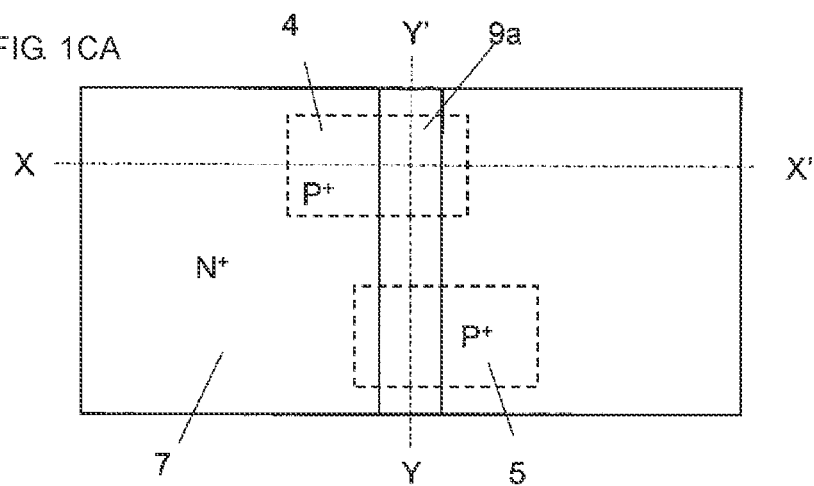
FIG. 1CA and FIGS. 1CB and 1CC are respectively a plane view and cross-sectional structural views for describing a manufacturing method of a pillar-shaped semiconductor device having SGTs according to the first embodiment.
Figure 1C:
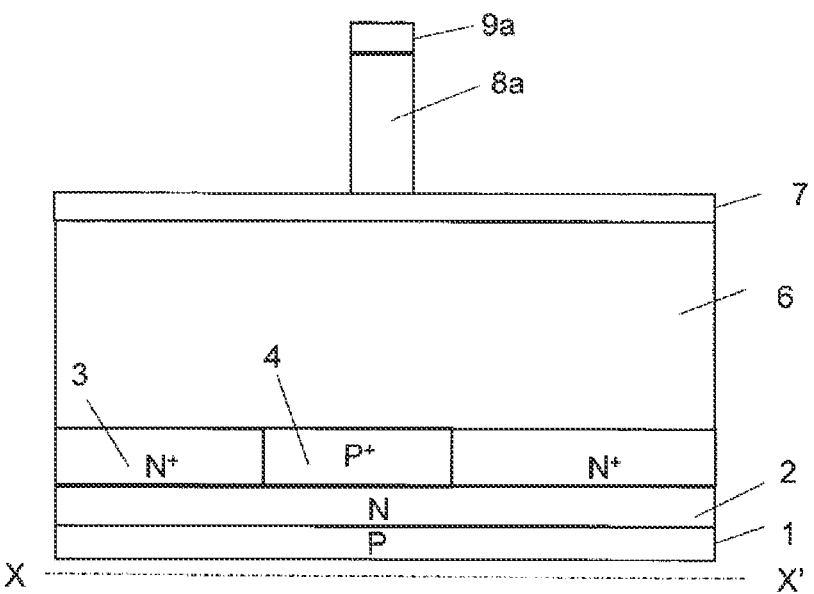
Figure 1C:
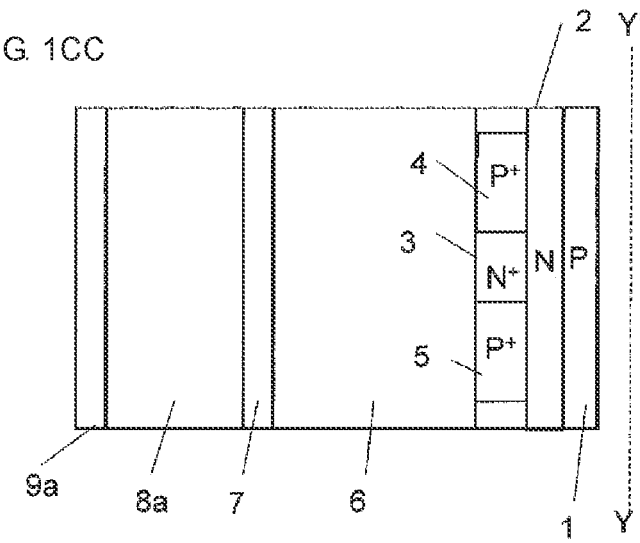

Next, as shown in FIGS. 1CA to 1CC, the SiN layer 8 is etched, for example by RIE method with the band-like mask material layer 9a as a mask, to form a band-like SiN layer 8a. The band-like mask material layer 10a may be removed prior to the etching of the SiN layer 8 or may remain.

Figure 1D:
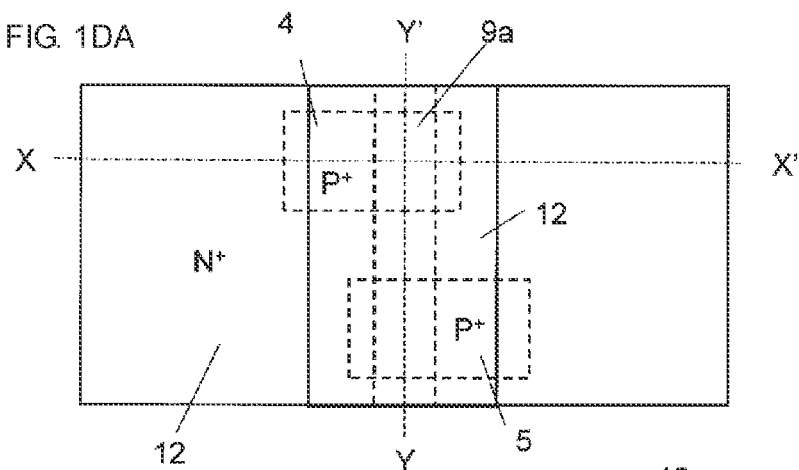
FIG. 1DA and FIGS. 1DB and 1DC are respectively a plane view and cross-sectional structural views for describing a manufacturing method of a pillar-shaped semiconductor device having SGTs according to the first embodiment.
Figure 1D:
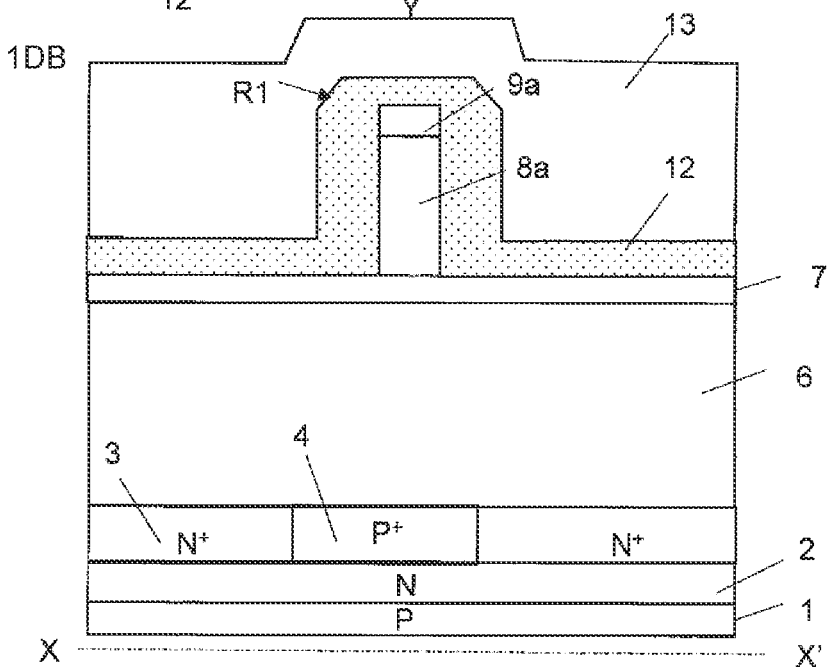
Figure 1D:
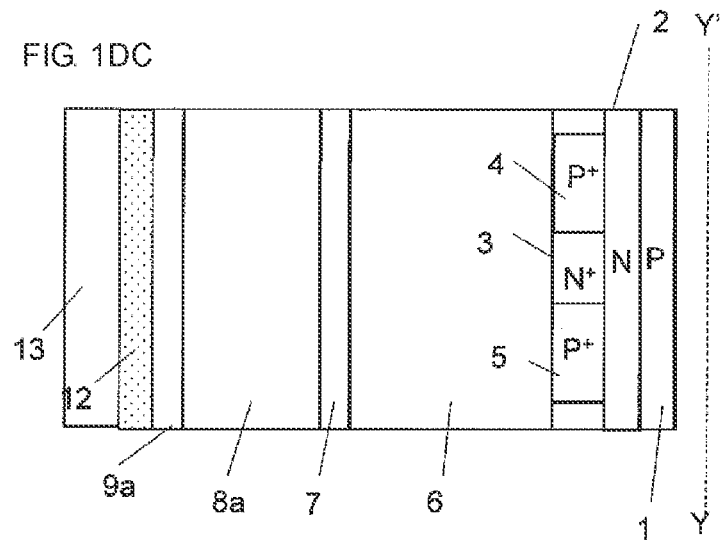

Next, as shown in FIGS. 1DA to 1DC, a SiGe layer 12 and a $SiO_2$ layer 13 are entirely formed over the mask material layer 7, the band-like SiN layer 8a and the band-like mask material layer 9a by ALD (Atomic Layered Deposition) method. In this case, a cross section of the SiGe layer 12 provides a rounded part R1 at its top. It is desirable to form the rounded part R1 to be positioned above the band-like SiN layer 8a.

Figure 1E:
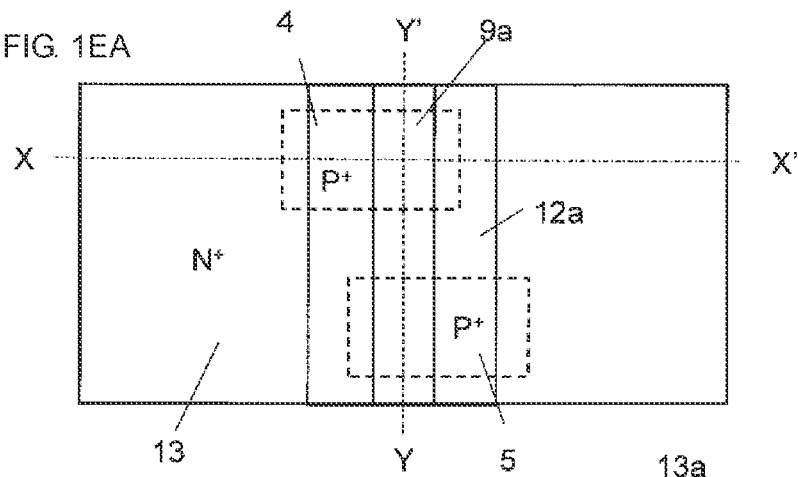
FIG. 1EA and FIGS. 1EB and 1EC are respectively a plane view and cross-sectional structural views for describing a manufacturing method of a pillar-shaped semiconductor device having SGTs according to the first embodiment.
Figure 1E:
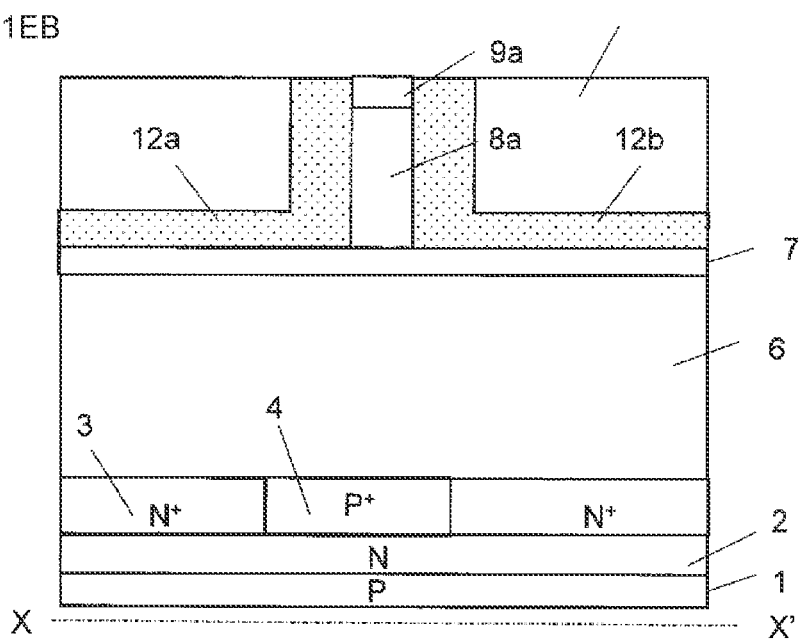
Figure 1E:
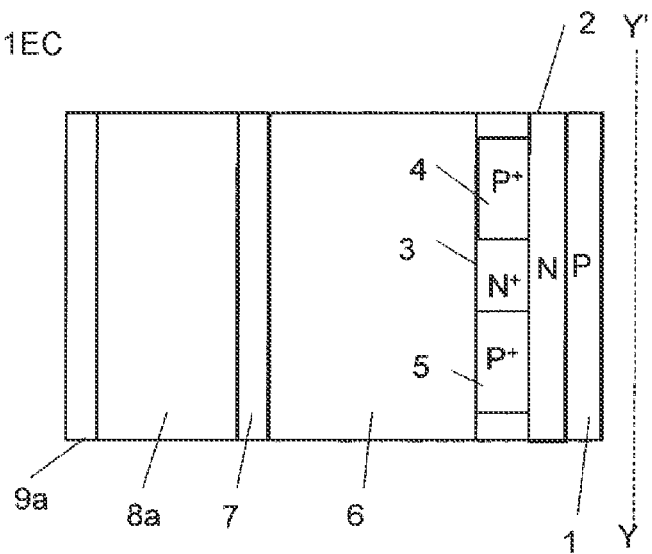

Next, as shown in FIGS. 1EA to 1EC, the entire area is covered with a $SiO_2$ layer (not shown) for example by Flow CVD (Flow Chemical Vapor Deposition) method, and then the $SiO_2$ layer 13 and the SiGe layer 12 are polished by CMP (Chemical Mechanical Polishing) such that their upper surface position comes to the upper surface position of the band-like mask material layer 9a to form a $SiO_2$ layer 13a and SiGe layers 12a, 12b. In this case, it is desirable that the top side surfaces of the SiGe layers 12a, 12b are vertical. For this purpose, it is desirable that the round part R1 of the top of the SiGe layer 12 in FIGS. 1DA to 1DC has been removed during the polishing process of the SiGe layer 12.

Figure 1F:
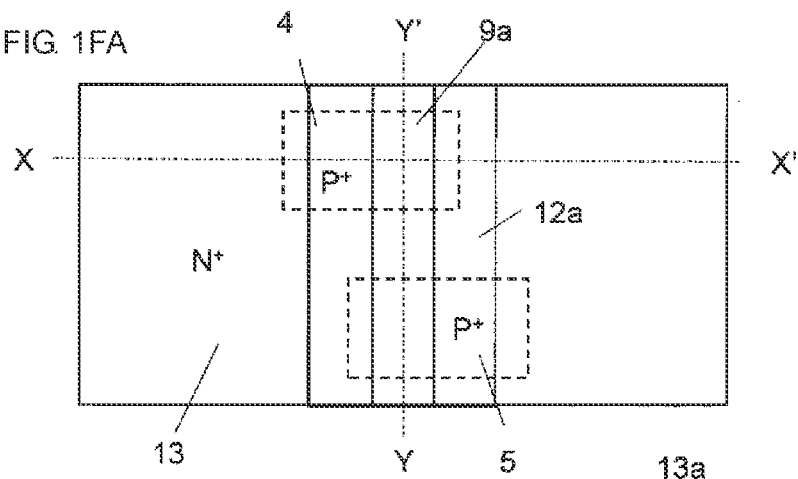
FIG. 1FA and FIGS. 1FB and 1FC are respectively a plane view and cross-sectional structural views for describing a manufacturing method of a pillar-shaped semiconductor device having SGTs according to the first embodiment.
Figure 1F:
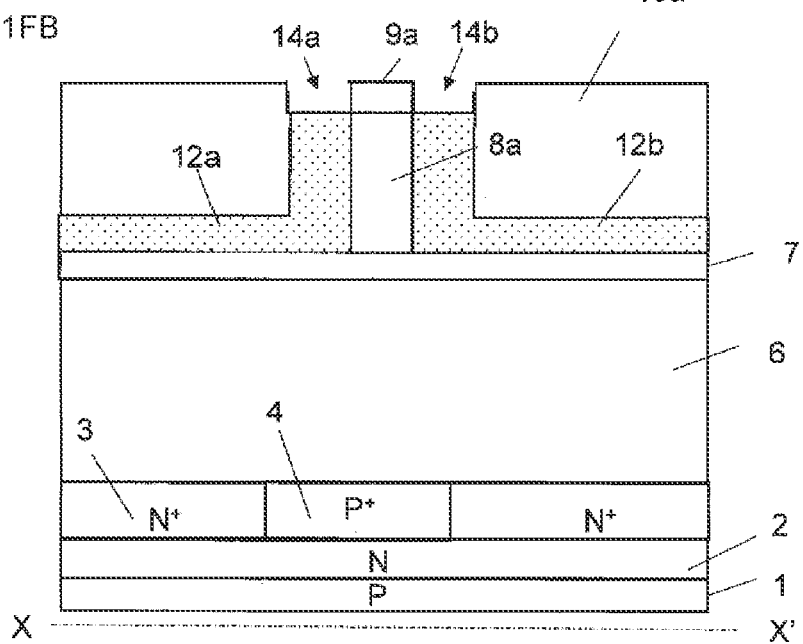
Figure 1F:
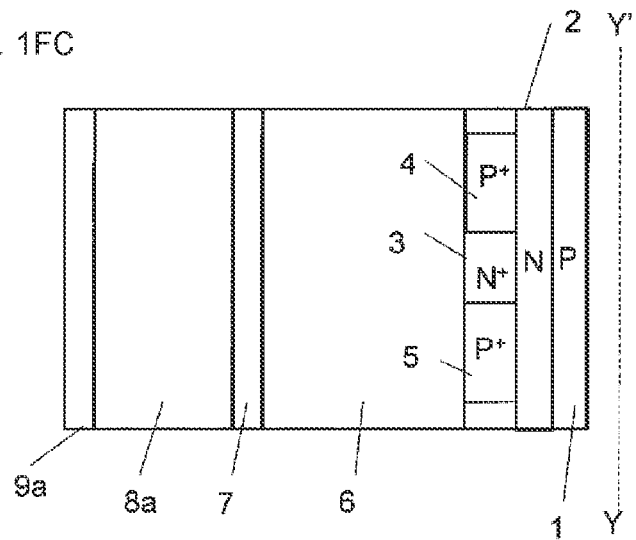

Next, as shown in FIGS. 1FA to 1FC, each of the top of the SiGe layers 12a, 12b is etched with the $SiO_2$ layer 13 and the band-like mask material layer 9a as a mask, to form recesses 14a, 14b. It is desirable that the bottom positions of the recesses 14a, 14b come to the lower position of the mask material layer 9a and that the round part R1 of the top of the SiGe layers 12a, 12b has been etched. During the polishing process of the $SiO_2$ layer and the SiGe layer 12, the round part R of the top of the SiGe layer 12 in FIGS. 1DA to 1DC is removed, and thus the recesses 14a, 14b having vertical peripheral side surfaces are formed.

Figure 1G:
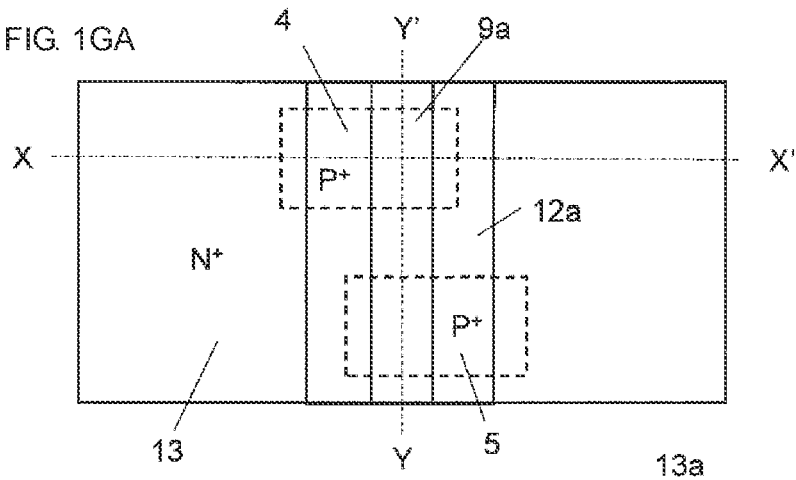
FIG. 1GA and FIGS. 1GB and 1GC are respectively a plane view and cross-sectional structural views for describing a manufacturing method of a pillar-shaped semiconductor device having SGTs according to the first embodiment.
Figure 1G:
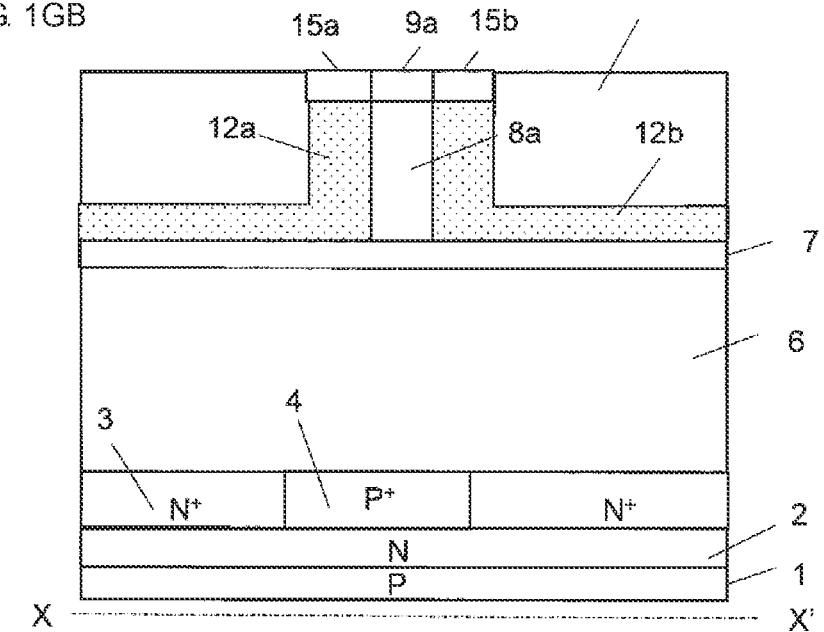
Figure 1G:
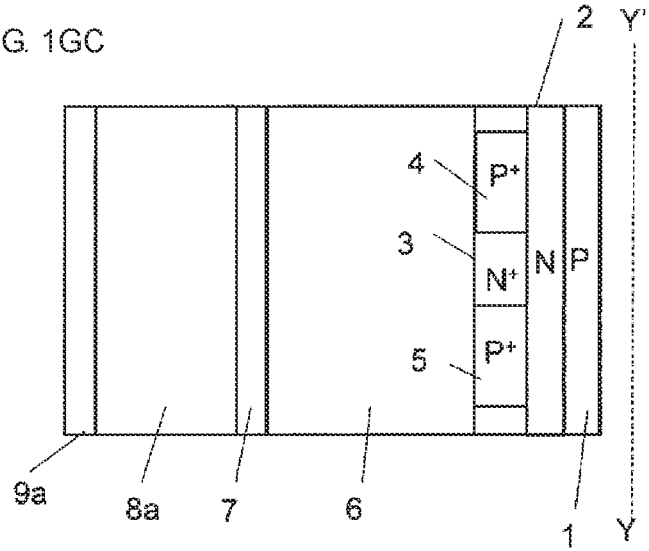

Next, as shown in FIGS. 1GA to 1GC, the entire area is covered with a SiN layer (not shown), and the SiN layer is entirely polished by CMP method such that its upper surface position comes to the upper surface position of the mask material layer 9a. Thus, band-like mask material layers 15a, 15b having the same shape as the shape of the top of the SiGe layers 12a, 12b in planar view are formed at each side of the band-like mask material layer 9a.

Figure 1H:
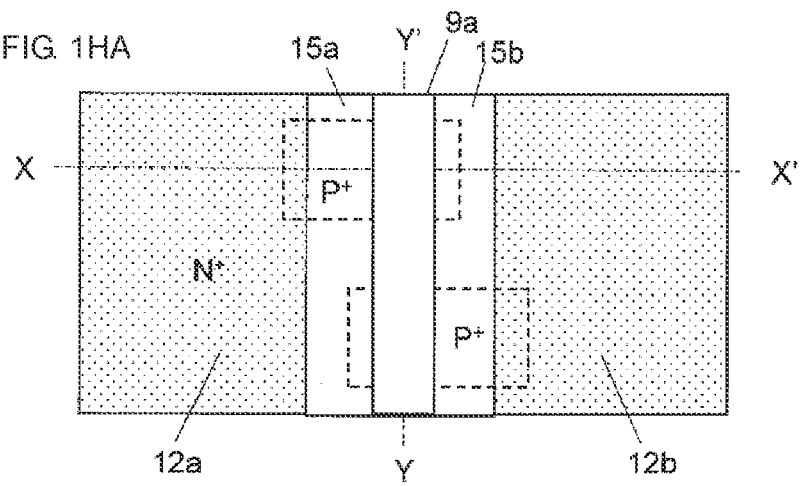
FIG. 1HA and FIGS. 1HB and 1HC are respectively a plane view and cross-sectional structural views for describing a manufacturing method of a pillar-shaped semiconductor device having SGTs according to the first embodiment.
Figure 1H:
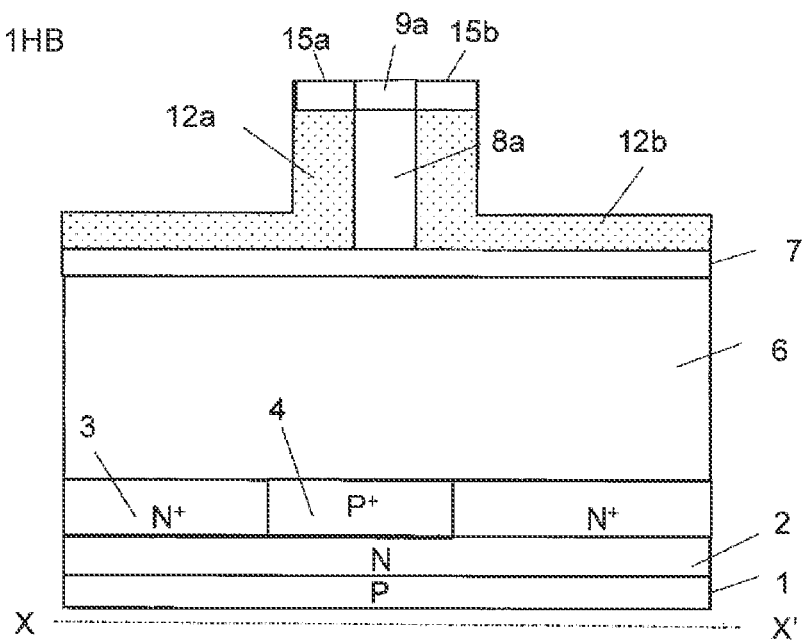
Figure 1H:
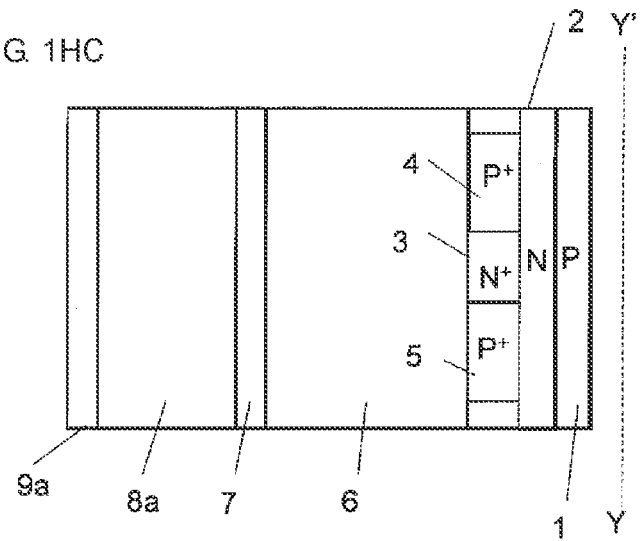
Figure 11A:
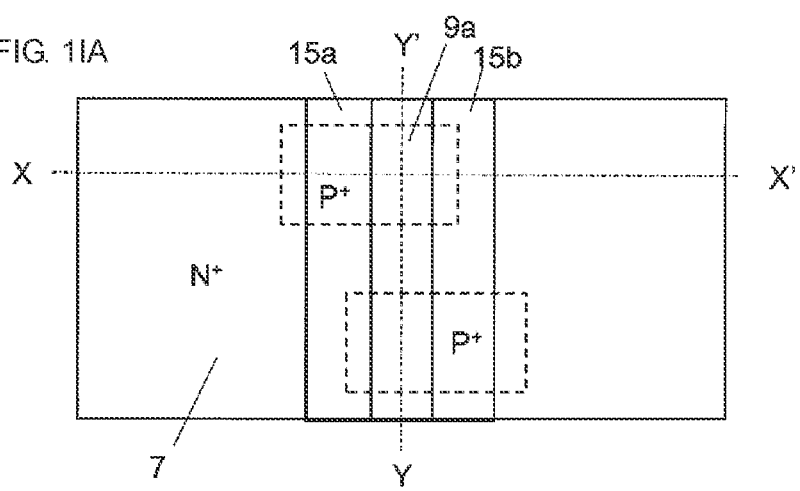
Figure 11B:
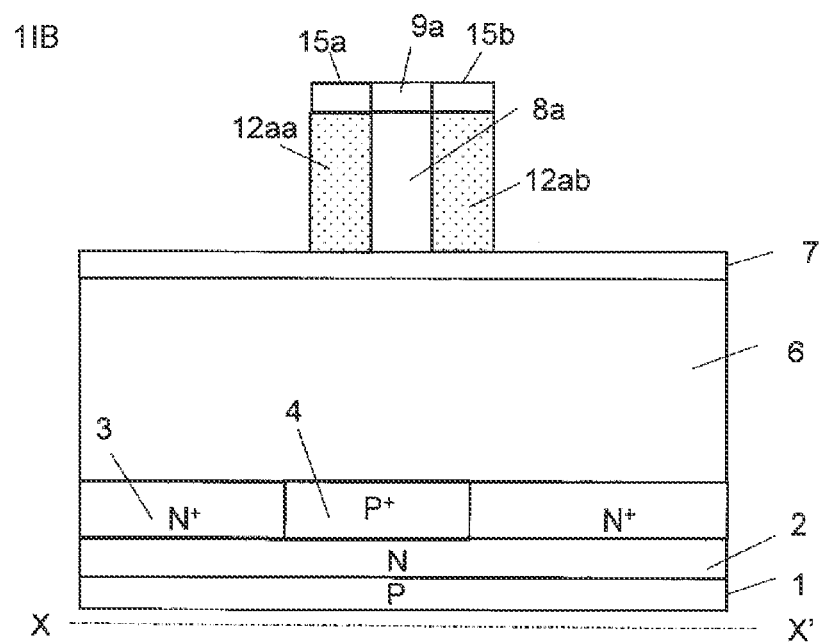
Figure 11C:
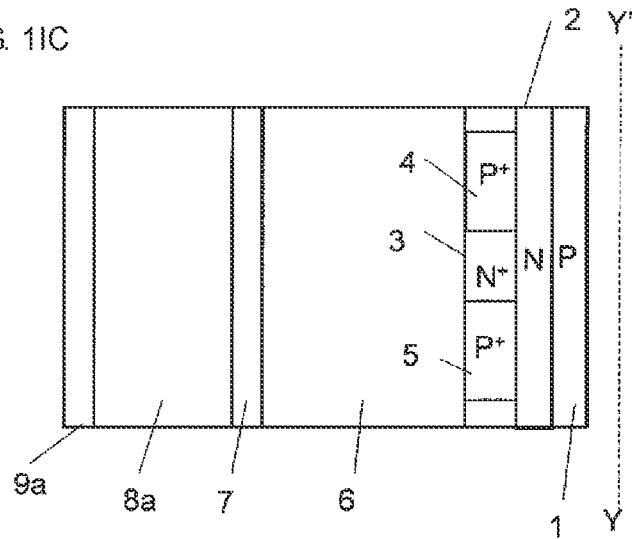

Then, as shown in FIGS. 1HA to 1HC, the $SiO_2$ layer 13 is removed.

Next, as shown in FIGS. 1IA to 1IC, the SiGe layers 12a, 12b are etched with the band-like mask material layers 9a, 15a, 15b as a mask to form band-like SiGe layers 12aa, 12ab. In this case, the band-like SiGe layer 12aa and the band-like SiGe layer 12ab have the same width in planar view.

Figure 1J:
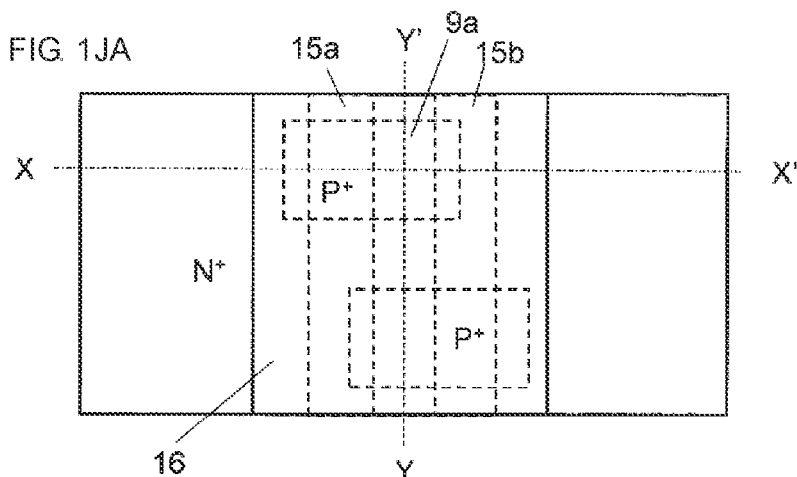
FIG. 1JA and FIGS. 1JB and 1JC are respectively a plane view and cross-sectional structural views for describing a manufacturing method of a pillar-shaped semiconductor device having SGTs according to the first embodiment.
Figure 1J:
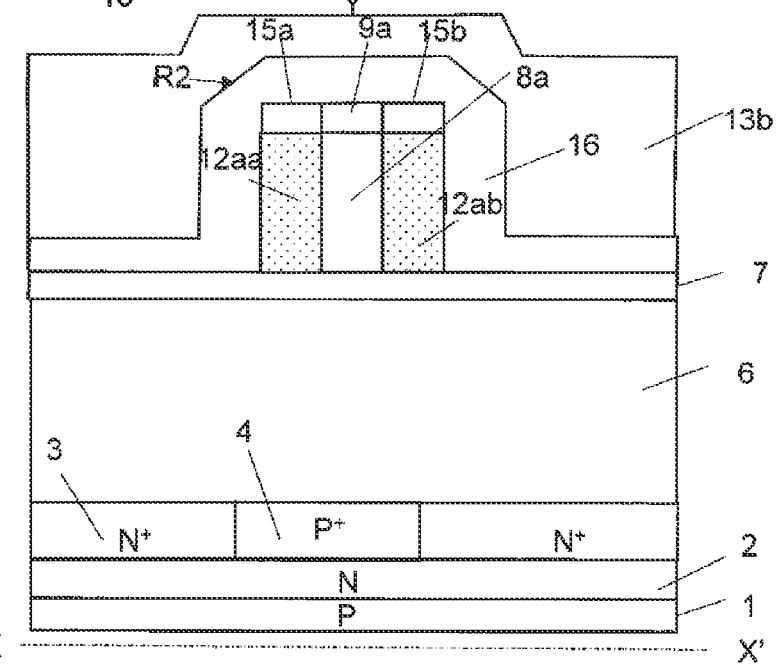
Figure 1J:
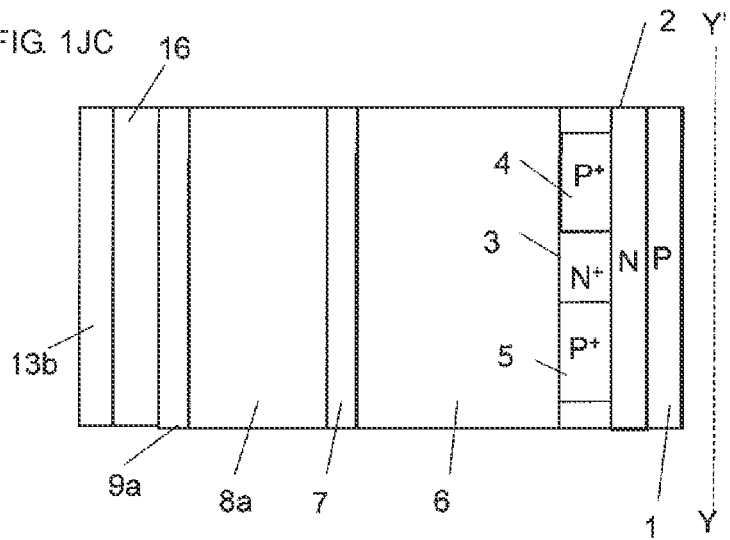

Next, as shown in FIGS. 1JA to 1JC, a SiN layer 16 by ALD method and a $SiO_2$ layer 13b by FCVD method are formed to cover the entire area. In this case, similar to FIGS. 1DA to 1DC, a rounded part R2 provided at the top of the SiN layer 16 is desirably positioned above the band-like mask material layer 9a.

Next, the $SiO_2$ layer 13b and the SiN layer 16 are polished such that their upper surface positions come to the same position as the upper surface of the mask material layer 9a. Then, by performing processes similar to those of FIGS. 1EA to 1FC, recesses 14A, 14B are formed above SiN layers 16A, 16B, and between the band-like mask material layers 15a, 15b and a $SiO_2$ layer 13ba, as shown in FIGS. 1KA to 1KC.

As shown in FIGS. 1LA to 1LC, band-like SiN layers 16a, 16b in contact with each side surface of the band-like SiGe layers 12aa, 12ab, and band-like mask material layers 17a, 17b in contact with each side surface of the band-like mask material layers 15a, 15b are formed.

Figure 1M:
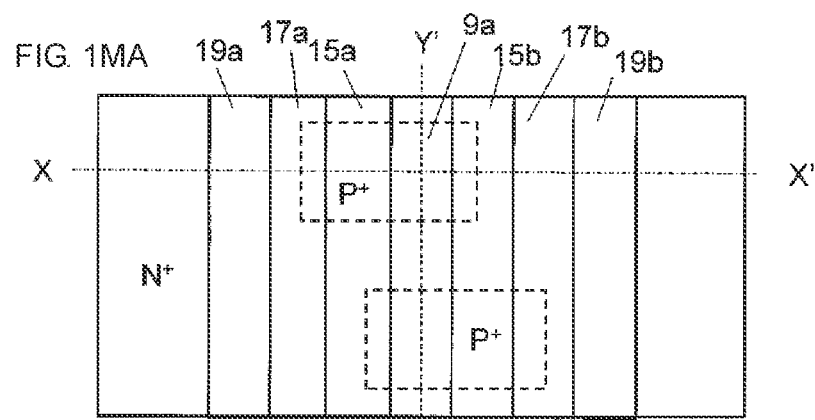
FIG. 1MA and FIGS. 1MB and 1MC are respectively a plane view and cross-sectional structural views for describing a manufacturing method of a pillar-shaped semiconductor device having SGTs according to the first embodiment.
Figure 1M:
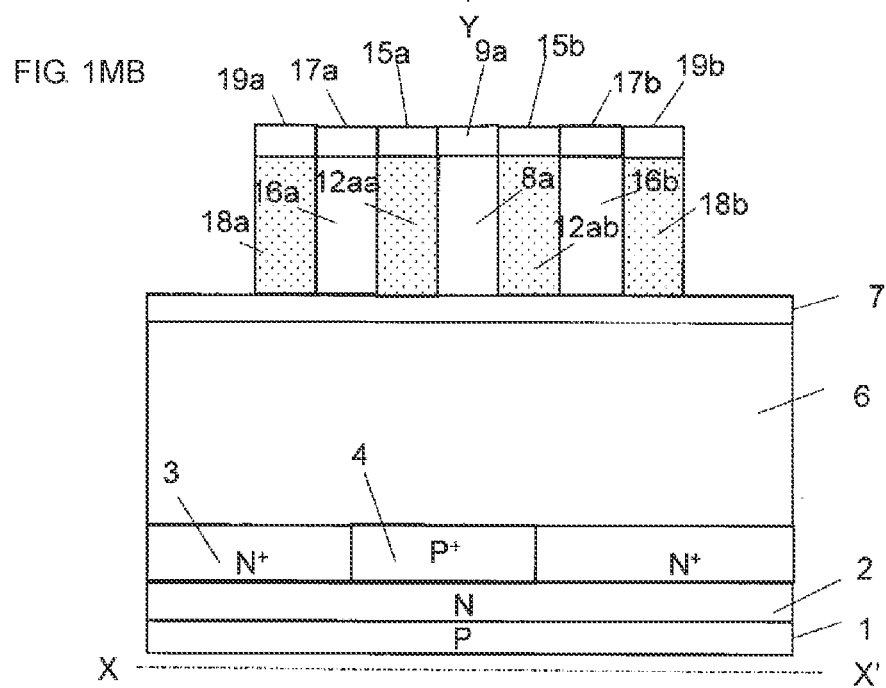
Figure 1M:
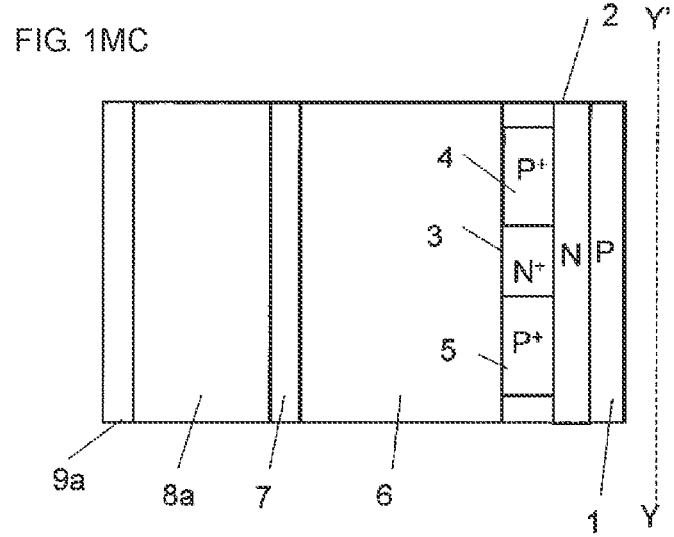

Next, a SiGe layer (not shown) is formed by ALD method to cover the entire area. Then, a $SiO_2$ layer (not shown) is formed to cover the entire area. Then, the $SiO_2$ layer and the SiGe layer are polished such that their upper surface positions come to the same position as the upper surface of the band-like mask material layer 9a. Then, by performing processes similar to those of FIGS. 1EA to 1IC, band-like SiGe layers 18a, 18b in contact with each side surface of the band-like SiN layers 16a, 16b, and band-like mask material layers 19a, 19b in contact with each side surface of the band-like mask material layers 17a, 17b are formed, as shown in FIGS. 1MA to 1MC.

Next, a SiN layer (not shown) is formed by ALD method to cover the entire area. Then, a SiO$_2$ layer (not shown) is formed to cover the entire area. Then, the SiO$_2$ layer and the SiN layer are polished such that their upper surface positions come to the same position as the upper surface of the band-like mask material layer 9a. Then, by performing processes similar to those of FIGS. 1EA to 1IC, band-like SiN layers 20a, 20b in contact with each side surface of the band-like SiGe layers 18a, 18b, and band-like mask material layers 21a, 21b in contact with each side surface of the band-like mask material layers 19a, 19b are formed, as shown in FIGS. 1NA to 1NC, Next, the band-like mask material layers 15a, 15b, 19a, 19b and the band-like SiGe layers 12aa, 12ab, 18a, 18b are removed by etching. Thus, as shown in FIGS. 1OA to 1OC, the band-like mask material layers 8a, 16a, 16b, 20a, 20b and the mask material layers 9a, 17a, 17b, 21a, 21b on the band-like SiN layers 8a, 16a, 16b, 20a, 20b are formed on the mask material layer 7.

Figure 1P:
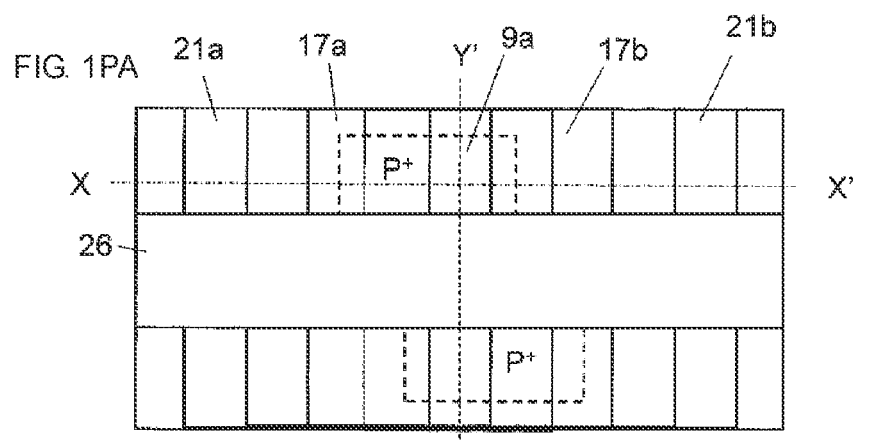
FIG. 1PA and FIGS. 1PB and 1PC are respectively a plane view and cross-sectional structural views for describing a manufacturing method of a pillar-shaped semiconductor device having SGTs according to the first embodiment.
Figure 1P:
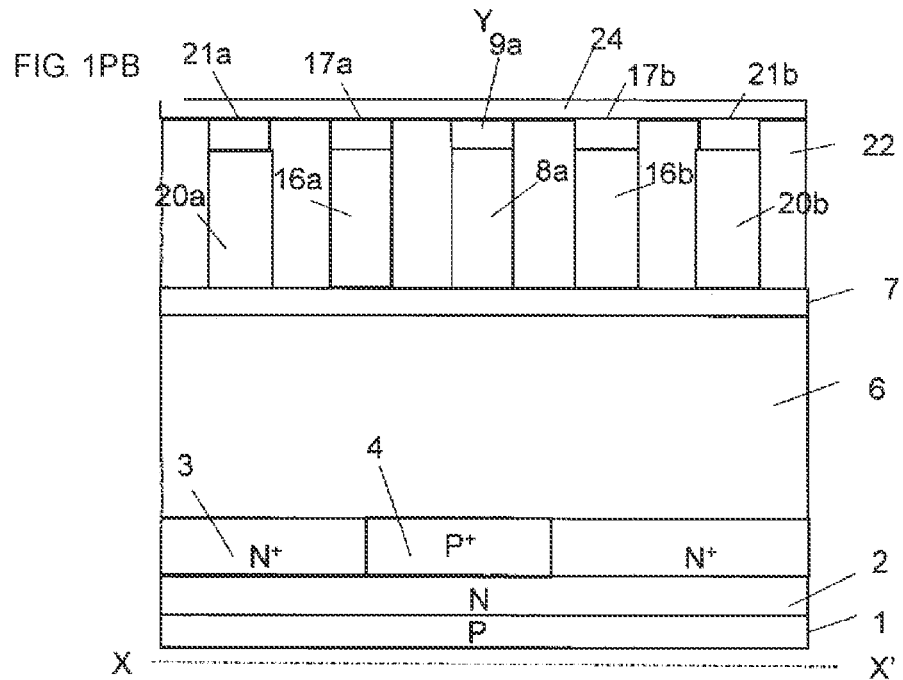
Figure 1P:
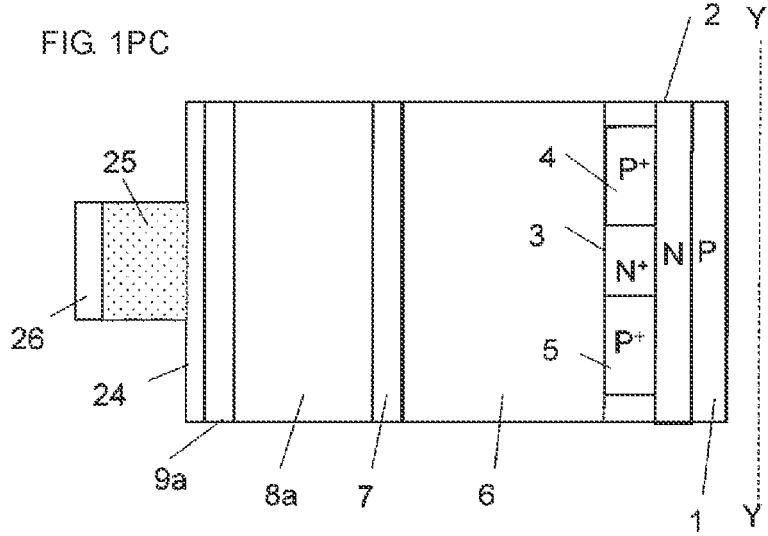

Next, the entire area is covered with a SiO$_2$ layer (not shown). Then, as shown in FIGS. 1PA to 1PC, the SiO$_2$ layer is polished by CMP method such that its upper surface position comes to the upper surface position of the band-like mask material layer 9a to form a SiO$_2$ layer 22. Then, a SiN layer 24 and a SiGe layer (not shown) are entirely formed. Then, a band-like mask material layer 26 of SiN layer extended in X direction is formed. Then, the SiGe layer is etched by lithography and RIE method with the formed band-like mask material layer 26 as a mask, to form a band-like SiGe layer 25 extended in X direction.

Figure 1Q:
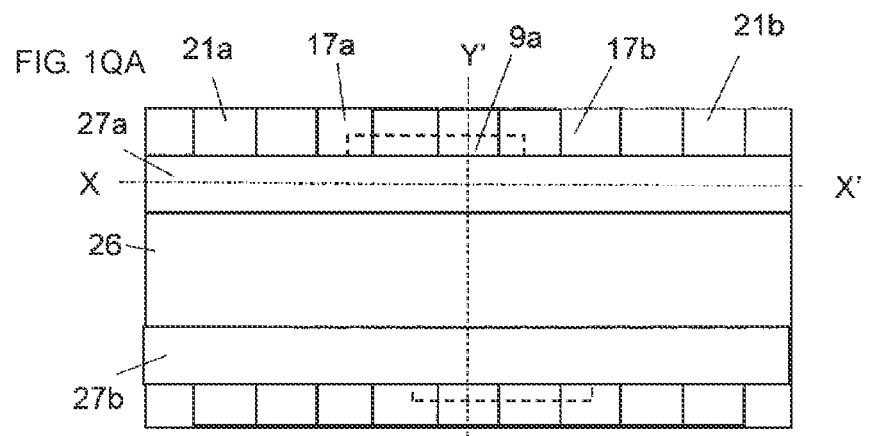
FIG. 1QA and FIGS. 1QB and 1QC are respectively a plane view and cross-sectional structural views for describing a manufacturing method of a pillar-shaped semiconductor device having SGTs according to the first embodiment.
Figure 1Q:
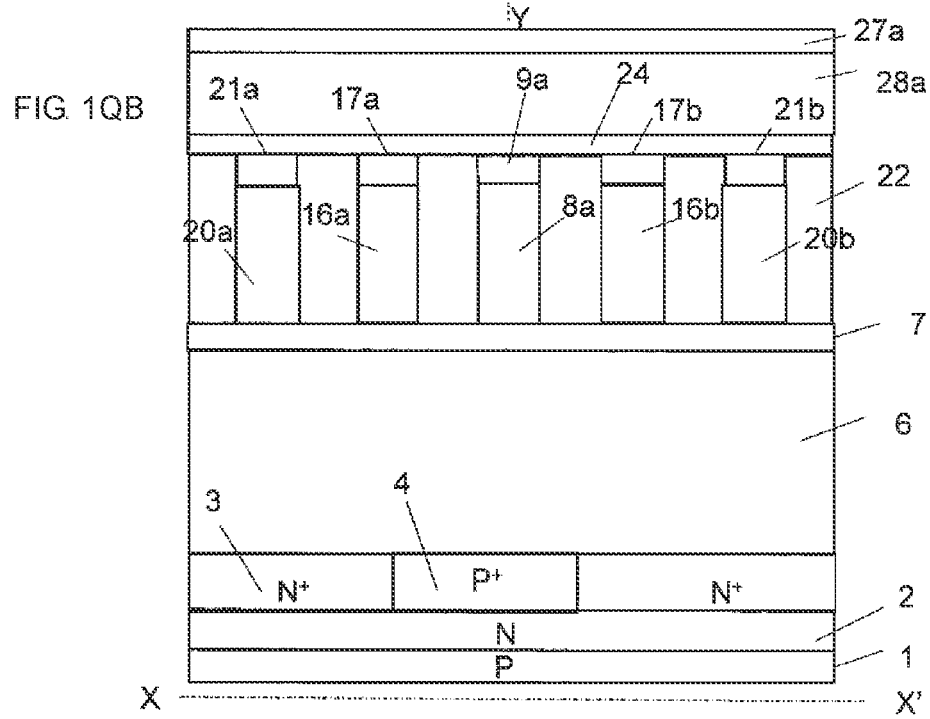
Figure 1Q:
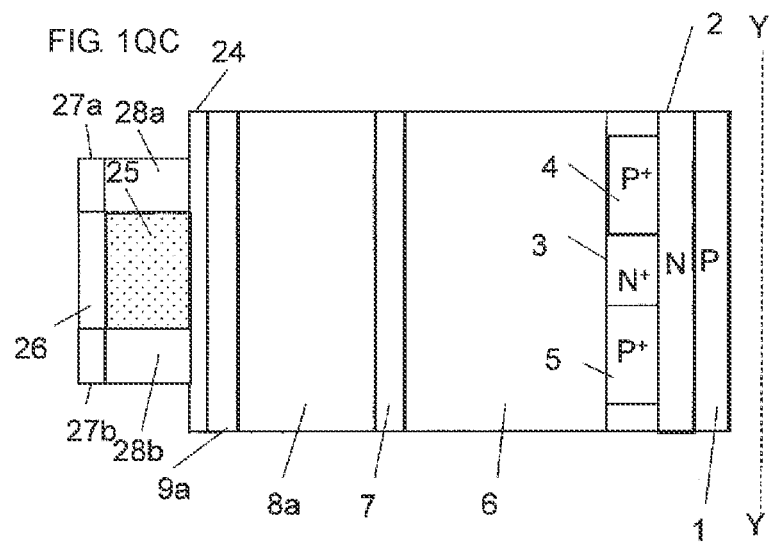

Next, by performing processes similar to those of FIGS. 1CA to 1IC, band-like mask material layers 28a, 28b of SiN layer in contact with each side surface of the band-like SiGe layer 25 and band-like mask material layers 27a, 27b in contact with each side surface of the band-like mask material layer 26 are formed, as shown in FIGS. 1QA to 1QC.

Next, as shown in FIGS. 1RA to 1RC, the band-like mask material layer 26 and the band-like SiGe layer 25 are removed to form band-like mask material layers 28a, 28b and band-like mask material layers 27a, 27b on the band-like mask material layers 28a, 28b, extended in X direction in planar view, on the SiN layer 24.

Next, as shown in FIGS. 1SA to 1SC, the SiN layer 24, the band-like mask material layers 9a, 17a, 17b, 21a, 21b, 8a, 16a, 16b, 20a, 20b, and the SiO$_2$ layer 22 are etched with the band-like mask material layers 27a, 27b, 28a, 28b as a mask. Thus, a band-like SiN layer 24a, and in planar view, square-shaped mask material layers 21aa, 21ba, 17aa, 17ba, 9aa, and square-shaped mask material layer 20aa, 20ba, 16aa, 16ba, 8aa located under the square-shaped mask material layers 21aa, 21ba, 17aa, 17ba, 9aa are formed under the band-like mask material layers 27a, 28a. Similarly, a band-like SiN layer 24b, and in planar view, square-shaped mask material layers 21ba, 21bb, 17ba, 17bb, 9ab, and square-shaped mask material layer 20ba (not shown), 20bb (not shown), 16ba (not shown), 16bb (not shown), 8ab located under the square-shaped mask material layers 21ba, 21bb, 17ba, 17bb, 9ab are formed under the band-like mask material layers 27b, 28b. Also, at the same time, a SiO$_2$ layer 22a is formed under the band-like SiN layer 24a and between the band-like mask material layers 21aa, 21ba, 17aa, 17ba, 9aa, 20aa, 20ba, 16aa, 16ba, 8aa. Similarly, a SiO$_2$ layer 22b (not shown) is formed under the band-like SiN layer 24b and between the band-like mask material layers 21ba, 21bb, 17ba, 17bb, 9ab, 20ba, 20bb, 16ba, 16bb, 8ab.

Next, as shown in FIGS. 1TA to 1TC, the band-like mask material layers 27a, 27b, 28a, 28b, the band-like SiN layers 24a, 24b and the SiO$_2$ layers 22a, 22b are removed. Thus, in planar view, square-shaped mask material layers 21aa, 21ab, 21ba, 21bb, 17aa, 17ab, 17ba, 17bb, 9aa, 9ba and square-shaped SiN material layer 20aa, 20ab, 20ba, 20bb, 16aa, 16ab, 16ba, 16bb, 8aa, 8ab are formed on the mask material layer 7.

Figure 1U:
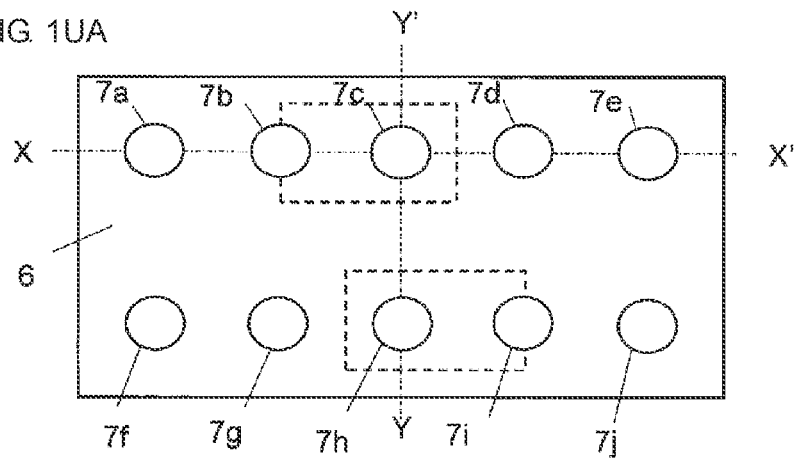
FIG. 1UA and FIGS. 1UB and 1UC are respectively a plane view and cross-sectional structural views for describing a manufacturing method of a pillar-shaped semiconductor device having SGTs according to the first embodiment.
Figure 1U:
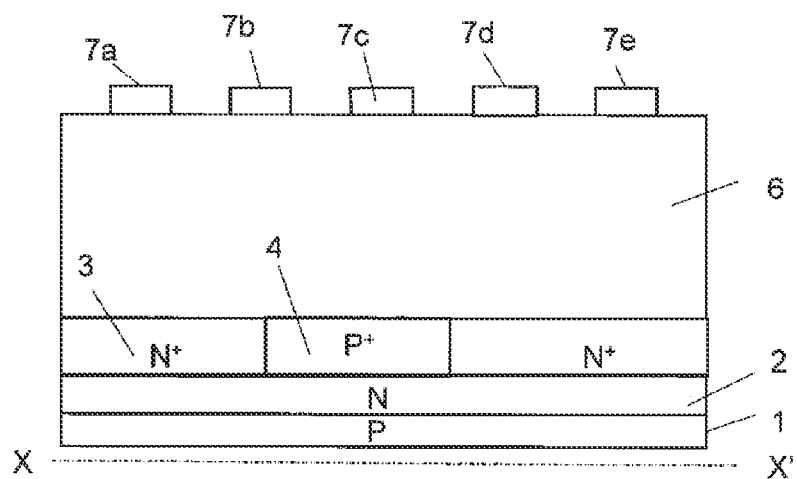
Figure 1U:
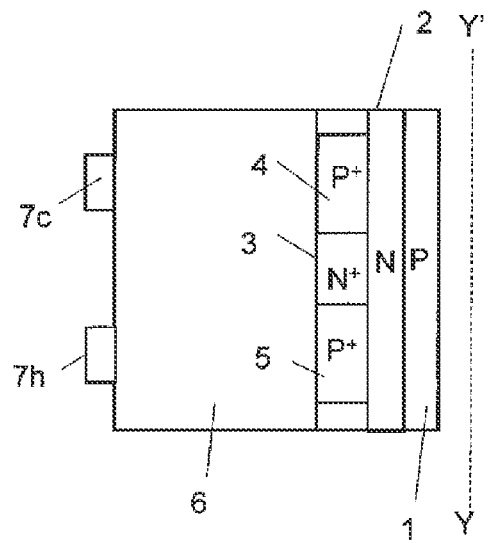

Next, the mask material layer 7 is etched by RIE method with the square-shaped mask material layers 21aa, 21ab, 21ba, 21bb, 17aa, 17ab, 17ba, 17bb, 9aa, 9ab and the square-shaped SiN material layer 20aa, 20ab, 20ba, 20bb, 16aa, 16ab, 16ba, 16bb, 8aa, 8ab as a mask. Then, the square-shaped mask material layers 21aa, 21ab, 21ba, 21bb, 17aa, 17ab, 17ba, 17bb, 9aa, 9ab and the square-shaped material layer 20aa, 20ab, 20ba, 20bb, 16aa, 16ba, 16bb, 8aa, 8ab are removed. Thus, as shown in FIGS. 1UA to 1UC, mask material layers 7a, 7b, 7c, 7d, 7e, 7f, 7g, 7h, 7i, 7j are formed on the i layer 6. For example, before the RIE etching of the mask material layer 7, either or both of the square-shaped mask material layers 21aa, 21ab, 21ba, 21bb, 17aa, 17ab, 17ba, 17bb, 9aa, 9ab and the square-shaped SiN material layer 20aa, 20ab, 20ba, 20bb, 16aa, 16ab, 16ba, 16bb, 8aa, 8ab are slightly etched isotropically. This makes mask material layers 7a to 7j circular shape in planar view.

Figure 1V:
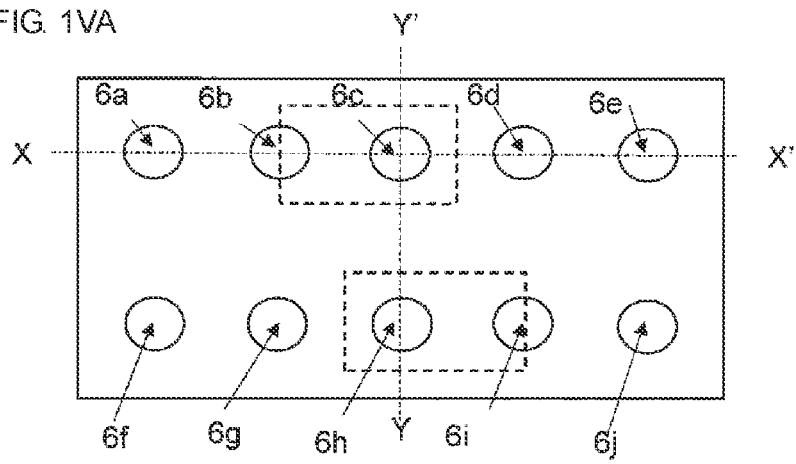
FIG. 1VA and FIGS. 1VB and 1VC are respectively a plane view and cross-sectional structural views for describing a manufacturing method of a pillar-shaped semiconductor device having SGTs according to the first embodiment.
Figure 1V:
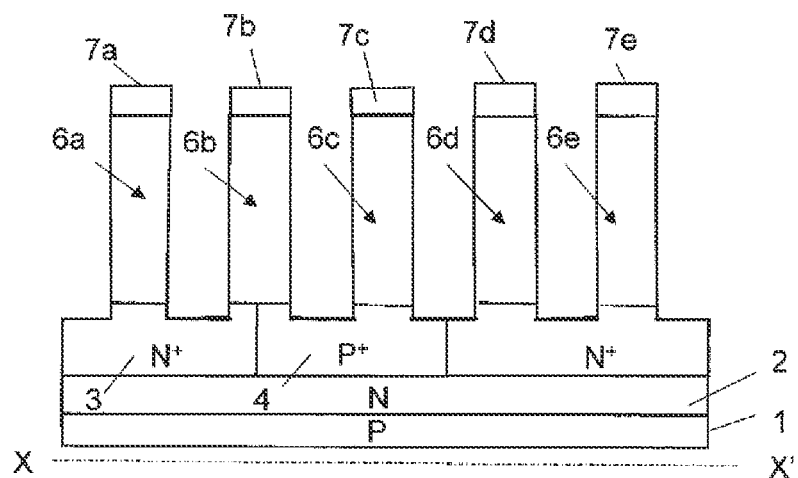
Figure 1V:
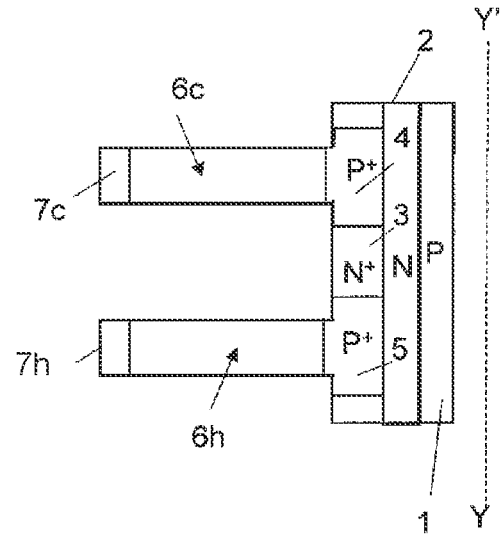

Next, as shown in FIGS. 1VA to 1VC, the i layer 6 is etched with the mask material layers 7a to 7j as a mask to form Si pillars 6a, 6b, 6c, 6d, 6e, 6f, 6g, 6h, 6i, 6j on the N$^+$ layer 3 and the P$^+$ layer 4.

Figure 1W:
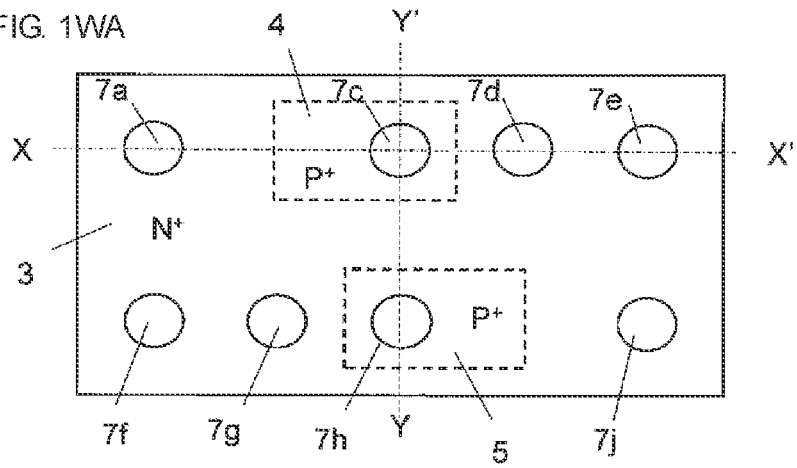
FIG. 1WA and FIGS. 1WB and 1WC are respectively a plane view and cross-sectional structural views for describing a manufacturing method of a pillar-shaped semiconductor device having SGTs according to the first embodiment.
Figure 1W:
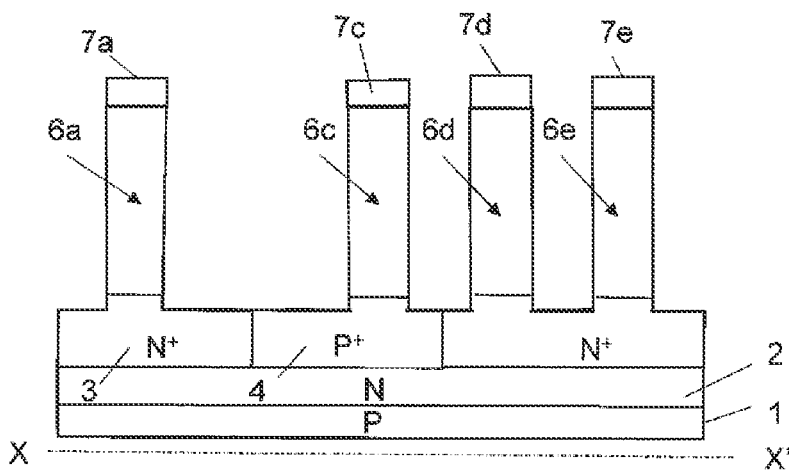
Figure 1W:
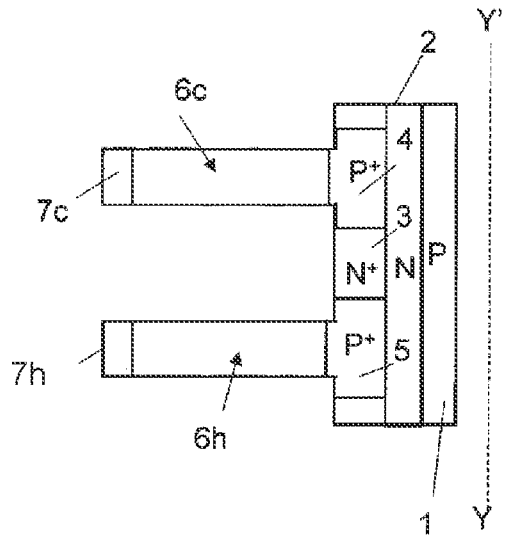

Next, a SiO$_2$ layer (not shown) is deposited by FCVD method, and then polished by CMP method such that its surface position comes to the top position of the mask material layers 7a to 7j. Then, the mask material layers 7b, 7i and the Si pillars 6b, 6i are removed by lithography and RIE etching method. Then, the SiO$_2$ layer formed by the FCVD method is removed. Thus, as shown in FIGS. 1WA to 1WC, the Si pillars 6a, 6c, 6d, 6e, 6f, 6g, 6h, 6j are formed on the N$^+$ layer 3 and the P$^+$ layers 4, 5.

Next, as shown FIGS. 1XA to 1XC, mask material layers 30a, 30b, 30c, 30d surrounding side surfaces of the mask material layers 7a to 7j (the mask material layers 7b, 7i are absent) and mask material layers 31a, 31b, 31c, 31d (not shown) surrounding side surfaces of the Si pillars 6a to 6j (the Si pillars 6b, 6i are absent) are formed. Then, a SiO$_2$ layer (not shown) is deposited over the entire area by FCVD method, and then polished by CMP method such that its surface position comes to the top position of the mask material layers 7a to 7j (the mask material layers 7b, 7i are absent). Then, on the smoothed face, in planar view, a band-like mask material layer 33a of, for example, SiO$_2$ layer, linked to the Si pillars 6a, 6c, 6d, 6e, and a band-like mask material layer 33b of, for example, SiO$_2$ layer, linked to the Si pillars 6f, 6g, 6h, 6j are formed. Then, the SiO$_2$ layer, the N$^+$ layer 3, the P$^+$ layers 4, 5, the N layer 2, and the P layer 1 are etched with the mask material layers 30a, 30b, 30c, 30d, 7a to 7j, 33a, and 33b as a mask. Thus, a Si pillar base 5a consisting of an N layer 2a, N$^+$ layers 3a, 3b and a P$^+$ layer 4a is formed under the Si pillars 6a, 6c, 6d, 6e and on the P layer 1. Similarly, a Si pillar base 5b consisting of an N layer 2b, N+ layers 3c (not shown), 3d (not shown) and a P+ layer 4b is formed under the Si pillars 6f, 6g, 6h, 6j and on the P layer 1. Then, a SiO2 layer 32a is formed under the mask material layer 33a and between the Si pillars 6a and 6c. Similarly, a SiO2 layer 32b (not shown) is formed under the mask material layer 33b and between the Si pillars 6h and 6j.

Next, as shown in FIGS. 1YA to 1YC, the mask material layers 33a, 33b, the SiO2 layers 32a, 32b, and the mask material layers 30a, 30b, 30c, 30d, 31a, 31b, 31c, 31d are removed.

Figure 1Z:
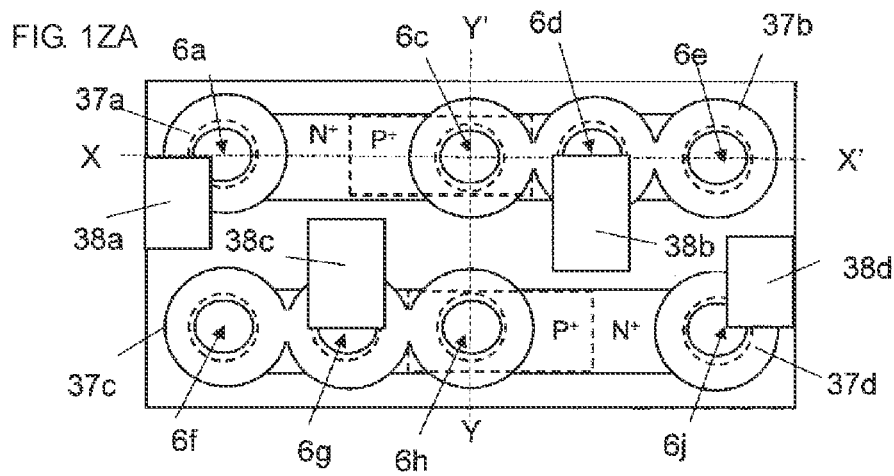
FIG. 1ZA and FIGS. 1ZB and 1ZC are respectively a plane view and cross-sectional structural views for describing a manufacturing method of a pillar-shaped semiconductor device having SGTs according to the first embodiment.
Figure 1Z:
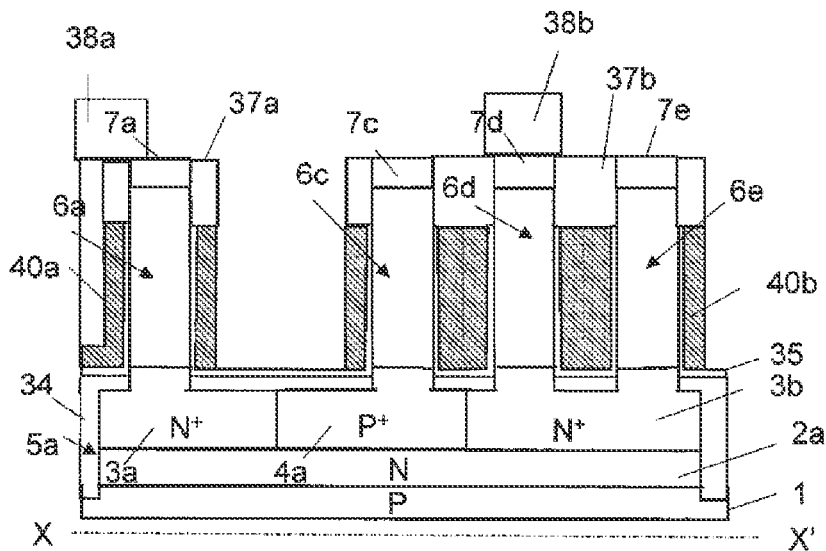
Figure 1Z:
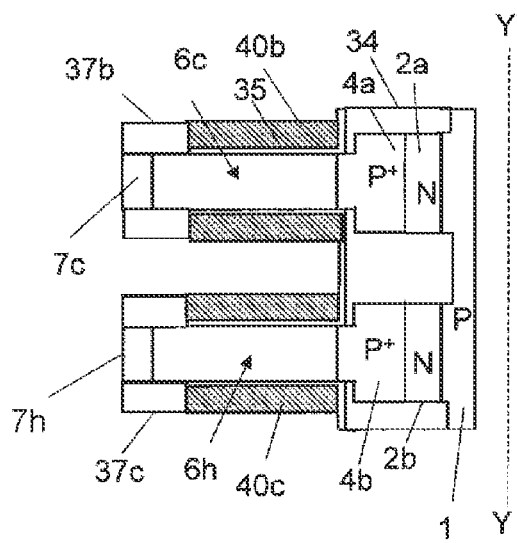

Next, as shown in FIGS. 1ZA to 1ZC, a SiO2 layer 34 is formed on the periphery of the N+ layers 3a, 3b, 3c, 3d, the P+ layer 4a, 4b, and the N layer 2a, 2b and on the P layer substrate 1. Then, a HfO2 layer (not shown), a TiN layer (not shown), and a SiO2 layer (not shown) are formed over the entire area by ALD method. In this case, the TiN layers between the Si pillars 6c, 6d, and 6e are in contact with each other at their side surfaces. Similarly, the TiN layers between the Si Pillars 6f, 6g, and 6h are in contact with each other at their side surfaces. Then, the HfO2 layer, the TiN layer and the SiO2 layer are polished by CMP method such that their upper surface position comes to the upper surface position of the mask material layers 7a to 7j. Then, the SiO2 layer is etch-backed by RIE method. Then, the TiN layer and the HfO2 layer are etched with the SiO2 layer as a mask, such that their upper surface position comes to the upper position of the Si pillars 6a to 6j.

Then, a SiN layer (not shown) is formed over the entire area by CVD method. Then, the SiN layer is polished by CMP method such that its upper surface position comes to the upper surface position of the mask material layers 7a to 7j. Thus, SiN layers 37a, 37b, 37c, 37d having equal width in planar view are formed on the periphery of the top of the Si pillars 6a to 6j. Then, mask material layers 38a, 38b, 38c, 38d respectively contacting to the Si pillars 6a, 6d, 6g, 6j in planar view are formed on the mask material layers 7a to 7j. Then, the SiO2 layer and the TiN layer on the periphery of the mask material layers 37a, 37b, 37c, 37d in planar view are etched with the mask material layers 7a to 7j, 37a, 37b, 37c, 37d, 38a, 38b, 38c, 38d as a mask. Thus, a TiN layer 40a linked to the periphery of the Si pillar 6a, a TiN layer 40b linked to the periphery of the Si pillars 6c, 6d, 6e, a TiN layer 40c linked to the periphery of the Si pillars 6f, 6g, 6h, and a TiN layer 40d (not shown) linked to the periphery of the Si pillar 6j are formed. TiN layers (not shown) are also formed under the mask material layers 38a, 38b, 38c, 38d. Then, the mask material layers 38a to 38d, 37a to 37d, and 7a to 7j are removed. The TiN layers 40a, 40b, 40c, 40d are gate conductor layers of the SGTs. The gate conductor layers are layers contributing to the setting of a threshold voltage of the SGTs and may be formed of a gate conductor material layer consisting of one or more layers. The gate conductor material layers are formed in contact with entire side surfaces between the Si pillars 6c, 6d, 6e and the Si pillars 6f, 6g, 6h. Also, subsequent to the deposition of the gate conductor material layer, a tungsten (W) layer, for example, is deposited and the process shown in FIGS. 1ZA to 1ZC is performed to form W layers as line conductor layers under the mask material layers 38a, 38b, 38c, 38d. The W layer may be other conductor material layers.

Next, as shown in FIGS. 1XXA to 1XXC, the entire area is covered with a SiO2 layer (not shown) and then the SiO2 layer is polished by CMP method such that its upper surface position comes to the upper surface position of the top of the Si pillars 6a to 6j. Then, an upper portion of the SiO2 layer is etched by RIE method until its upper surface position comes to the top position of the TiN layers 40a to 40d. Then, a SiN layer 42 is formed on the periphery of the top of the Si pillars 6a to 6j.

Then, after the top of the Si pillar 6c, 6h is covered with a SiO2 layer (not shown), an N+ layer 43a containing donor impurities are formed around the top of the Si pillar 6a by selective epitaxial crystal growth method. At the same time, an N+ layer 43c covering the top of the Si pillar 6d, an N+ layer 43d (not shown) covering the top of the Si pillar 6e, an N+ layer 43e (not shown) covering the top of the Si pillar 6f, an N+ layer 43f (not shown) covering the top of the Si pillar 6g, and an N+ layer 41h (not shown) covering the top of the Si pillar 6j are formed. Then, the SiO2 layer covering the top of the Si pillars 6c, 6h is removed. Then, a SiO2 layer (not shown) is formed over the Si pillars 6a, 6d, 6e, 6f, 6g, 6j. Then, P+ layers 43b, 43g containing acceptor impurities are formed around the top of the Si pillars 6c, 6h by selective epitaxial crystal growth method. Then, the donor impurities in the N+ layers 43a, 43c, 43d, 43e, 43f, 43h are diffused into the top of the Si pillars 6a, 6d, 6e, 6f, 6g, 6j by heat treatment to form N+ layers 44a, 44c, 44d, 44e (not shown), 44f (not shown), 44h (not shown). At the same time, the acceptor impurities are diffused from the P+ layers 43b, 43g to form P+ layers 44b, 44g.

Next, as shown in FIGS. 1YYA to 1YYC, a SiO2 layer 46 having a flat upper surface is formed over the entire area. Then, a connection line metal layer C1 is formed via a contact hole 47a formed on the interface between the N+ layer 3a and the P+ layer 4a and on the TiN layer 40b. At the same time, a connection line metal layer C2 (not shown) is formed via a contact hole 47b (not shown) formed on the interface between the N+ layer 3d and the P+ layer 4b and on the TiN layer 40b. A SiO2 layer 48 having a flat upper surface is formed over the entire area. Then, a word line metal layer WL is formed via contact holes 49a, 49b formed on the TiN layer 40a, 40d. A SiO2 layer 50 having a flat upper surface is formed over the entire area. Then, a ground line metal layer Vss1 is formed via contact holes 51a, 51b formed on the N+ layers 43c, 43d. At the same time, a ground line metal layer Vss2 is formed via contact holes 51c, 51d formed on the N+ layers 43e, 43f Then, a SiO2 layer 52 having a flat upper surface is formed over the entire area. Then, a supply line metal layer Vdd is formed via contact holes 53a, 53b formed on the P+ layers 43b, 43g. Then, a SiO2 layer 54 having a flat upper surface is formed over the entire area. Then, a bit output line metal layer BL and a reverse bit output line metal layer RBL are formed via contact holes 55a, 55b formed on the N+ layer 43a, 43h. Thus, a SRAM cell circuit is formed on the P layer substrate 1. In the SRAM circuit, loading SGTs are formed at the Si pillars 6c, 6h, driving SGTs are formed at the Si pillars 6d, 6e, 6f, 6g, and selection SGTs are formed at the Si pillars 6a, 6j.

As shown in FIGS. 1YYA to 1YYC, in one SRAM cell area, a first row of Si pillars consisting of the Si pillar 6a (first semiconductor pillar) of a selection SGT (first selection SGT), the Si pillar 6c (seventh semiconductor pillar) of a loading SGT (seventh SGT), the Si pillar 6d (fifth semiconductor pillar) of a driving SGT (fifth SGT), and the Si pillar 6e (fourth semiconductor pillar) of a driving SGT (fourth SGT) aligned in X direction in the order, and a second row of Si pillars consisting of the Si pillar 6f (third semiconductor pillar) of a driving SGT (third SGT), the Si pillar 6g (sixth semiconductor pillar) of a driving SGT (sixth SGT), the Si pillar 6h (eighth semiconductor pillar) of a loading SGT (eighth SGT), and the Si pillar 6j (second semiconductor pillar) of a selection SGT (second selection SGT) are formed in parallel to Y direction. Then, the center of the Si pillar 6a and the center of the Si pillar 6f are on a line in Y direction, the center of the Si pillar 6c and the center of the Si pillar 6h are on another line also in Y direction, and the center of the Si pillar 6e and the center of the Si pillar 6j are on another line also in Y direction. The contact hole 47a (first contact hole), which links the N⁺ layer 3a of a lower impurity area of the Si pillar 6a, the P⁺ layer 4a of a lower impurity area of the Si pillar 6c, and the gate TiN layer 40c, is formed in, at least a part being overlapped on, a first band area between two tangential lines of periphery of the Si pillar 6g, the two tangential lines being parallel to Y direction. Then, the contact hole 47b (second contact hole), which links the P⁺ layer 4b of a lower impurity area of the Si pillar 6h, the N⁺ layer 3d of a lower impurity area of the Si pillar 6j, and the gate TiN layer 40b, is formed in, at least a part being overlapped on, a second band area between two tangential lines of periphery of the Si pillar 6d, the two tangential lines being parallel to Y direction.

In the SRAM circuit described in this embodiment, a driving SGT is formed by two SGTs (SGTs formed at the Si pillars 6d, 6e and the Si pillars 6f, 6g) connected in parallel. On the other hand, depending on circuit design requirement, a driving SGT may be formed by one SGT, and a loading SGT may be formed by two SGTs connected in parallel. In addition, even when position of the driving SGT and the position of the loading SGT are exchanged in planar view, there may be no problem in operation of SRAM cell. From the foregoing, following features are provided to an arrangement and structure of SGTs in a cell.

Feature 1

In this embodiment, the Si pillar 6a, which is a selection SGT in upper row of Si pillars (6a, 6c, 6d, 6e), is located on the left-end in X direction in planar view. Then, the Si pillar 6j, which is a selection SGT in lower row of Si pillars (6f, 6g, 6h, 6j), is located on the right-end.

Feature 2

The contact hole 47a for connecting the N⁺ layer 3a, the P⁺ layer 4a, and the gate TiN layer 40c in the upper row is located between the selection SGT and either a loading SGT or a driving SGT. Also, the contact hole 47a for connecting the N⁺ layer 3d, the P⁺ layer 4b, and the gate TiN layer 40c in the lower row is located between the selection SGT and either a loading SGT or a driving SGT.

Feature 3

The Si pillar 6g of the lower row is present in a width of an area extended from the contact hole 47a in Y direction in planar view. Then, the Si pillar 6d of the upper row is present in a width of an area extended from the contact hole 47b in Y direction in planar view.

Feature 4

In the upper row, the TiN layer 40b, which is a gate electrode for the loading SGT and the driving SGT, is formed to contact at side surface of entire gate region in a vertical direction between the Si pillars 6c, 6d, and 6e. Similarly, in the lower row, the TiN layer 40c, which is a gate electrode for the loading SGT and the driving SGT, is formed to contact at side surface of entire gate region in a vertical direction between the Si pillars 6f, 6g, and 6h.

As described in FIGS. 1PA to 1SC, band-like mask material layers 27a, 27b, 28a, 28b extended in X direction are formed to be orthogonal to band-like mask material layers 8a, 16a, 16b, 20a, 20b extended in Y direction by a method similar to the method for forming the band-like SiN layers 8a, 16a, 16b, 20a, 20b. This makes it possible to form Si pillars 6a to 6j with high precision and at high density both in X and Y directions. Then, in the description of the embodiment, the band-like mask material layers 28a, 28b are formed after forming the band-like mask material layers 8a, 16a, 16b, 20a, 20b. On the other hand, it may be also possible to form Si pillars 6a to 6j with high precision and at high density by a process in which the band-like SiN material layers 8a, 16a, 16b, 20a, 20b are formed after forming the band-like mask material layers 28a, 28b. Furthermore, when there is enough room in Y direction, the band-like mask material layers 27a, 27b, 28a, 28b may be directly formed by lithography and RIE etching method after entirely forming a mask material layer, without using this method. Also, when there is enough room in X direction, the band-like mask material layers 8a, 16a, 16b, 20a, 20b or the band-like mask material layers 9a, 17a, 17b, 21a, 21b may be directly formed by lithography and RIE etching method after entirely forming a mask material layer, without using this method. Band-like SiN material layers 8a, 16a, 16b, 20a, 20b extended in Y direction may be formed by using SADP (Self Aligned Double Patterning, see, for example, A. Raley, S. Thibaut, N. Mohanty, K. Subhadeep, S. Nakamura, et al.: "Self-aligned quadruple patterning integration using spacer on spacer pitch splitting at the resist level for sub-32 nm pitch applications," Proc. Of SPIE Vol. 9782, 2016), or SAQP (Self Aligned Quadruple Patterning, see, for example, A. Raley, S. Thibaut, N. Mohanty, K. Subhadeep, S. Nakamura, et al.: "Self-aligned quadruple patterning integration using spacer on spacer pitch splitting at the resist level for sub-32 nm pitch applications," Proc. Of SPIE Vol. 9782, 2016) which does not use band-like mask material layers 9a, 17a, 17b, 21a, 21b. Similarly, band-like SiGe layers 12aa, 12ab, 18a, 18b, and band-like mask material layers 28a, 28b may be formed by using SADP or SAQP.

Furthermore, as described in FIGS. 1VA to 1WC, areas for forming the contact holes 47a, 47b are prepared by removing Si pillars 6b, 6i after forming the Si pillars 6b, 6i. On the other hand, the areas for forming the contact holes 47a, 47b may be prepared by removing square-shaped mask material layers 17aa, 17bb and square-shaped SiN material layers 16aa, 16bb after forming the square-shaped mask material layers 21aa, 21ab, 21ba, 21bb, 17aa, 17ab, 17ba, 17bb, 9aa, 9ba and the square-shaped SiN material layers 20aa, 20ab, 20ba, 20bb, 16aa, 16ab, 16ba, 16bb, 8aa, 8ab in FIGS. 1TA to 1TC. Also, the areas for forming the contact holes 47a, 47b may be prepared by removing mask material layers 7b, 7i after forming the mask material layers 7a, 7b, 7c, 7d, 7e, 7f, 7g, 7h, 7i, 7j in FIGS. 1UA to 1UC. As mentioned above, there may be several methods other than those described in this embodiment. The areas for forming the contact holes 47a, 47b may be prepared by any method other than those methods.

Furthermore, as shown in FIGS. 1YYA to 1YYC, under Si pillars 6a to 6e, N⁺ layers 3a to 3d and P⁺ layers 4a, 4d to be a source or a drain for SGTs are formed to be linked on Si pillar bases 5a, 5b. On the other hand, the N⁺ layers 3a to 3d and the P⁺ layers 4a, 4b may be at the bottom of the Si pillars 6a to 6e, and the N⁺ layers 3a, 3b and the P⁺ layer 4a may be linked via a metal layer or a metal alloy layer between them. Also, the N⁺ layers 3a to 3d and the P⁺ layers 4a, 4b may be formed to be connected to bottom side surfaces of the Si pillars 6a to 6e. As mentioned above, the N⁺ layers 3a, 3b and the P⁺ layer 4a to be a source or a drain for SGTs may be formed inside the bottom of Si pillars or on the periphery of the Si pillars in contact with outside of their side surfaces. Then, each of them may be electrically linked via other conductor materials.

According to the manufacturing method of the first embodiment, following eight features are provided.

Feature 1

In this embodiment, as shown in FIGS. 1WA to 1WC, the formed Si pillars 6b, 6i are removed. Then, in planar view, a contact hole 47a for forming the connection line metal layer C1 connecting the N$^+$ layer 3a, the P$^+$ layer 4a, and the gate TiN layer 40c is formed in an area from which the Si pillar 6b has been removed. Similarly, a contact hole 47b for connecting the N$^+$ layer 3d, the P$^+$ layer 4b, the gate TiN layer 40b and the connection line metal layer C2 is formed in an area from which the Si pillar 6i has been removed. This makes it possible to form areas for forming contact holes C1, C2, with reducing, in X direction, a distance between the Si pillars 6c, 6d, 6e to which the gate TiN layer 40b is linked and between the Si pillars 6f, 6g, 6h to which the gate TiN layer 40c is linked as short as possible. Thus, a length of SRAM cell in X direction can be reduced. Then, a length of SRAM cell in Y direction can be reduced, due to the fact that the contact holes C1, C2 can be formed in each area between Si pillars 6a and 6c and between Si pillars 6h and 6j in planar view. Thus, high integration of SRAM cell can be provided.

Feature 2

In SRAM cell using conventional SGTs, in planar view, no Si pillar is formed on an extension in Y direction of a contact hole, the contact hole linking an N$^+$ layer and a P$^+$ layer linked to the bottom of Si pillars (see, for example, C. Y. Ting, V. J. Vivalda, and H. G. Schaefer: "Study of planarized sputter-deposited SiO$_2$," J. Vac. Sci. Technol. 15(3), p.p. 1105-1112, May/June (1978)). On the other hand, in this embodiment, in one SRAM cell region, Si pillar 6g is present on an extension of the contact hole 47a in Y direction, and Si pillar 6d is also present on an extension of the contact hole 47b in Y direction. Thus, a length of the SRAM cell in X direction can be reduced. This leads to high integration of SRAM cell.

Feature 3

In this embodiment, as shown in FIGS. 1ZA to 1ZC, each of gate TiN layers 40b, 40c respectively linked to the periphery of Si pillars 6c, 6d, 6e and Si pillars 6f, 6g, 6h contacts at entire side surface of the gate portion between the Si pillars 6c, 6d and 6e, and between the Si pillars 6f, 6g and 6h. On the other hand, gate TiN layers 40a, 40d of Si pillars 6a, 6j are formed independently. The fact that each of the gate TiN layers 40b, 40c contacts at entire side surface of the gate portion between Si pillars 7c, 7d and 7e and between Si pillars 7f, 7g and 7h indicates that it is possible to reduce a distance between Si pillars 6c, 6d and 6e and between Si pillars 6f, 6g and 6h to such a length corresponding to twice of a sum of a thickness of a gate HfO$_2$ layer 35 and a thickness of gate TiN layers 40b, 40c. Then, as shown in FIGS. 1WA to 1WC, by removing Si pillars 6b, 6i, gate TiN layers 40a, 40d can be formed to be separated from the gate TiN layers 40b, 40c. This can be done by forming Si pillars 6a to 6j at high density in planar view, followed by removing Si pillars 7b, 7i to form areas having no Si pillar in planar view. Thus, contact holes 47a, 47b can be formed on the areas of the removed Si pillars 6b, 6i in planar view. Thus, SRAM cell can be provided at high density.

Feature 4

In this embodiment, as shown in FIGS. 1VA to 1VC, ten Si pillars 6a to 6j are formed in one SRAM cell area. In these pillars, lithography is only used to form band-like SiN layer 8a for forming Si pillars 6c, 6h in a row in X direction. ALD method is used to form band-like SiGe layers 12aa, 12ab, 18a, 18b and band-like SiN layer 16a, 16b, 20a, 20b for forming other eight Si pillars (6a to 6j excluding 6c, 6h) and lithography is not used. In ALD method, a material layer can be deposited in each monoatomic or monomolecular layer in controlled manner. Thus, a thickness of band-like SiGe layers 12aa, 12ab, 18a, 18b and band-like SiN layers 16a, 16b, 20a, 20b in planar view can be thin with high precision, depending on design requirement. This makes it possible to reduce distances between Si pillars 7a to 7j and diameters of Si pillars 7a to 7j with high precision, without constraints of lithography. Thus, high integration of SRAM cell can be provided.

Feature 5

Similarly, as shown in FIGS. 1KA to 1LC, band-like SiN layers 16a, 16b are formed by ALD method, and on the band-like SiN layers 16a, 16b, band-like mask material layers 17a, 17b, having a shape in which the shape of top part of the band-like SiN layers 16a, 16b remains as it is, are formed. By etching the SiN layers 16A, 16B using the band-like mask material layers 17a, 17b as a mask, it is inhibited that side surfaces of the SiN layers 16A, 16B are etched during RIE etching, which otherwise leads to variation in working dimension in planar view, and thus diameters of the Si pillars 7a to 7j in planar view can be reduced with high precision, without constraints of lithography. This makes it possible to design cells without limitation for high integration of cells due to lithography. Thus, high precision and high integration of SRAM cell can be provided.

Feature 6

As high integration of cell proceeds, it is required that both diameters of Si pillars 6a to 6j in planar view and distances between the Si pillars 6a to 6j are made to be high precision and high density. For this purpose, in this embodiment, as shown in FIGS. 1DA to 1OC, both band-like SiGe layers 12aa, 12ab, 18a, 18b and band-like SiN layers 16a, 16b, 20a, 20b on each side of band-like SiN layer 8a can be formed with high precision and narrow, in a cross-section in X direction. High precision of the thickness of the band-like SiN layers 16a, 16b, 20a, 20b leads to high precision of the diameter of the Si pillars 6a to 6j. Then, high precision of the thickness of the band-like SiGe layers 12aa, 12ab, 18a, 18b leads to high precision of the distance between the Si pillars 6a to 6j. Thus, high precision and high integration of SRAM cell can be provided.

Feature 7

When SiGe layers 12a, 12b and SiN layers 16A, 16B are etched by RIE method, portions of band-like mask material layers 15a, 15b, 17a, 17b where etching ion is impacted are etched, although the etching rate is low. When the band-like mask material layers 15a, 15b, 17a, 17b have a trapezoidal shape having a bottom side longer than a top side, a portion of the bottom side of the band-like mask material layers 15a, 15b, 17a, 17b is etched during etching. Thus, end positions of mask layer of the band-like mask material layers 15a, 15b, 17a, 17b are changed over etching time in planar view. This makes it difficult to form the band-like SiGe layers 12aa, 12ab and the band-like SiN layers 16a, 16b rectangular in cross-sectional view. On the other hand, in this embodiment, SiGe layers 12a, 12b and SiN layers 16A, 16B having a same thickness in vertical direction are formed on each side of the band-like SiN layer 8a and band-like mask material layer 9a. Then, band-like mask material layers 15a, 15b, 17a, 17b, having a shape in which the shape of the SiGe layers 12a, 12b and the SiN layers 16A, 16B remains as it is, are formed. Thus, band-like mask material layers 15a, 15b, 17a, 17b having a rectangular cross-section are formed. Furthermore, SiGe layers 12a, 12b and SiN layers 16A, 16B are etched with the band-like mask material layers 15a, 15b, 17a, 17b having a rectangular cross-section as a mask to form band-like SiGe layer 12aa, 12ab and band-like SiN layer 16a, 16b having a rectangular cross-section. Thus, high precision and high integration of SRAM cell can be provided.

Feature 8

For example, as shown in FIGS. 1EA to 1IC, in band-like mask material layers 15a, 15b which are an etching mask for band-like SiGe layers 12aa, 12ab, SiGe layer 12 is deposited over band-like SiN layer 8a and band-like mask material layer 9a by ALD method. Then, a $SiO_2$ layer (not shown) is deposited. Then, the $SiO_2$ layer and the SiGe layer 12 are polished by CMP method such that their upper surface position comes to the upper surface position of the band-like mask material layer 9a. Upper rounded parts R1 of SiGe layer 12 are removed by this polishing. By removing the upper rounded part R1, shapes of recesses 14a, 14b are formed so as to conform with shapes of side surfaces of the band-like mask material layer 9a and $SiO_2$ layer 13 on each side of SiGe layer 12a, 12b, and to conform with shapes of band-like SiGe layers 12a, 12b having equal width in vertical direction. Thus, cross-sectional shapes of the recesses 14a, 14b are formed in substantially rectangular. Thus, overall cross-sectional shapes of band-like mask material layers 15a, 15b are made to be substantially rectangular with their width remaining equal in vertical direction. This indicate that band-like SiGe layers 12aa, 12ab, which are formed by etching SiGe layer 12a by RIE method with the band-like mask material layers 15a, 15b as a mask, can be formed with high precision both in planar view and cross-sectional view. Similarly, band-like SiN layers 16a, 16b, 20a, 20b and band-like SiGe layers 18a, 18b can be formed with high precision.

Second Embodiment

Hereinafter, a manufacturing method for a SRAM circuit having SGTs according to the second embodiment of the present invention is described with reference to FIGS. 2AA to 2FC. In the figures, figures suffixed with A are plan views, figures suffixed with B are cross-sectional structural views taken along lines X-X' in the corresponding figures suffixed with A, and figures suffixed with C are cross-sectional structural views taken along lines Y-Y' in the corresponding figures suffixed with A.

Figure 2A:
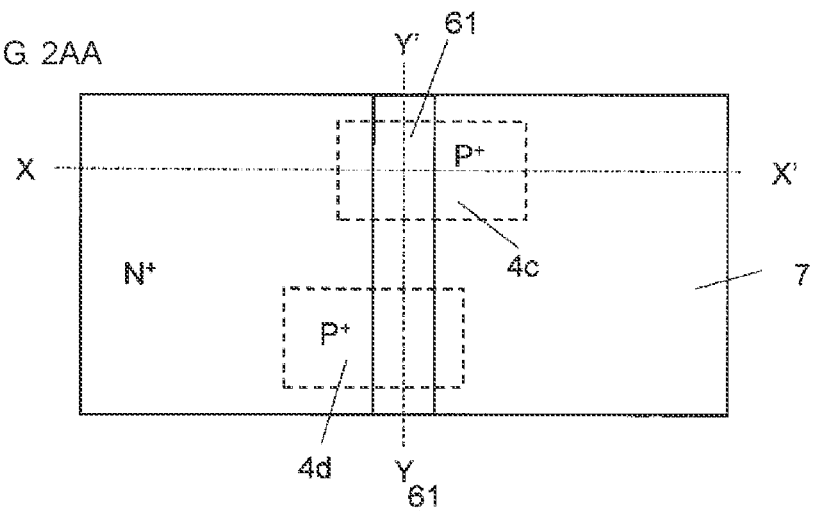
FIG. 2AA and FIGS. 2AB and 2AC are respectively a plane view and cross-sectional structural views for describing a manufacturing method of a pillar-shaped semiconductor device having SGTs according to the second embodiment of the present invention.
Figure 2A:
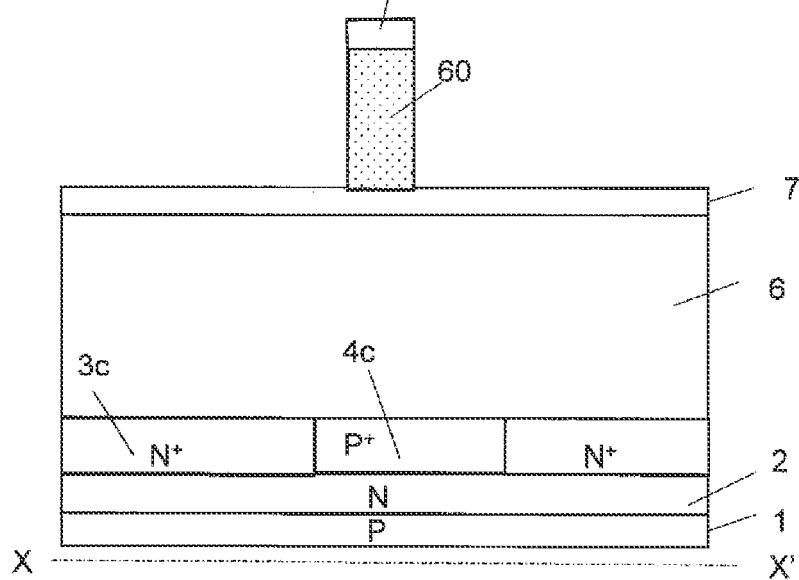
Figure 2A:
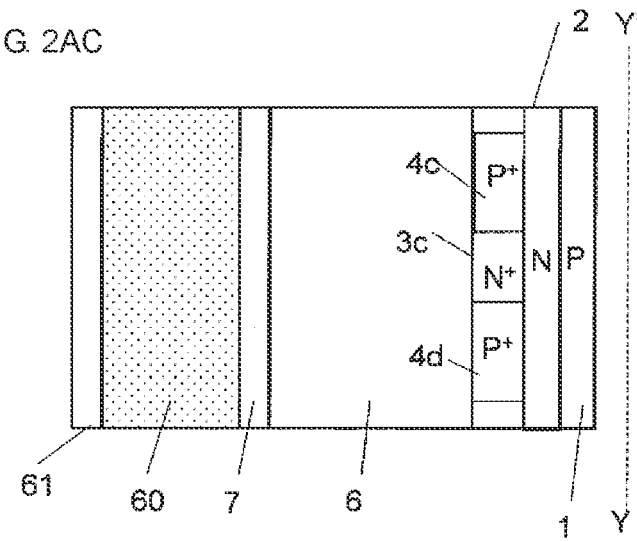

As shown in FIGS. 2AA to 2AC, at first, a band-like SiGe layer 60 is formed with a band-like mask material layer 61 as an etching mask, instead of a band-like SiN layer 8a and a mask material layer 9a shown in FIGS. 1CA to 1CC.

Figure 2B:
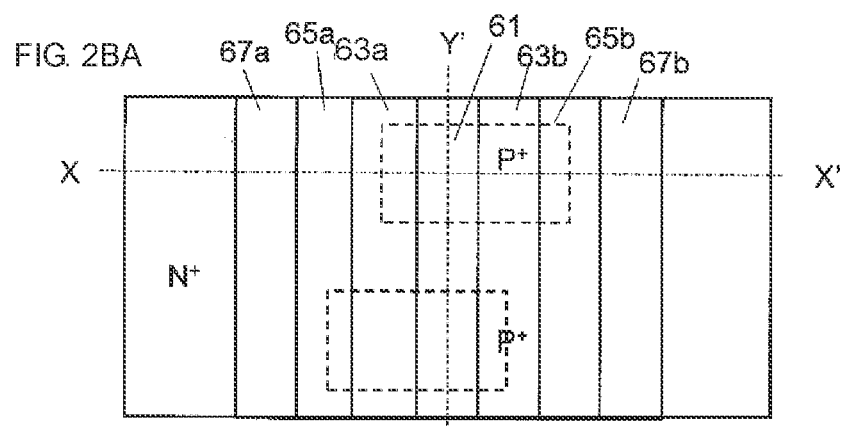
FIG. 2BA and FIGS. 2BB and 2BC are respectively a plane view and cross-sectional structural views for describing a manufacturing method of a pillar-shaped semiconductor device having SGTs according to the second embodiment of the present invention.
Figure 2B:
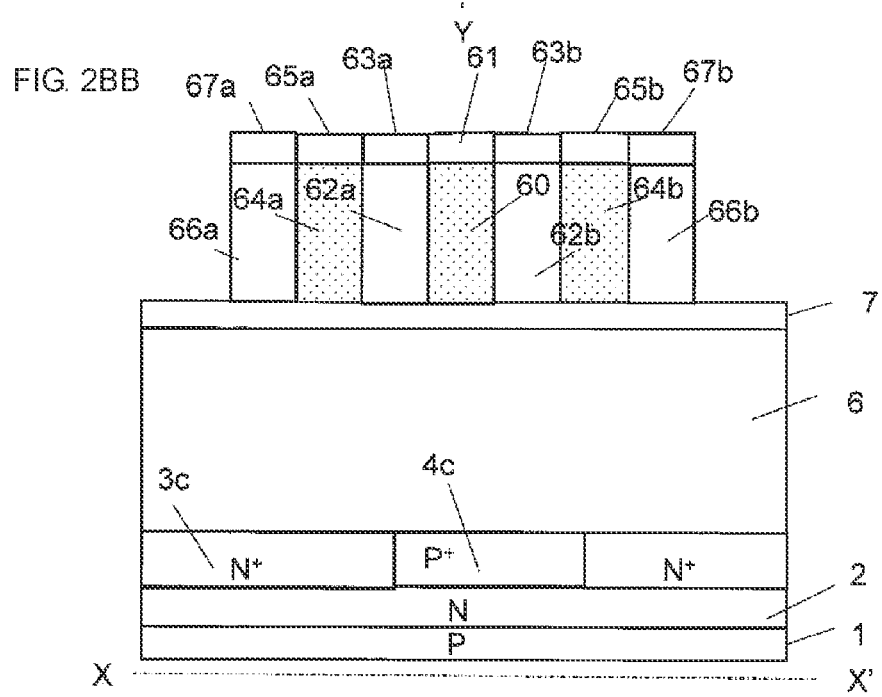
Figure 2B:
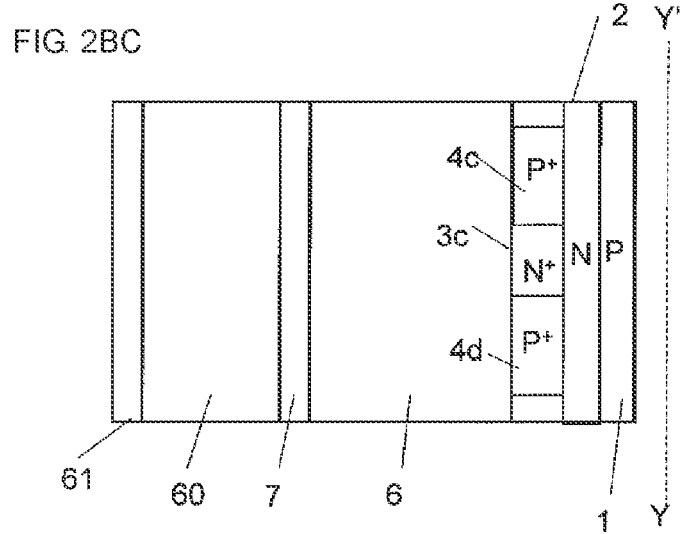

Then, processes similar to those shown in FIGS. 1DA to 1MC are performed. Thus, as shown in FIGS. 2BA to 2BC, on each side of the band-like SiGe layer 60 having the band-like mask material layer 61 on its top, band-like SiN layers 62a, 62b having band-like mask material layers 63a, 63b of equal width on their top are formed. Then, on each side of the band-like SiN layers 62a, 62b, band-like SiGe layers 64a, 64b having band-like mask material layers 65a, 65b of equal width on their top are formed. Then, on each side of the band-like SiGe layers 64a, 64b, band-like SiN layers 66a, 66b having band-like mask material layers 67a, 67b of equal width on their top are formed.

Figure 2C:
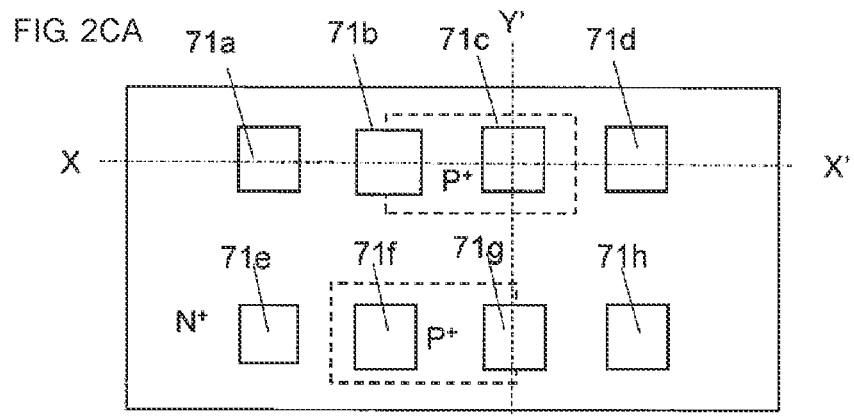
FIG. 2CA and FIGS. 2CB and 2CC are respectively a plane view and cross-sectional structural views for describing a manufacturing method of a pillar-shaped semiconductor device having SGTs according to the second embodiment of the present invention.
Figure 2C:
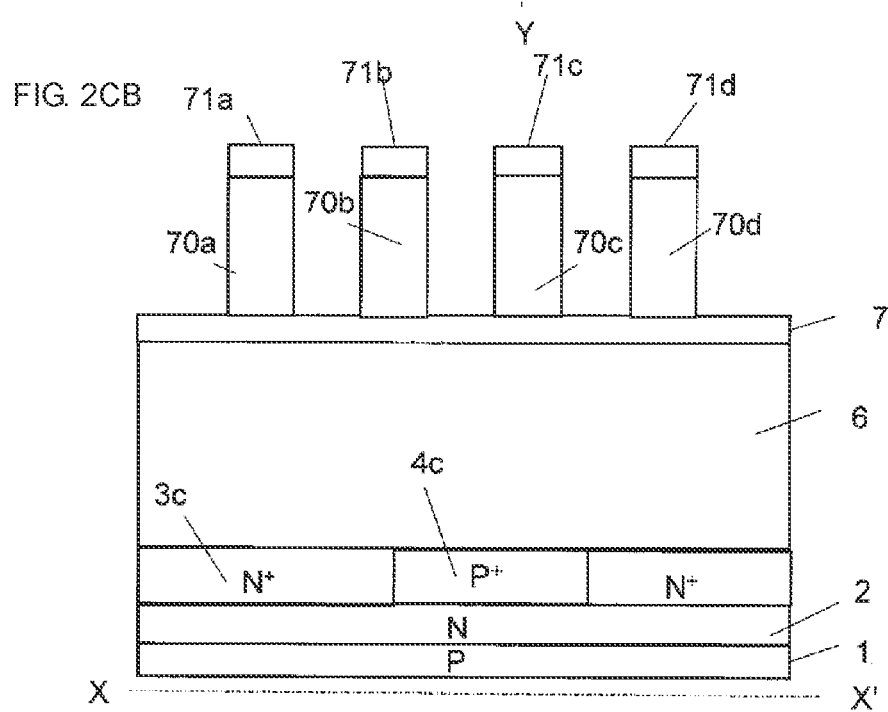
Figure 2C:
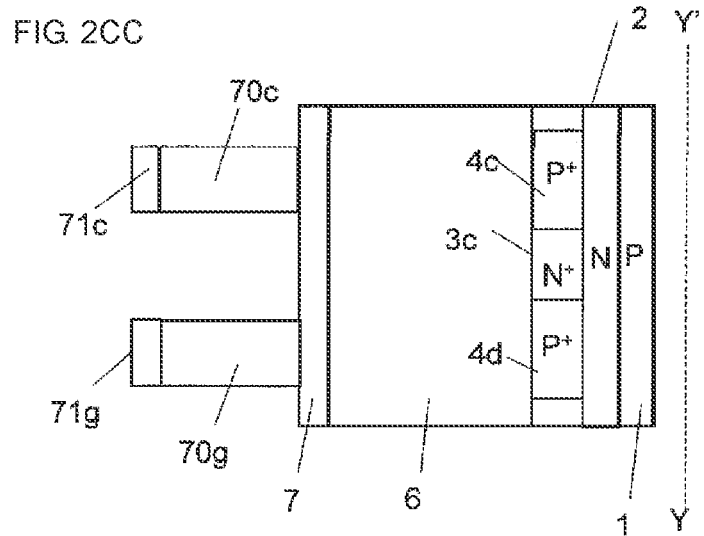

Then, processes similar to those shown in FIGS. 1NA to 1TC are performed. Thus, as shown FIGS. 2CA to 2CC, in planar view, square-shaped SiN layers 70a, 70b, 70c, 70d, 70e (not shown), 70f (not shown), 70g, 70h (not shown) having square-shaped mask material layers 71a, 71b, 71c, 71d, 71e, 71f, 71g, 71h on their top are formed on a mask material layer 7.

Then, same processes as shown in FIGS. 1UA to 1VC are performed. Thus, as shown in FIGS. 2DA to 2DC, Si pillars 73a, 73b, 73c, 73d, 73e (not shown), 73f (not shown), 73g, 73h (not shown) having mask material layers 72a, 72b, 72c, 72d, 72e, 72f, 72g, 72h on their top are formed on $N^+$ layer 3c and $P^+$ layers 4c, 4d.

Figure 2E:
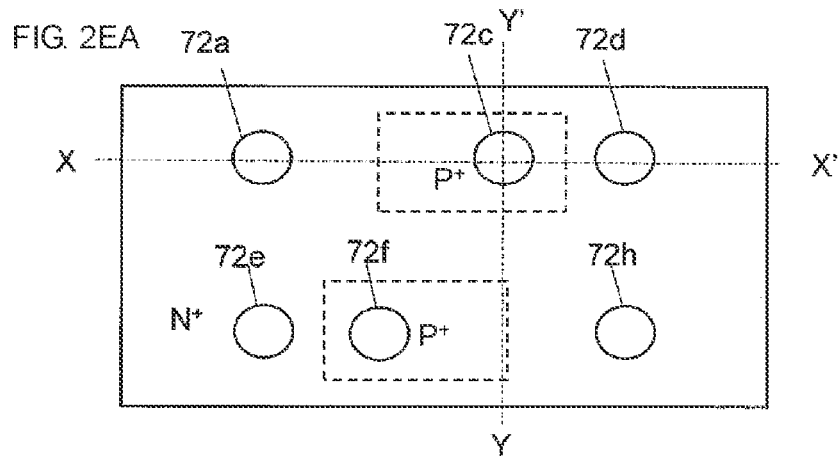
FIG. 2EA and FIGS. 2EB and 2EC are respectively a plane view and cross-sectional structural views for describing a manufacturing method of a pillar-shaped semiconductor device having SGTs according to the second embodiment of the present invention.
Figure 2E:
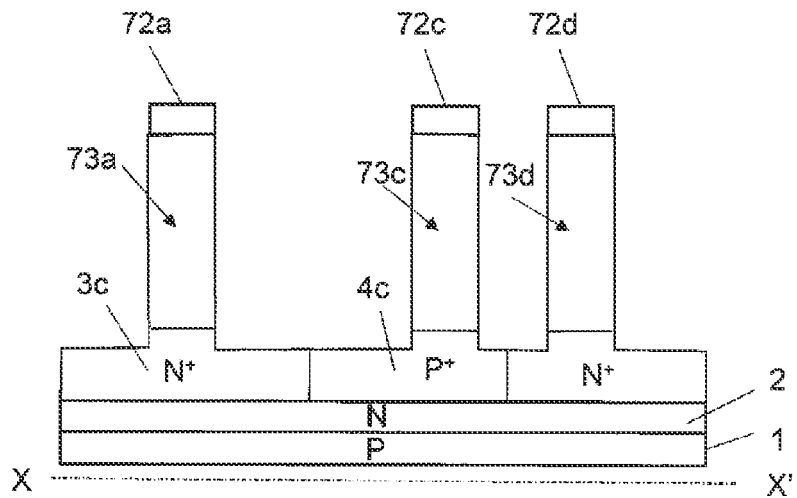
Figure 2E:
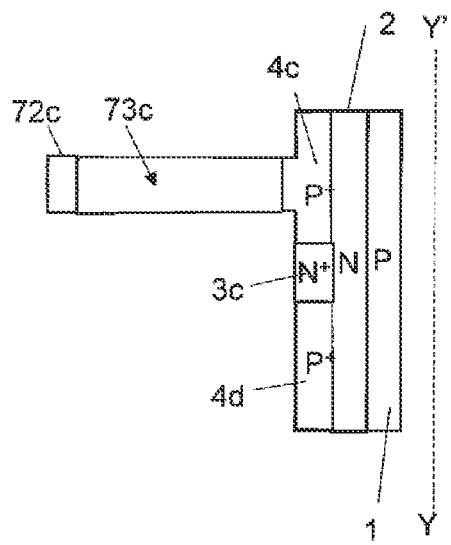

Then, as shown in FIGS. 2EA to 2EC, mask material layers 72b, 72g and Si pillars 73b, 73g are removed.

Figure 2F:
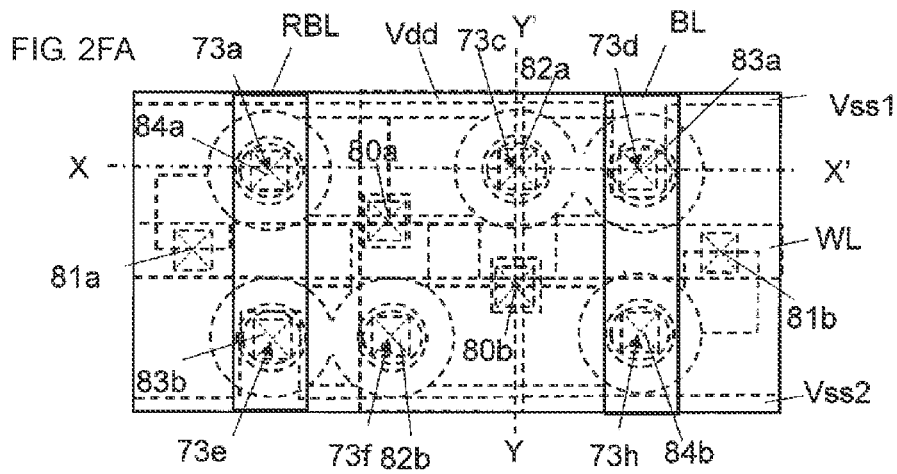
FIG. 2FA and FIGS. 2FB and 2FC are respectively a plane view and cross-sectional structural views for describing a manufacturing method of a pillar-shaped semiconductor device having SGTs according to the second embodiment of the present invention.
Figure 2F:
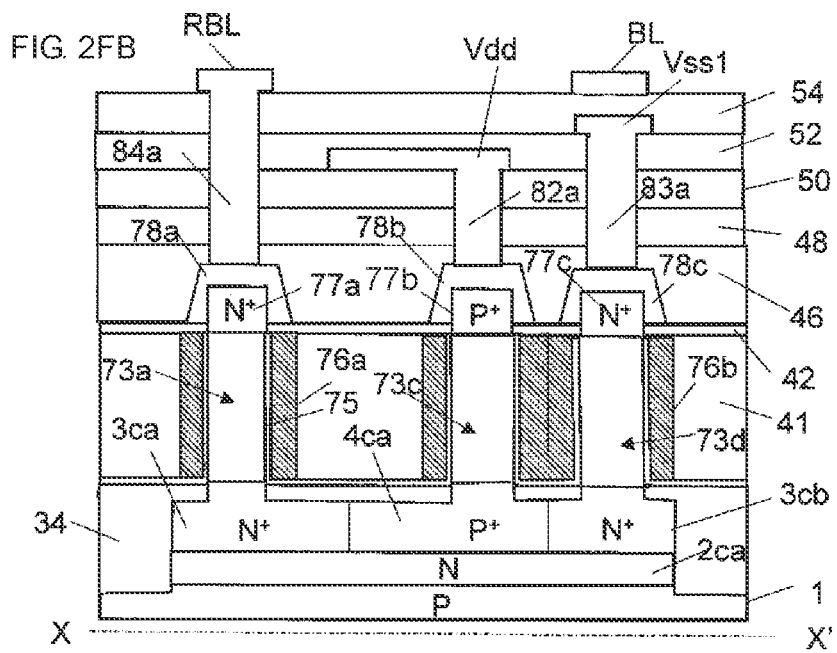
Figure 2F:
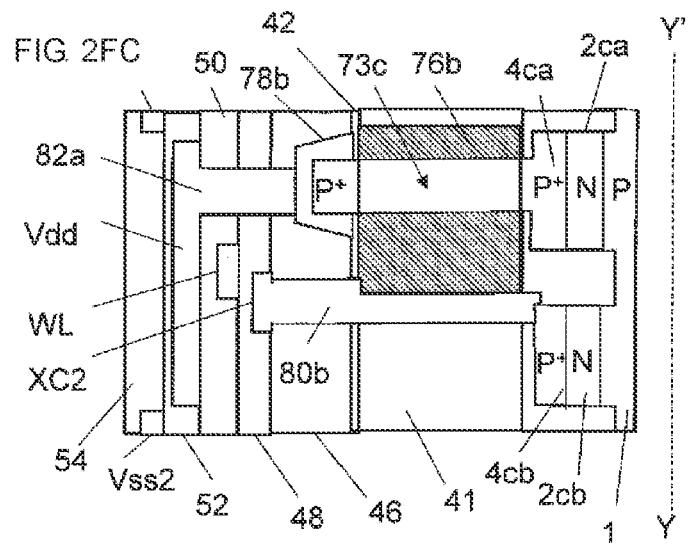

Then, same processes as shown in FIGS. 1ZA to 1YYC are performed. Thus, as shown in FIGS. 2FA to 2FC, N layer 2ca, $N^+$ layers 3ca, 3cb and $P^+$ layer 4ca are formed under Si pillars 73a, 73c, 73d. Similarly, N layer 2cb, $N^+$ layers 3da (not shown), 3db (not shown) and $P^+$ layer 4cb are formed under Si pillars 73e, 73f, 73h. Then, a $HfO_2$ layer 75, which is a gate insulating layer, is formed surrounding the Si pillars 73a to 73h. Then, gate TiN layers 76a, 76b, 76c (not shown), 76d (not shown) are formed surrounding the $HfO_2$ layer 75. Then, $N^+$ layers 78a, 78c, 78d (not shown), 78f (not shown) are formed on the top of the Si pillars 73a, 73d, 73e, 73h, and $N^+$ layers 77a, 77c, 77d (not shown), 77e (not shown) are formed on the top of the Si pillars 73a, 73d, 73e, 73h. Also, $P^+$ layers 78b, 78e (not shown) are formed on the top of the Si pillars 73c, 73f, and $P^+$ layers 77b, 77e (not shown) are formed on the top. Then, the $N^+$ layer 3ca, the $P^+$ layer 4ca, and the gate TiN layer 76c are connected by a metal layer (not shown) via a contact hole 80a formed on the interface between the $N^+$ layer 3ca and the $P^+$ layer 4ca and on the gate TiN layer 76c. At the same time, the $N^+$ layer 3db, the $P^+$ layer 4cb, and the gate TiN layer 76b are connected by a metal layer (not shown) via a contact hole 80b formed on the interface between the $N^+$ layer 3db and the $P^+$ layer 4cb and on the gate TiN layer 76b. Then, the gate TiN layers 76a, 76d and a word line metal layer WL are connected via a contact hole 81a formed on the gate TiN layer 76a and a contact hole 81b formed on the gate TiN layer 76d. Then, the $P^+$ layers 78b, 78e and a supply line metal layer Vdd are connected via contact holes 82a, 82b formed on the $P^+$ layers 78b, 78e. Then, the $N^+$ layer 78c and a ground line metal layer Vss1 are connected via a contact hole 83a. At the same time, the $N^+$ layer 78d and a ground line metal layer Vss2 are connected via a contact hole 83b. Then, the $N^+$ layer 78a and a reverse bit line metal layer RBL are connected via a contact hole 84a. At the same time, the $N^+$ layer 78f and a bit line metal layer BL are connected via a contact hole 84b. Thus, a SRAM cell consisting of six SGTs is formed on a P layer substrate 1.

According to the manufacturing method of this embodiment, following features are provided.

Feature 1

In the first embodiment, a SRAM cell consisting of eight SGTs is formed using five band-like SiN layers 8a, 16a, 16b, 20a, 20b formed on a mask material layer 7 as shown in FIGS. 1MA to 1MC. On the other hand, in this embodiment, a SRAM cell consisting of six SGTs can be formed using four band-like SiN layers 62a, 62b, 66a, 66b as shown in FIGS. 2BA to 2BC. This makes it possible to simplify the processes.

Feature 2

In this embodiment, similar to the first embodiment, each of gate TiN layers 76b, 76c, which are respectively linked to periphery of Si pillars 73c, 73d and Si pillars 73e, 73f, contacts at entire side surface of the gate portion between the Si pillar 73c and 73d and between the Si pillars 73e and 73f. On the other hand, gate TiN layers 76a, 76d are formed independently at the Si pillars 73a, 73h. Thus, the fact that each of the gate TiN layers 76b, 76c contacts at entire side surface between the Si pillars 73c and 73d and between Si pillars 73e and 73f indicates that it is possible to reduce a distance between Si pillars 73c and 73d and between Si pillars 73e and 73f to such a length corresponding to twice of a sum of a thickness of gate $HfO_2$ layer 75 and a thickness of gate TiN layers 76b, 76c. Thus, high integration of SRAM cell can be provided.

Feature 3

By changing a width of the band-like SiGe layer 60 in planar view, it is possible to optimize a distance between Si pillars 73a and 73c, and a distance between Si pillars 73f and 73h for forming contact holes 80a, 80b, shown in FIGS. 2FA to 2FC. When there is enough room in areas for forming contact holes 80a, 80b, the width of the band-like SiGe layer 60 is made to be narrower. Also, when there is no enough room in areas for forming contact holes 80a, 80b, the width of the band-like SiGe layer 60 is made to be wider. Thus, by changing a width of the band-like SiGe layer 60 depending on difficulties for forming contact holes 80a, 80b, optimal high integration of SRAM cell can be provided.

Third Embodiment

Hereinafter, a manufacturing method for a SRAM circuit having SGTs according to the third embodiment of the present invention is described with reference to FIGS. 3AA to 3BC. In the figures, figures suffixed with A are plan views, figures suffixed with B are cross-sectional structural views taken along lines X-X' in the corresponding figures suffixed with A, and figures suffixed with C are cross-sectional structural views taken along lines Y-Y' in the corresponding figures suffixed with A.

Processes of FIGS. 1AA to 1QC are performed. Then, as shown in FIGS. 3AA to 3AC, band-like mask material layers 27a, 28a in an area on a SiN layer 16a in FIGS. 1QA to 1QC are removed in planar view by lithography and RIE etching to form band-like SiN layers 28A, 28B having band-like mask material layers 27A, 27B on their top. At the same time, band-like mask material layers 27b, 28b on a SiN layer 16b are removed in planar view to form band-like SiN layers 28C, 28D (not shown) having band-like mask material layers 27C, 27D on their top.

Figure 3B:
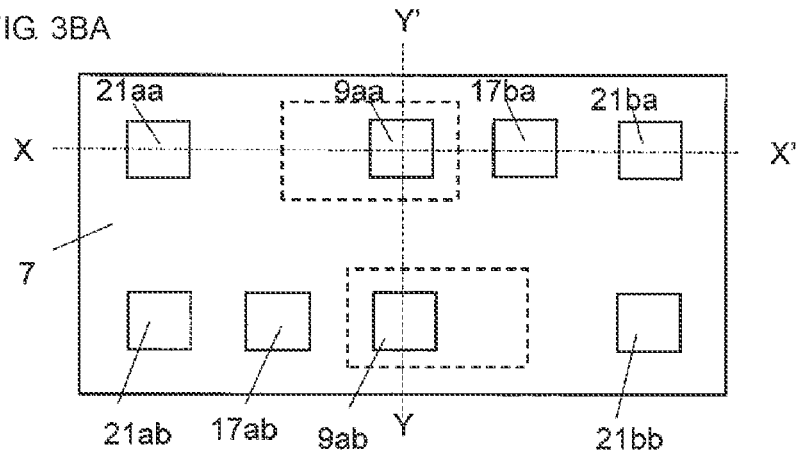
FIG. 3BA and FIGS. 3BB and 3BC are respectively a plane view and cross-sectional structural views for describing a manufacturing method of a pillar-shaped semiconductor device having SGTs according to the third embodiment of the present invention.
Figure 3B:
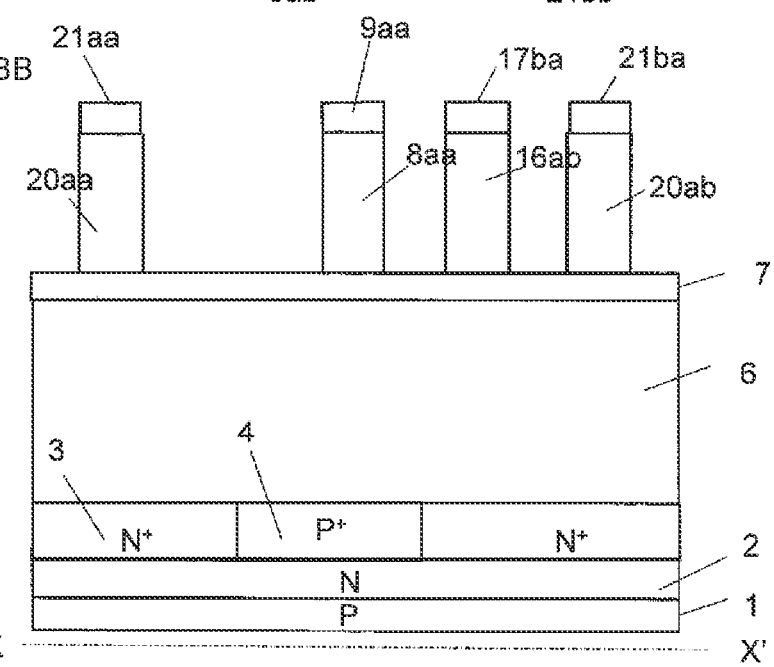
Figure 3B:
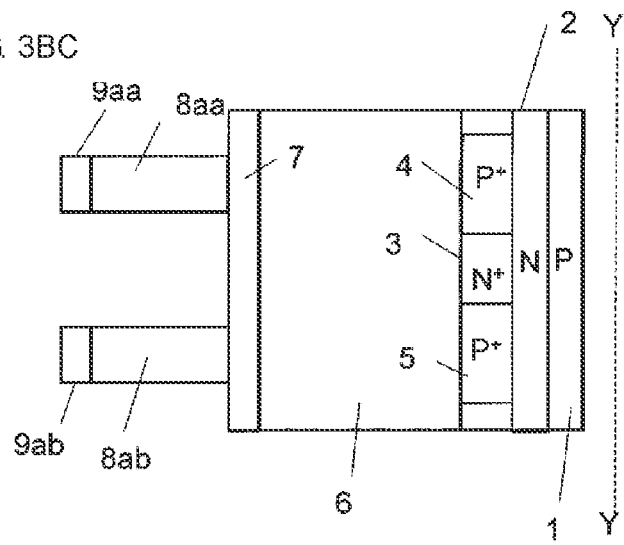

Next, by performing processes shown in FIGS. 1SA to 1TC, square-shaped mask material layers 21aa, 21ba, 21ab, 21bb, 17ba, 17ab, 9aa, 9ab and square-shaped mask material layer 20aa, 20ab, 20ba (not shown), 20bb (not shown), 16ab, 8aa, 8ab are formed on a mask material layer 7 in planar view, as shown in FIGS. 3BA to 3BC. In this case, SiN layers 16aa, 16bb and mask material layers 17aa, 17bb in FIGS. 1SA to 1SC are absent. Then, by performing processes of FIGS. 1XA to 1YYC, a SRAM cell having a structure same as that of the first embodiment is formed on a P layer substrate 1.

According to the manufacturing method of this embodiment, following features are provided.

Feature 1

In the first embodiment, Si pillars 6b, 6i and mask material layers 7b, 7i are removed after the Si pillars 6b, 6i and mask material layers 7b, 7i are formed. In such a case, the Si pillars 6b, 6i having a height in vertical direction must be removed by etching in controlled manner such that the end point of the etching comes to a position same as the bottom position of other Si pillars 6a, 6c, 6d, 6e, 6f, 6h, 6j. On the other hand, in this embodiment, only mask material layers 27a, 27b, 28a, 28b on the upper most surface shown in FIGS. 1QA to 1QC of the first embodiment may be etched. In this case, the end point of etching is a mask material layer 7, which is an etching stopper, and thus there is no problem of controllability for the end point of etching, as in the first embodiment.

Feature 2

In the first embodiment, after Si pillars 6a to 6j are formed, the Si pillars 6b, 6i are removed to provide areas for forming contact holes 47a, 47b, as described in FIGS. 1VA to 1WC. On the other hand, after forming square-shaped mask material layers 21aa, 21ab, 21ba, 21bb, 17aa, 17ab, 17ba, 17bb, 9aa, 9ba and square-shaped SiN material layers 20aa, 20ab, 20ba, 20bb, 16aa, 16ab, 16ba, 16bb, 8aa, 8ab in FIGS. 1TA to 1TC, the square-shaped mask material layers 17aa, 17bb and the square-shaped SiN material layers 16aa, 16bb may be removed to provide areas for forming contact holes 47a, 47b. Also, after forming mask material layers 7a, 7b, 7c, 7d, 7e, 7f, 7g, 7h, 7i, 7j in FIGS. 1UA to 1UC, the mask material layers 7b, 7i may be removed to provide areas for forming contact holes 47a, 47b. In contrast to these methods, this embodiment is characterized in that, after forming the band-like mask material layers 27a, 27b, the band-like mask material layers 27a, 27b and the band-like mask material layers 28a, 28b on areas for forming contact holes 47a, 47b are removed by lithography and RIE etching.

Fourth Embodiment

Hereinafter, a manufacturing method for a SRAM circuit using SGTs according to the fourth embodiment of the present invention is described with reference to FIGS. 4AA to 4CC. In the figures, figures suffixed with A are plan views, figures suffixed with B are cross-sectional structural views taken along lines X-X' in the corresponding figures suffixed with A, and figures suffixed with C are cross-sectional structural views taken along lines Y-Y' in the corresponding figures suffixed with A.

After performing a process shown in FIGS. 1AA to 1AC, a SiGe layer (not shown) and a mask material layer (not shown) are entirely formed on a mask material layer 7. Then, as shown in FIGS. 4AA to 4AC, two band-like mask material layers 90a, 90b extended in Y direction in planar view are formed by lithography and RIE etching methods. Then, the SiGe layer is etched by RIE etching with the band-like mask material layers 90a, 90b as a mask to form band-like SiGe layers 91a, 91b extended in Y direction.

Figure 4B:
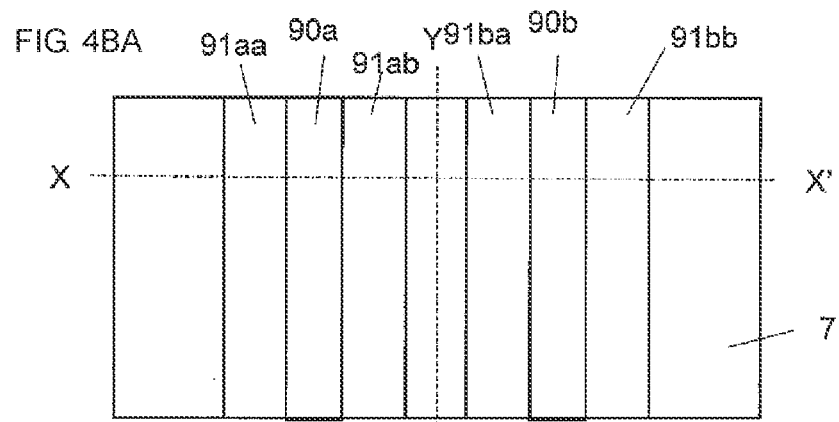
FIG. 4BA and FIGS. 4BB and 4BC are respectively a plane view and cross-sectional structural views for describing a manufacturing method of a pillar-shaped semiconductor device having SGTs according to the fourth embodiment of the present invention.
Figure 4B:
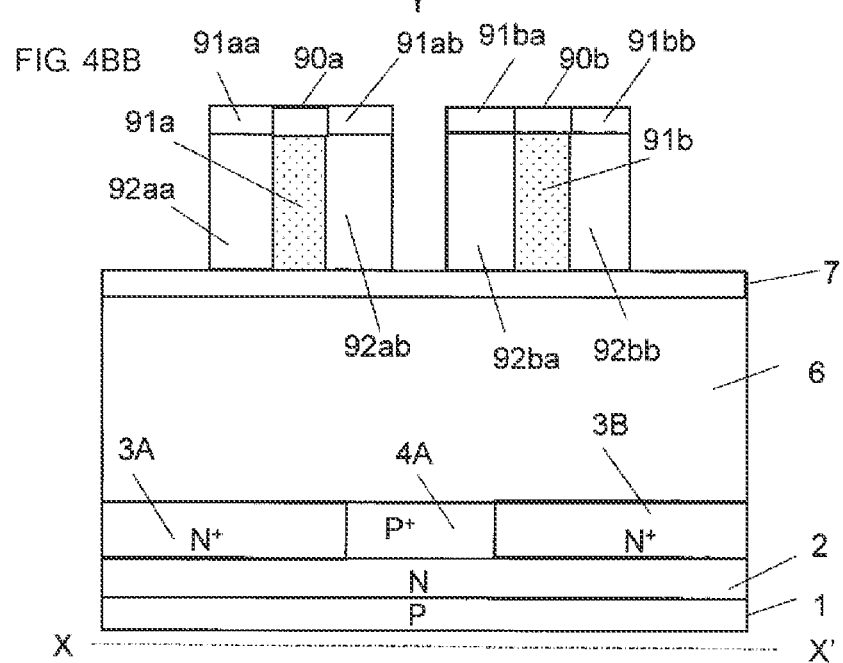
Figure 4B:
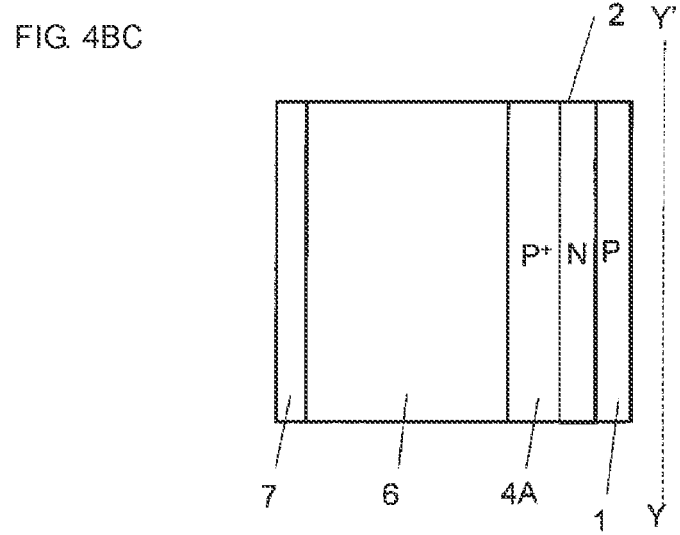

Next, a SiN layer (not shown) is entirely formed by ALD method. Then, processes shown in FIGS. 1DA to 1IC are performed to form band-like mask material layers 91aa, 91ab, 91ba, 91bb formed on each side of the band-like mask material layers 90a, 90b, and band-like SiN layers 92aa, 92ab, 92ba, 92bb under the band-like mask material layers 91aa, 91ab, 91ba, 91bb and in contact with each side surface of the SiGe layers 91a, 91b, as shown in FIGS. 4BA to 4BC. The band-like mask material layers 91ab and the band-like mask material layer 91ba are formed to be separated. Similarly, the band-like SiN layer 92ab and the band-like SiN layer 92ba are formed to be separated.

Figure 4C:
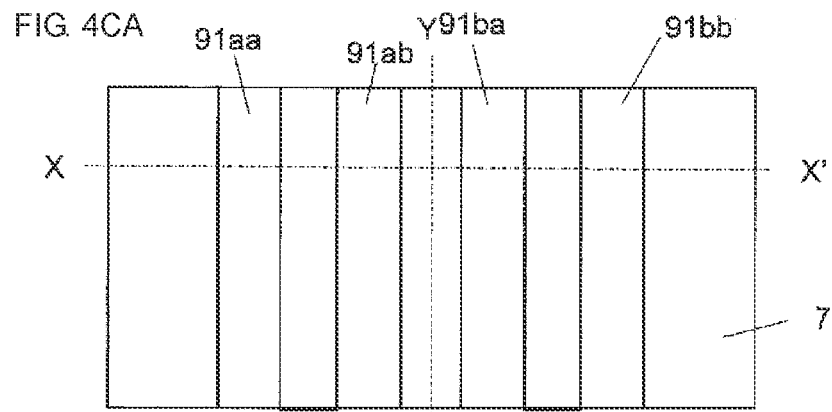
FIG. 4CA and FIGS. 4CB and 4CC are respectively a plane view and cross-sectional structural views for describing a manufacturing method of a pillar-shaped semiconductor device having SGTs according to the fourth embodiment of the present invention.
Figure 4C:
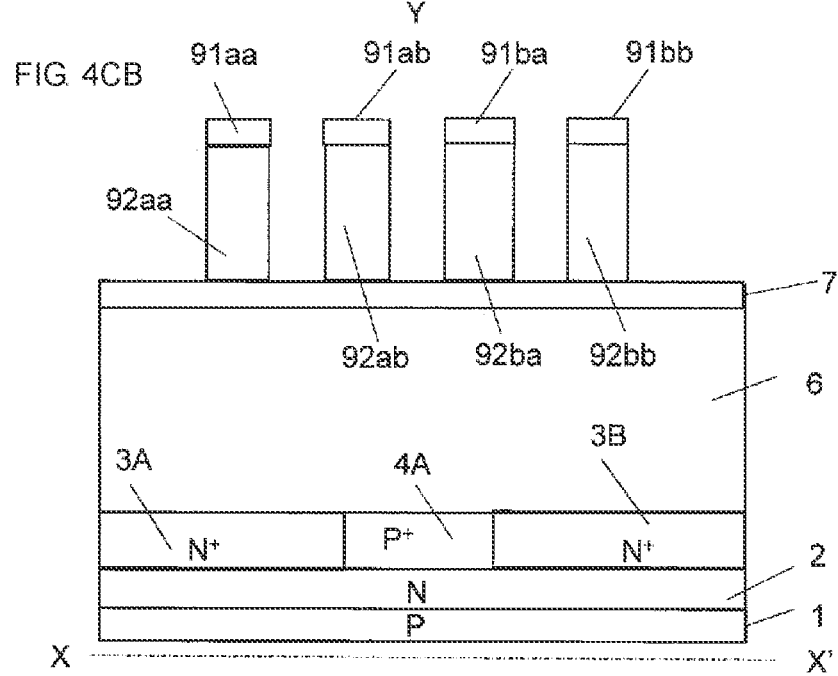
Figure 4C:
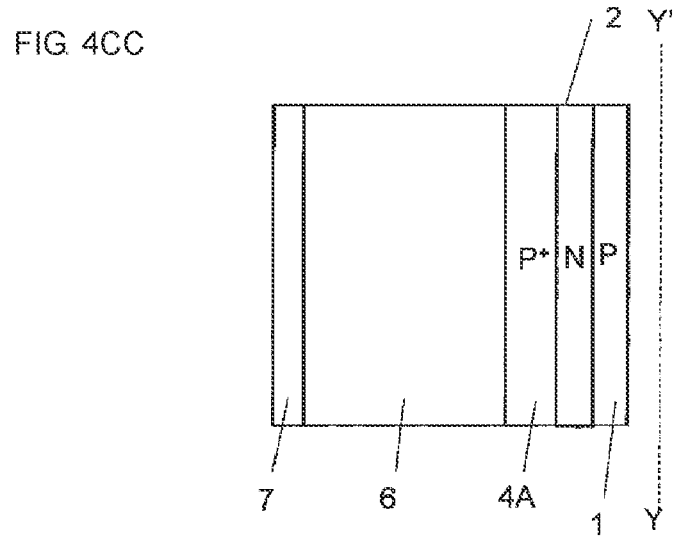

Next, as shown in FIGS. 4CA to 4CC, the band-like mask material layers 90a, 90b and the band-like SiGe layers 91a, 91b are removed. Thus, the band-like mask material layers 91aa, 91ab, 91ba, 91bb and the band-like SiN layers 92aa, 92ab, 92ba, 92bb extended in Y direction in planar view are formed on a mask material layer 7. Then, by performing processes of FIGS. 2CA to 2FC, a SRAM cell consisting of six SGTs same as FIGS. 2FA to 2FC is formed.

According to the manufacturing method of this embodiment, following features are provided.

Feature 1

In the second embodiment, a process for forming band-like pillars is repeated three times on each side of a band-like SiGe layer 60 to form band-like SiN layers 62a, 62b, 66a, 66b and band-like SiGe layers 64a, 64b. On the other hand, in this embodiment, band-like SiN layers 92aa, 92ab, 92ba, 92bb are formed in a single process for forming band-like material layer, on each side of the band-like SiGe layers 91a, 91b simultaneously formed. This makes it possible to simplify the processes.

Feature 2

By making a width between band-like SiN layers 92ab and 92ba different from a width of band-like SiGe layers 91a, 91b in planar view, it is possible to optimize a distance between Si pillars 73a and 73c and a distance between Si pillars 73f and 73h for forming contact holes 80a, 80b, shown in FIGS. 2FA to 2FC. When areas for forming contact holes 80a, 80b have enough room, the width between band-like SiN layers 92ab and 92ba is made to be narrower than the width of the band-like SiGe layers 91a, 91b. Also, when areas for forming contact holes 80a, 80b do not have enough room, the width between band-like SiN layers 92ab and 92ba is made to be wider than the width of the band-like SiGe layers 91a, 91b. Thus, by changing a width between band-like SiN layers 92ab and 92ba depending on difficulties for forming contact holes 80a, 80b, optimal high integration of SRAM cell can be provided.

Fifth Embodiment

Hereinafter, a manufacturing method for a SGT logic circuit according to the fifth embodiment of the present invention is described with reference to FIGS. 5AA to 5EC. In the figures, figures suffixed with A are plan views, figures suffixed with B are cross-sectional structural views taken along lines X-X' in the corresponding figures suffixed with A, and figures suffixed with C are cross-sectional structural views taken along lines Y-Y' in the corresponding figures suffixed with A.

For example, in a microprocessor device, a SRAM circuit and a logic circuit are formed on a same semiconductor chip. In the second embodiment, four band-like SiN layers 62a, 62b, 66a, 66b having band-like mask material layers 63a, 63b, 67a, 67b on their top, extended in Y direction, are formed in a SRAM cell area. Similarly, in the fourth embodiment, four band-like SiN layers 92aa, 92ab, 92ba, 92bb having band-like mask material layers 91aa, 91ab, 91ba, 91bb on their top, extended in Y direction, are formed in a SRAM cell area. At the same time of forming them, band-like SiN layers 95aa, 95ab, 95ba, 95bb having band-like mask material layers 94aa, 94ab, 94ba, 94bb on their top are also formed in a logic circuit area, as shown in FIGS. 5AA to 5AC.

Next, as shown in FIGS. 5BA to 5BC, the band-like mask material layer 94aa and the band-like SiN layer 95aa are removed.

Figure 5C:
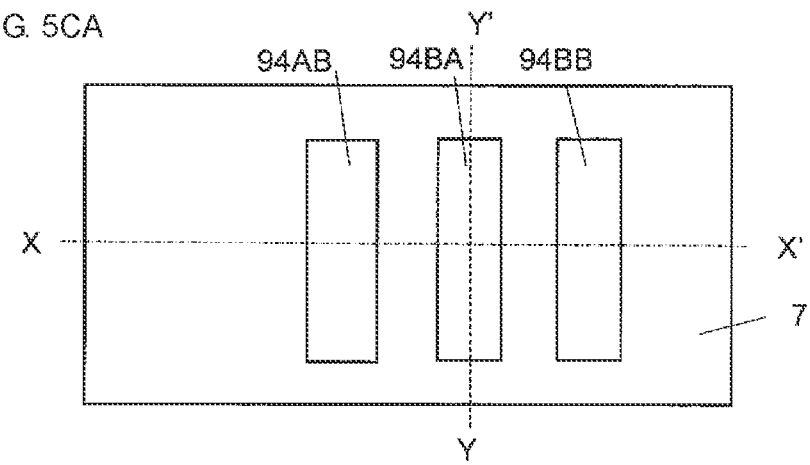
FIG. 5CA and FIGS. 5CB and 5CC are respectively a plane view and cross-sectional structural views for describing a manufacturing method of a pillar-shaped semiconductor device having SGTs according to the fifth embodiment of the present invention.
Figure 5C:
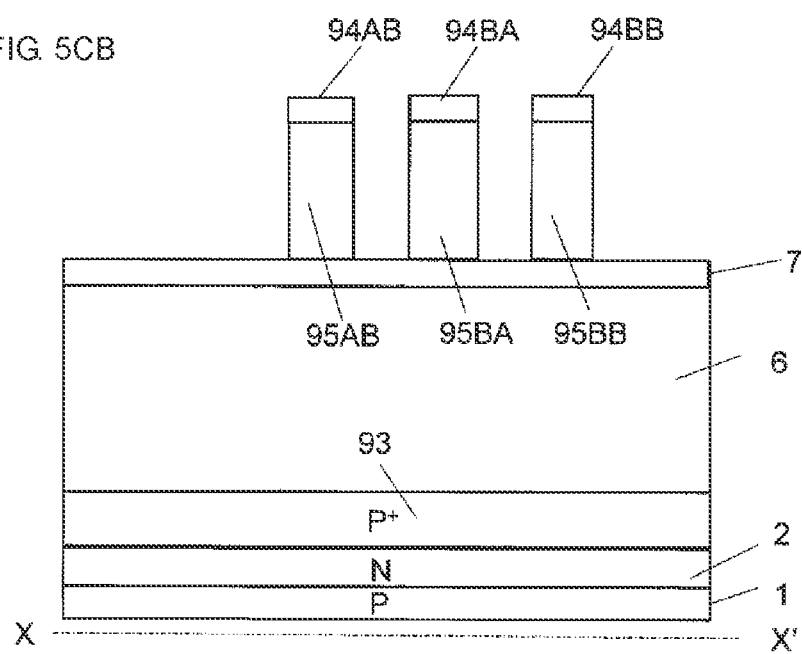
Figure 5C:
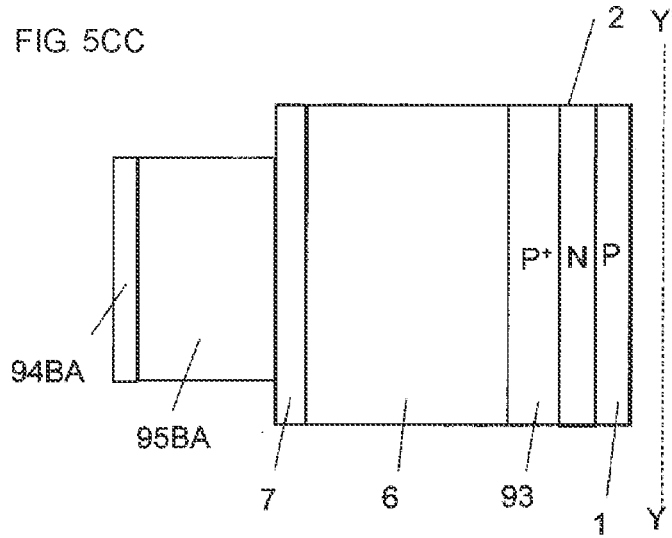

Next, as shown in FIGS. 5CA to 5CC, in planar view, upper and lower portions of the band-like mask material layers 94ab, 94ba, 94bb and the band-like SiN layers 95ab, 95ba, 95bb are removed to form band-like SiN layers 95AB, 95BA, 95BB having band-like mask material layers 94AB, 94BA, 94BB on their top.

Figure 5D:
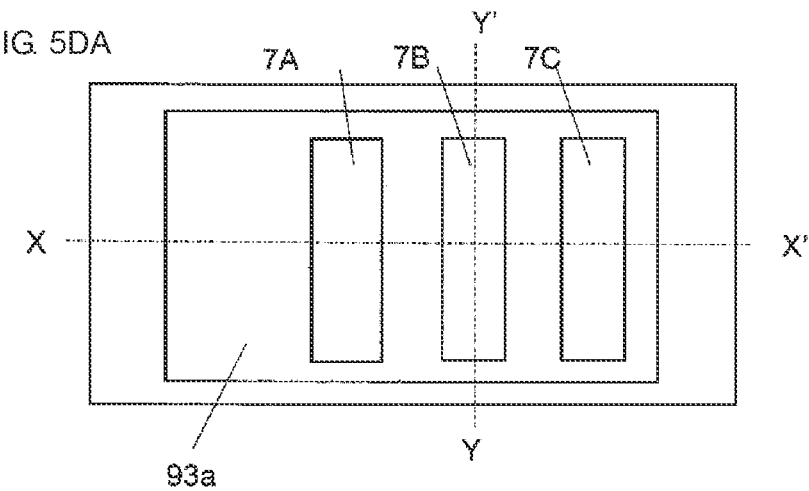
FIG. 5DA and FIGS. 5DB and 5DC are respectively a plane view and cross-sectional structural views for describing a manufacturing method of a pillar-shaped semiconductor device having SGTs according to the fifth embodiment of the present invention.
Figure 5D:
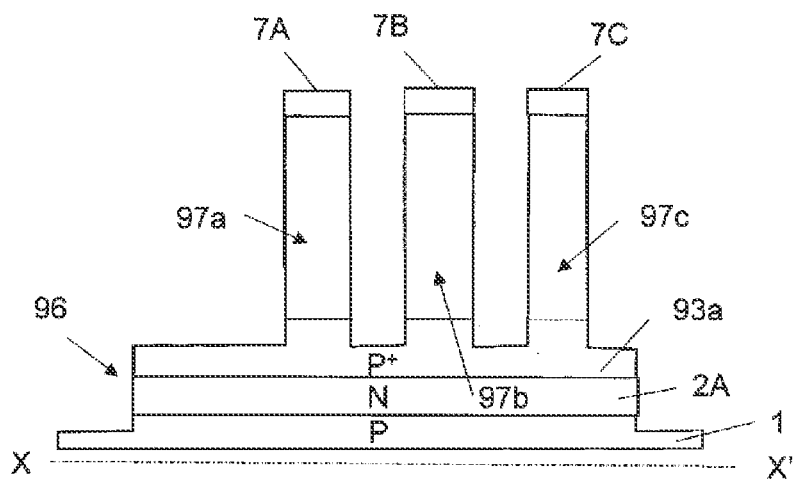
Figure 5D:
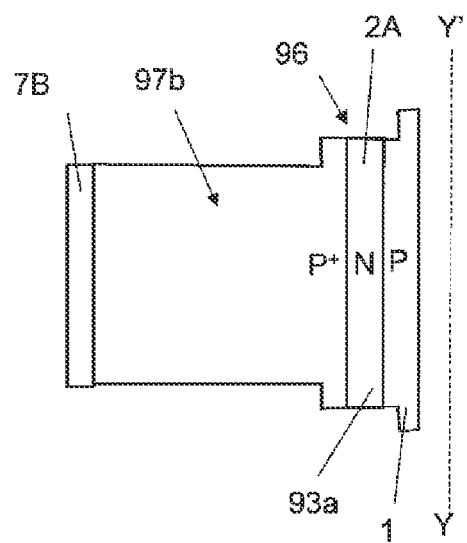

Next, a mask material layer 7 is etched with the band-like mask material layers 94AB, 94BA, 94BB and the band-like SiN layers 95AB, 95BA, 95BB as a mask to form band-like mask material layers 7A, 7B, 7C. Then, as shown in FIGS. 5DA to 5DC, an i layer 6 and an upper portion of a P$^+$ layer 93 are etched with either or all of the band-like mask material layers 94AB, 94BA, 94BB, the band-like SiN layers 95AB, 95BA, 95BB, and the band-like mask material layers 7A, 7B, 7C as a mask to form band-like Si pillars 97a, 97b, 97c. Next, parallel to the processes of the second and the fourth embodiments, a Si pillar base 96 consisting of a P layer substrate 1, an N layer 2A and a P$^+$ layer 93a surrounding the band-like Si pillars 97a, 97b, 97c in planar view is formed on the P layer substrate 1.

Figure 5E:
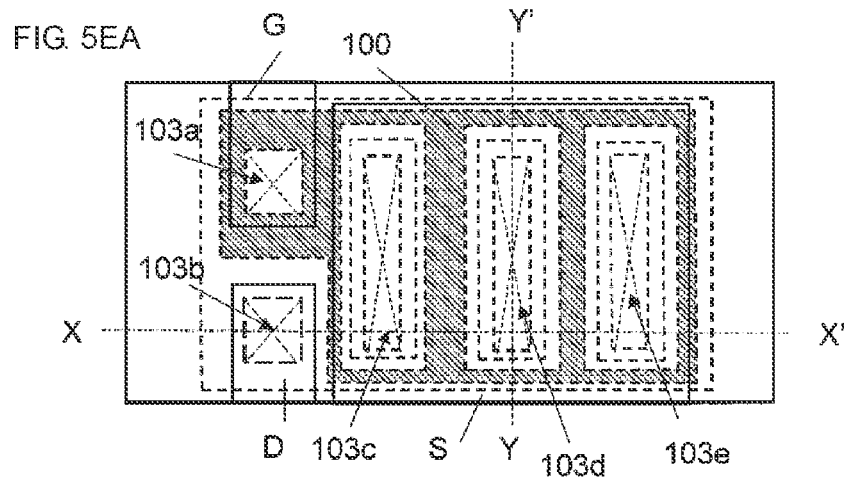
FIG. 5EA and FIGS. 5EB and 5EC are respectively a plane view and cross-sectional structural views for describing a manufacturing method of a pillar-shaped semiconductor device having SGTs according to the fifth embodiment of the present invention.
Figure 5E:
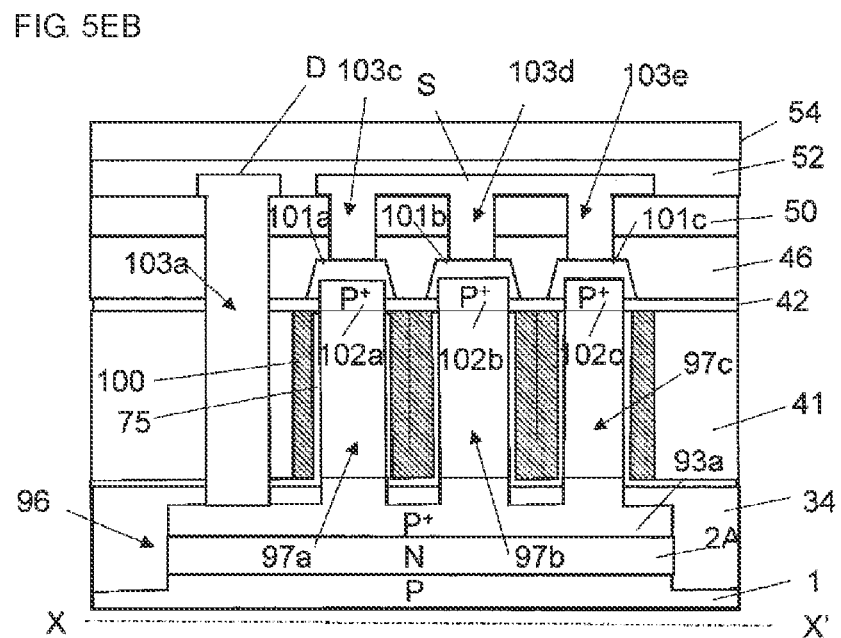
Figure 5E:
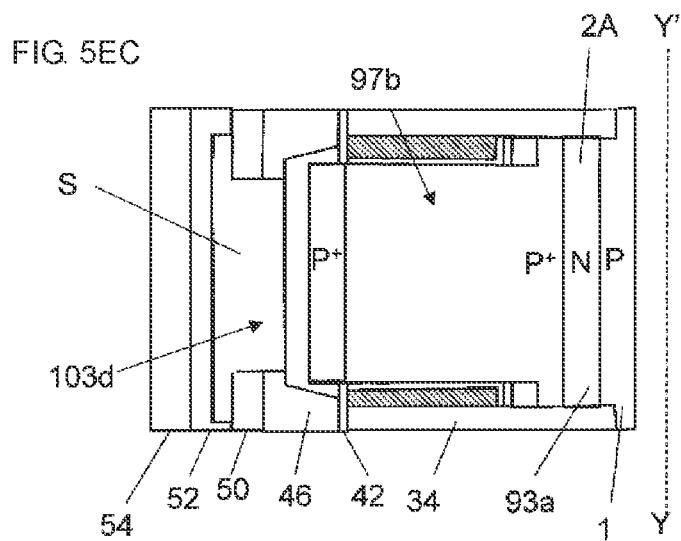

Next, as shown in FIGS. 5EA to 5EC, parallel to the processes of the second and the fourth embodiments, a SiO$_2$ layer 34 surrounding the Si pillar base 96 and the bottom of the band-like Si pillars 97a, 97b, 97c; a gate HfO$_2$ layer 75 surrounding side surfaces of the Si pillars 97a, 97b, 97c; a gate TiN layer 100 surrounding the side surfaces of the gate HfO$_2$ layer 75; a SiO$_2$ layer 41 surrounding the gate TiN layer 100; a SiN layer 42 on the SiO$_2$ layer 41 and surrounding the periphery of the top of the Si pillars 97a, 97b, 97c; P$^+$ layers 102a, 102b, 102c at the top of the Si pillars 97a, 97b, 97c; P$^+$ layers 101a, 101b, 101c on the P$^+$ layers 102a, 102b, 102c; SiO$_2$ layers 46, 50 covering the P$^+$ layers 101a, 101b, 101c; a contact hole 103b linked to an upper surface of the P$^+$ layer 93a from the SiO$_2$ layer 50; a contact hole 103a linked to an upper surface of the gate TiN layer 100 from the SiO$_2$ layer 50; contact holes 103c, 103d, 103e linked to upper surfaces of the P$^+$ layers 101a, 101b, 101c from the SiO$_2$ layer 50; a gate line metal layer G linked to the gate TiN layer 100 via the contact hole 103a; a drain line metal layer D linked to the P$^+$ layer 93a via the contact hole 103b; a source line metal layer S linked to the P$^+$ layers 101a, 101b, 101c via the contact holes 103c, 103d, 103e; and SiO$_2$ layers 52, 54 thereon are formed. Thus, at the same time of forming a SRAM circuit, a circuit in which three SGTs are connected in parallel is formed in a logic circuit area on the same P layer substrate 1. The contact holes 103a, 103b are formed in an area of the removed band-like mask material layer 94aa and the band-like SiN layer 95aa in planar view.

According to the manufacturing method of this embodiment, following features are provided.

Feature 1

In this embodiment, the gate TiN layer 100 of the SGTs formed at the band-like Si pillars 97a, 97b, 97c is formed so as to contact at entire side surface. In this case, when the thickness of the gate TiN layer 100 is made to be thinnest as long as it can function as a gate layer, three SGTs formed at the three band-like Si pillars 97a, 97b, 97c are made to be fine. Then, in order to form the fine three SGTs, the area of the removed band-like mask material layer 94aa and the band-like SiN layer 95aa in planar view is effectively used as an area for forming contact holes 103a, 103b for connecting with the gate line metal layer G and the drain line metal layer D. Thus, a high-density logic SGT circuit can be formed.

Feature 2

Most of processes in this embodiment, including the process for forming the band-like Si pillars 97a, 97b, 97c in the high-density logic circuit, may be the same as the processes described in the second and the fourth embodiments. Thus, a high-density SRAM circuit and a high-density logic circuit can be simultaneously formed on the same P layer substrate 1 in a small number of processes. Here, in the description of this embodiment, the gate HfO$_2$ layer 75 and the gate TiN layer 100 are described using the same material layers as those in the SRAM circuit. On the other hand, in order to optimize operations of the logic circuit and the SRAM circuit, the gate HfO$_2$ layer 75 and the gate TiN layer 100 of the logic circuit may be changed from the SRAM circuit. In view of entire number of processes, increase in number of processes due to this change has little effect on increase in cost.

Feature 3

In the description of this embodiment, four band-like SiN layers 95aa, 95ab, 95ba, 95bb having band-like mask material layers 94aa, 94ab, 94ba, 94bb on their top extended in Y direction are formed in one circuit area, but other four band-like SiN layers having band-like mask material layers on their top also extended in Y direction may be formed in an area adjacent in X direction to the circuit area. Thus, new circuit area consisting of eight band-like SiN layers having band-like mask material layers on their top extended in Y direction can be formed. By selecting a band-like mask material layer and a band-like SiN layer to be removed in this new circuit area, a new high-density logic circuit can be formed. Similarly, a new high-density logic circuit can also be formed by extending a circuit area in Y direction as well.

Feature 4

In the description of this embodiment, four band-like SiN layers 95aa, 95ab, 95ba, 95bb having band-like mask material layers 94aa, 94ab, 94ba, 94bb on their top extended in Y direction are formed in one circuit area, but four band-like SiN layers 95aa, 95ab, 95ba, 95bb having band-like mask material layers 94aa, 94ab, 94ba, 94bb on their top extended in X direction may be formed to form a logic circuit. This makes it possible to increase degree of freedom in circuit design and lead to high integration of the logic circuit area.

Sixth Embodiment

Figure 6A:
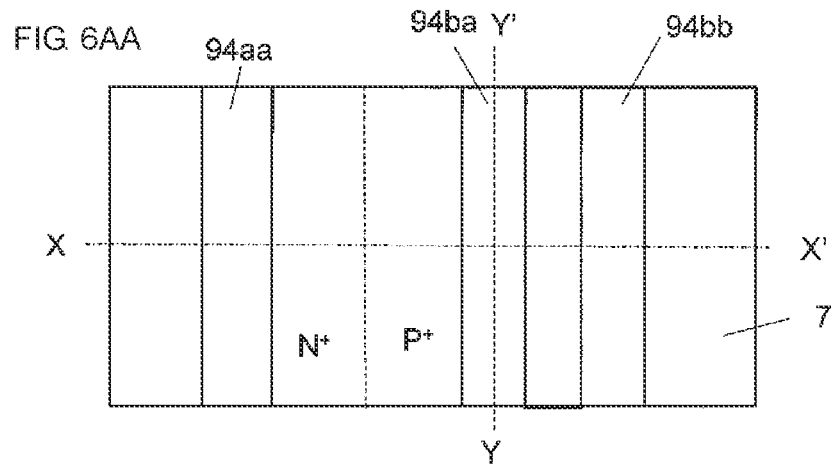
FIG. 6AA and FIGS. 6AB and 6AC are respectively a plane view and cross-sectional structural views for describing a manufacturing method of a pillar-shaped semiconductor device having SGTs according to the sixth embodiment of the present invention.
Figure 6A:
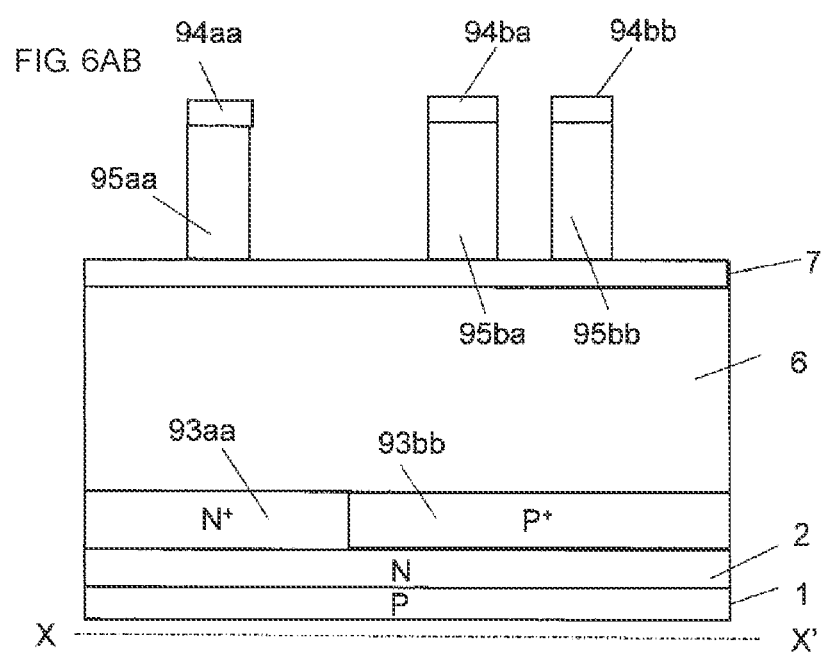
Figure 6A:
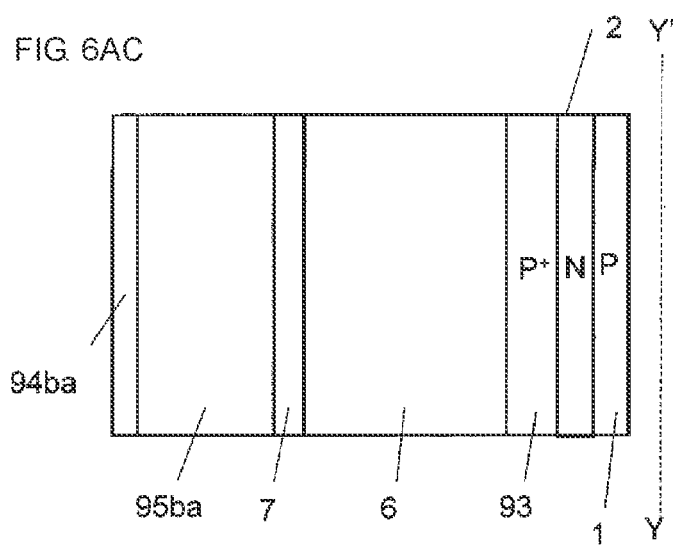

Hereinafter, a manufacturing method for an inverter circuit using SGTs according to the sixth embodiment of the present invention is described with reference to FIGS. 6AA to 6CC. In the figures, figures suffixed with A are plan views, figures suffixed with B are cross-sectional structural views taken along lines X-X' in the corresponding figures suffixed with A, and figures suffixed with C are cross-sectional structural views taken along lines Y-Y' in the corresponding figures suffixed with A.

As shown in FIGS. 5AA to 5AC, band-like SiN layers 95aa, 95ab, 95ba, 95bb having band-like mask material layers 94aa, 94ab, 94ba, 94bb on their top are formed (which may be formed to align in parallel in Y direction) in a logic circuit area. Then, as shown in FIGS. 6AA to 6AC, band-like mask material layer 94ab and band-like SiN layer 95ab are removed. Here, a P$^+$ layer 93 in FIGS. 5AA to 5AC is formed to be a band-like N$^+$ layer 93aa and a band-like P$^+$ layer 93bb, which are formed such that, with their interface being at a middle of the band-like SiN layer 95aa and the SiN layer 95ba in planar view, the band-like N$^+$ layer 93aa is formed on a side of the SiN layer 95aa and the band-like P$^+$ layer 93bb is formed on a side of the SiN layers 95ba, 95bb.

Figure 6B:
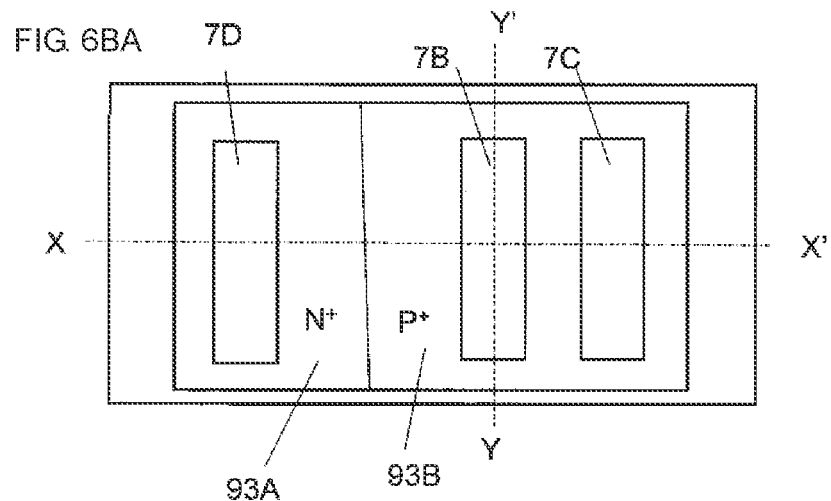
FIG. 6BA and FIGS. 6BB and 6BC are respectively a plane view and cross-sectional structural views for describing a manufacturing method of a pillar-shaped semiconductor device having SGTs according to the sixth embodiment of the present invention.
Figure 6B:
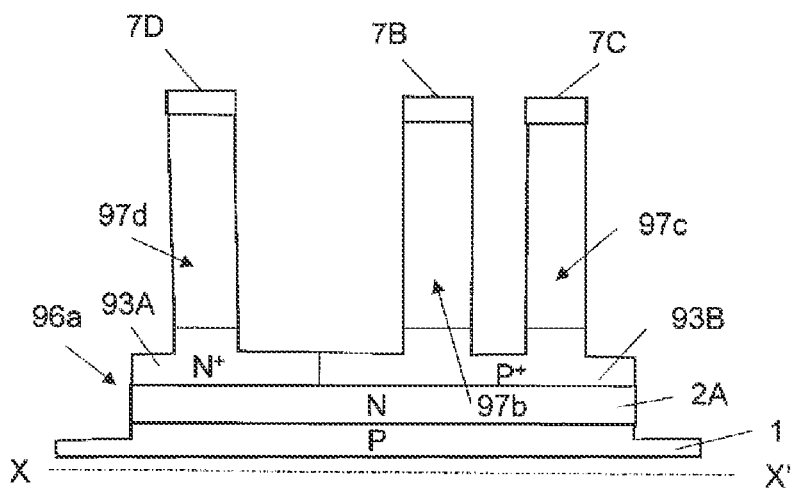
Figure 6B:
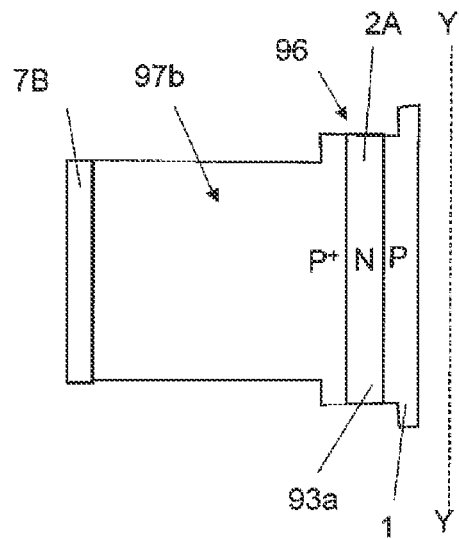
Figure 6C:
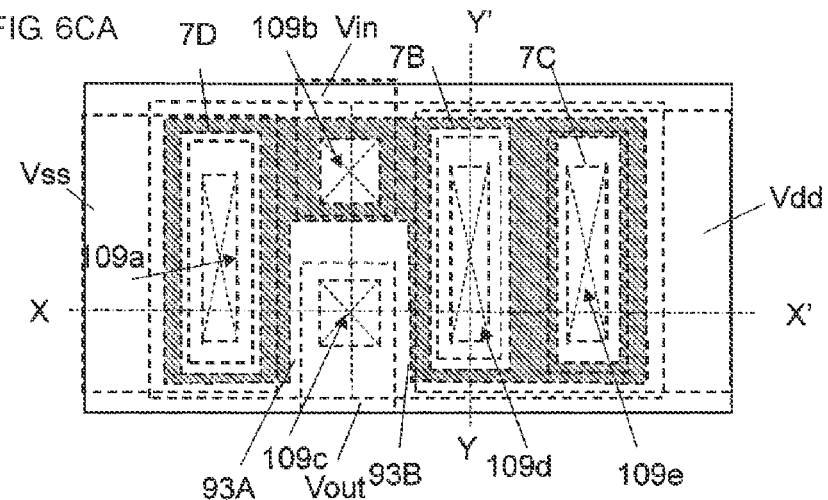
FIG. 6CA and FIGS. 6CB and 6CC are respectively a plane view and cross-sectional structural views for describing a manufacturing method of a pillar-shaped semiconductor device having SGTs according to the sixth embodiment of the present invention.
Figure 6C:
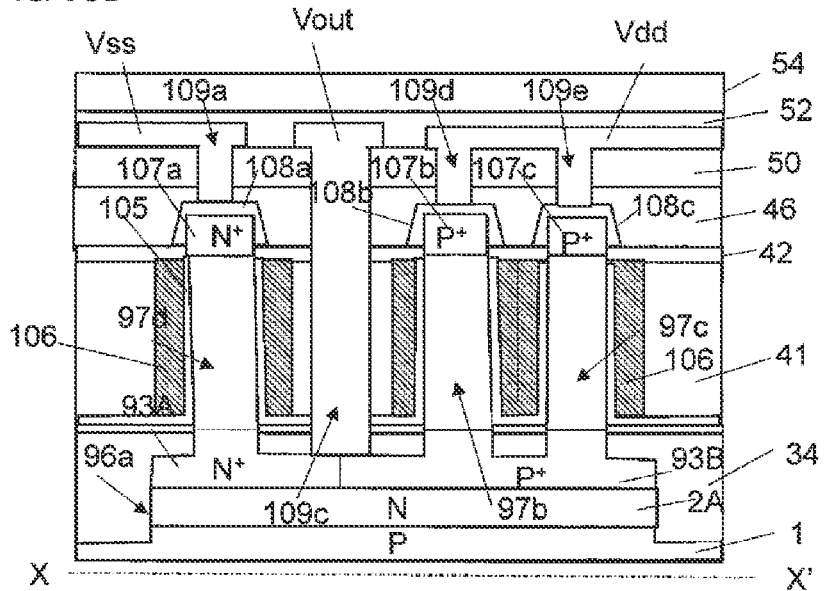
Figure 6C:
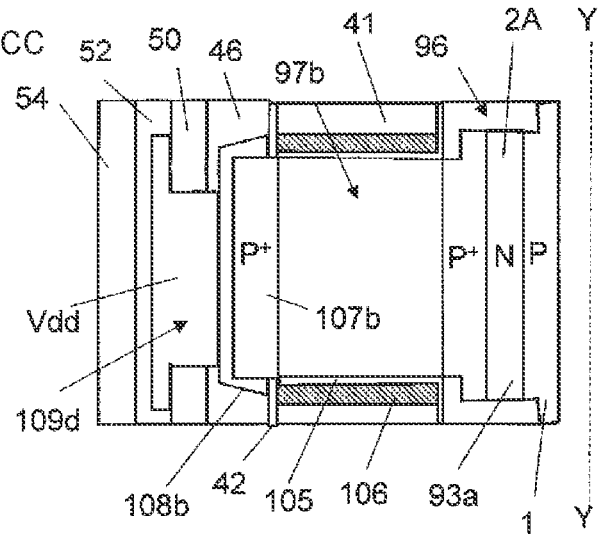

Next, by performing a process same as that described in FIGS. 5DA to 5DC, band-like Si pillars 97d, 97b, 97c having band-like mask material layers 7D, 7B, 7C on their top and a Si pillar base 96a consisting of a P layer substrate 1, an N layer 2A, an N$^+$ layer 93A, and a P$^+$ layer 93B surrounding the band-like Si pillars 97d, 97b, 97c in planar view are formed, as shown in FIGS. 6BA to 6BC, Next, as shown in FIGS. 6CA to 6CC, parallel to the processes of the second and the fourth embodiments, a SiO$_2$ layer 34 surrounding the Si pillar base 96a and the bottom of the band-like Si pillars 97d, 97b, 97c; a gate HfO$_2$ layer 105 surrounding side surfaces of the Si pillars 97d, 97b, 97c; a gate TiN layer 106 surrounding side surfaces of the gate HfO$_2$ layer 105; a SiO$_2$ layer 41 surrounding the gate TiN layer 106; a SiN layer 42 on the SiO$_2$ layer 41 and surrounding the periphery of the top of the Si pillars 97d, 97b, 97c; an N$^+$ layer 107a and P$^+$ layers 107b, 107c at the top of the Si pillars 97d, 97b, 97c; an N$^+$ layer 108a and P$^+$ layers 108b, 108c on the N$^+$ layer 107a and the P$^+$ layers 107b, 107c; SiO$_2$ layers 46, 50 covering the N$^+$ layer 108a and the P$^+$ layers 108b, 108c; a contact hole 109c linked to an upper surface of the interface of the N$^+$ layer 93A and the P$^+$ layer 93B from the SiO$_2$ layer 50; a contact hole 109b linked to an upper surface of the gate TiN layer 106 from the SiO$_2$ layer 50; a contact hole 109a linked to an upper surface of the N$^+$ layer 108a from the SiO$_2$ layer 50; contact holes 109d, 109e linked to an upper surface of the P$^+$ layers 108b, 108c; an input line metal layer Vin linked to the gate TiN layer 106 via the contact hole 109b; an output line metal layer Vout linked to the N$^+$ layer 93A and the P$^+$ layer 93B via the contact hole 109c; a ground line metal layer Vss linked to the N$^+$ layer 108a via the contact hole 109a; a supply line metal layer Vdd linked to the P$^+$ layers 108b, 108c via the contact holes 109d, 109e; and SiO$_2$ layers 52, 54 thereon are formed. Here, the gate TiN layer 106 between Si pillars 97b and 97c is formed to contact at entire side surfaces of the gate region in vertical direction. Thus, at the same time of forming a SRAM circuit, an inverter circuit with three SGTs is formed in a logic circuit area on the same P layer substrate 1. The contact holes 109a, 109c are formed in an area of the removed band-like mask material layer 94ab and the band-like SiN layer 95ab in planar view.

According to the manufacturing method of this embodiment, following features are provided.

Feature 1

In this embodiment, the gate TiN layer 106 of the SGTs formed at the band-like Si pillars 97b, 97c is formed so as to contact at entire side surface. In this case, when the thickness of the gate TiN layer 106 is made to be thinnest as long as it can function as a gate layer, two SGTs formed at the two band-like Si pillars 97b, 97c are made to be fine. In addition, in order to form the fine two SGTs, in planar view, the area of the removed band-like mask material layer 94ab and the band-like SiN layer 95ab is effectively used as an area for forming the contact hole 109c for connecting with the output line metal layer Vout and the contact hole 109b for connecting with the input line metal layer Vin. Thus, a high-density inverter SGT circuit can be formed.

Feature 2

Most of processes in this embodiment, including the process for forming the band-like Si pillars 97d, 97b, 97c in the high-density inverter circuit, may be the same processes as the processes for forming SRAM circuit described in the second and the fourth embodiments. Thus, a high-density SRAM circuit and a high-density inverter circuit can be simultaneously formed on the same P layer substrate 1 in a small number of processes. Here, in the description of this embodiment, the gate HfO$_2$ layer 105 and the gate TiN layer 106 are described using the same material layers as those in the SRAM circuit. On the other hand, in order to optimize operations of the inverter circuit and the SRAM circuit, the gate HfO$_2$ layer 105 and the gate TiN layer 106 of the inverter circuit may be changed from the SRAM circuit. In view of entire number of processes, increase in number of processes due to this change has little effect on increase in cost.

Feature 3

The difference from the fifth embodiment is only that the N$^+$ layer 93A and the P$^+$ layer 93B of the Si pillar base 96a and that the band-like mask material layer 94*ab* and the band-like SiN layer 95*ab* to be removed are changed. This indicates that a high-density SRAM circuit, a high-density SGT in which three SGTs are connected in parallel, and a high-density inverter SGT circuit may be simultaneously formed on the same P layer substrate 1.

Feature 4

In the description of this embodiment, a case using two N channel SGTs connected in parallel for driving is described, but high-density inverter circuit in which two P channel SGTs are connected in parallel for loading may be simultaneously formed by a method in which the band-like mask material layer 94*ba* and the band-like SiN layer 96*ba* are removed.

Feature 5

In the description of this embodiment, four band-like SiN layers 95*aa*, 95*ab*, 95*ba*, 95*bb* having band-like mask material layers 94*aa*, 94*ab*, 94*ba*, 94*bb* on their top extended in Y direction are formed in one circuit area, but other four band-like SiN layers having band-like mask material layers on their top also extended in Y direction may be formed in an area adjacent in X direction to the circuit area. Thus, new circuit area consisting of eight band-like SiN layers having band-like mask material layers on their top extended in Y direction can be formed. By selecting a band-like mask material layer and a band-like SiN layer to be removed in this new circuit area, a new high-density logic circuit can be formed. Similarly, a new high-density logic circuit can also be formed by extending a circuit area in Y direction as well.

Seventh Embodiment

Figure 7A:
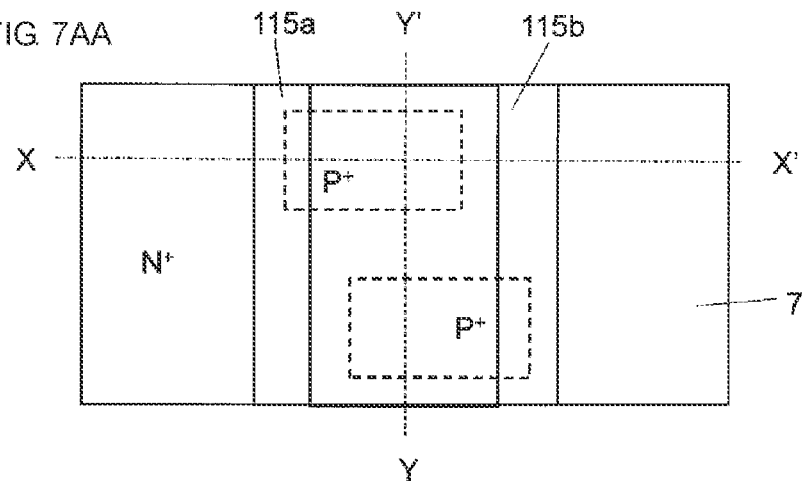
FIG. 7AA and FIGS. 7AB and 7AC are respectively a plane view and cross-sectional structural views for describing a manufacturing method of a pillar-shaped semiconductor device having SGTs according to the seventh embodiment of the present invention.
Figure 7A:
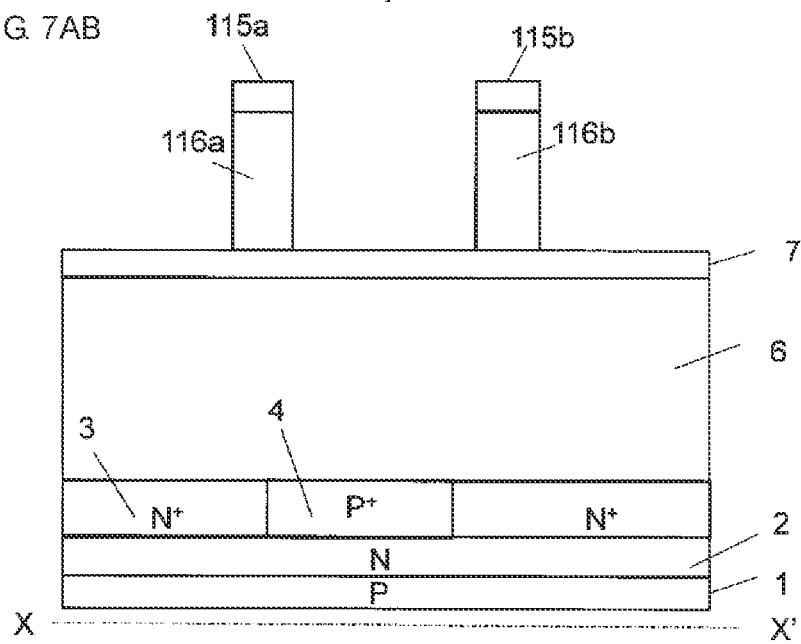
Figure 7A:
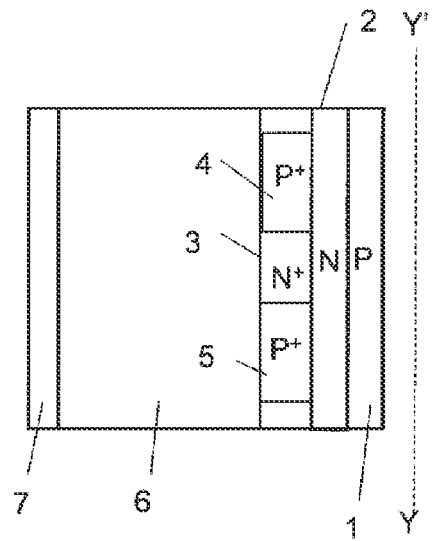

Hereinafter, a manufacturing method for an SRAM circuit using SGTs according to the seventh embodiment of the present invention is described with reference to FIGS. 7AA to 7DC. In the figures, figures suffixed with A are plan views, figures suffixed with B are cross-sectional structural views taken along lines X-X' in the corresponding figures suffixed with A, and figures suffixed with C are cross-sectional structural views taken along lines Y-Y' in the corresponding figures suffixed with A.

After performing a process shown in FIGS. 1AA to 1AC, a SiN layer (not shown) and a mask material layer (not shown) are entirely formed on a mask material layer 7. Then, as shown in FIGS. 7AA to 7AC, two band-like mask material layers 115*a*, 115*b* extended in Y direction in planar view are formed by lithography and RIE etching methods. Then, the SiN layer are etched by RIE etching with the band-like mask material layers 115*a*, 115*b* as a mask to form band-like SiN layers 116*a*, 116*b* extended in Y direction.

Figure 7B:
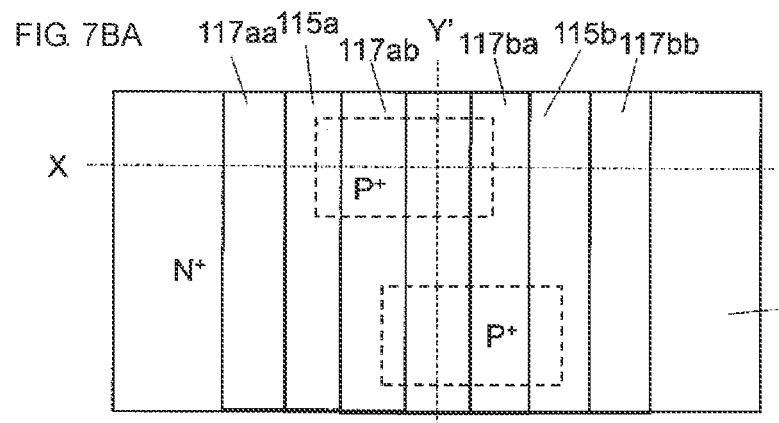
FIG. 7BA and FIGS. 7BB and 7BC are respectively a plane view and cross-sectional structural views for describing a manufacturing method of a pillar-shaped semiconductor device having SGTs according to the seventh embodiment of the present invention.
Figure 7B:
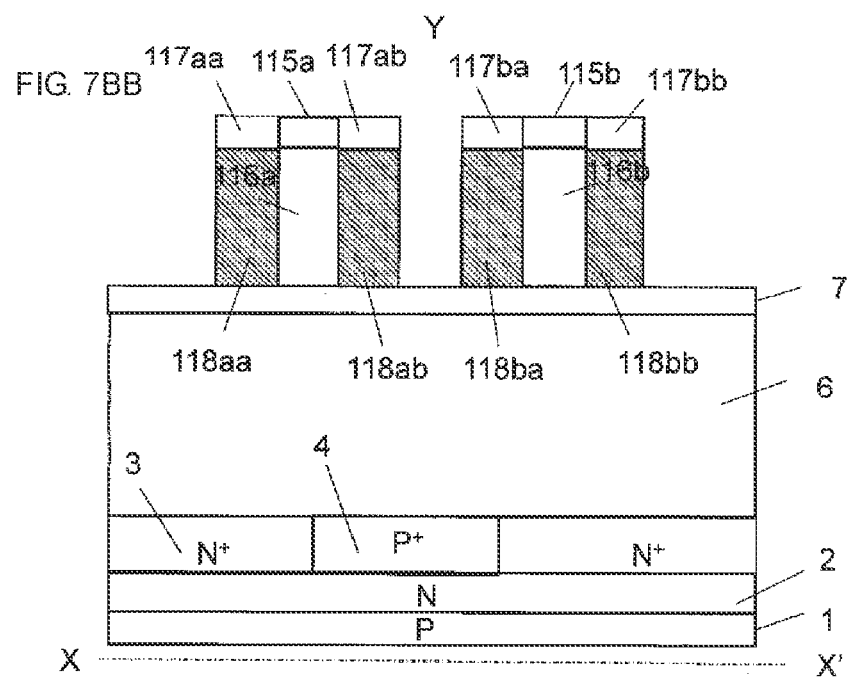
Figure 7B:
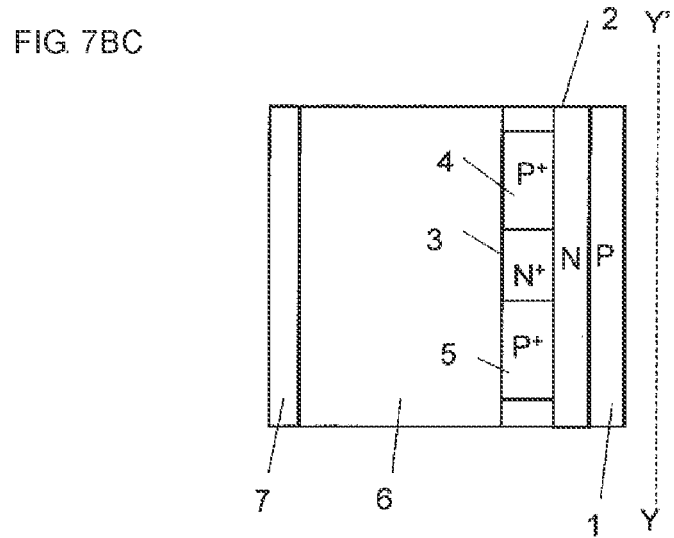

Next, a SiGe layer (not shown) is entirely formed by ALD method. Then, processes shown in FIGS. 1DA to 1IC are performed to form band-like mask material layers 117*aa*, 117*ab*, 117*ba*, 117*bb* formed on each side of the band-like mask material layers 115*a*, 115*b*, and band-like SiGe layers 118*aa*, 118*ab*, 118*ba*, 118*bb* under the band-like mask material layers 117*aa*, 117*ab*, 117*ba*, 117*bb* and in contact with each side surface of the SiN layers 116*a*, 116*b*, as shown in FIGS. 7BA to 7BC. The band-like mask material layers 117*ab* and the band-like mask material layer 117*ba* are formed to be separated. Similarly, the band-like SiGe layer 118*ab* and the band-like SiGe layer 118*ba* are formed to be separated.

Figure 7C:
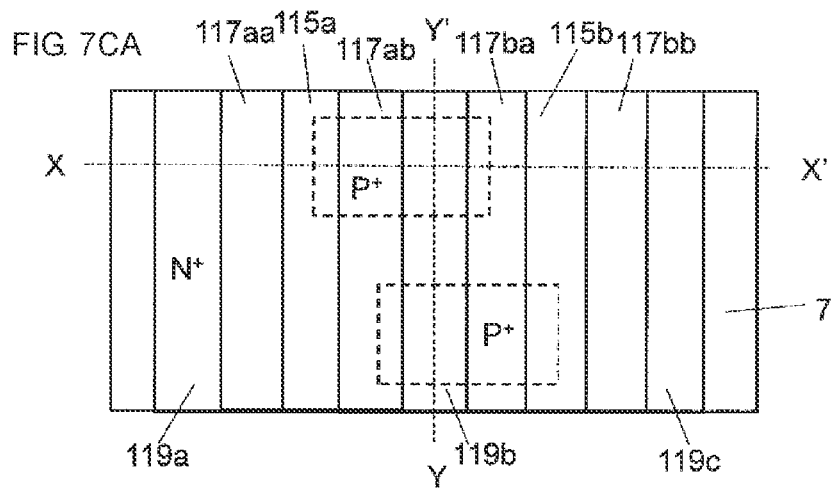
FIG. 7CA and FIGS. 7CB and 7CC are respectively a plane view and cross-sectional structural views for describing a manufacturing method of a pillar-shaped semiconductor device having SGTs according to the seventh embodiment of the present invention.
Figure 7C:
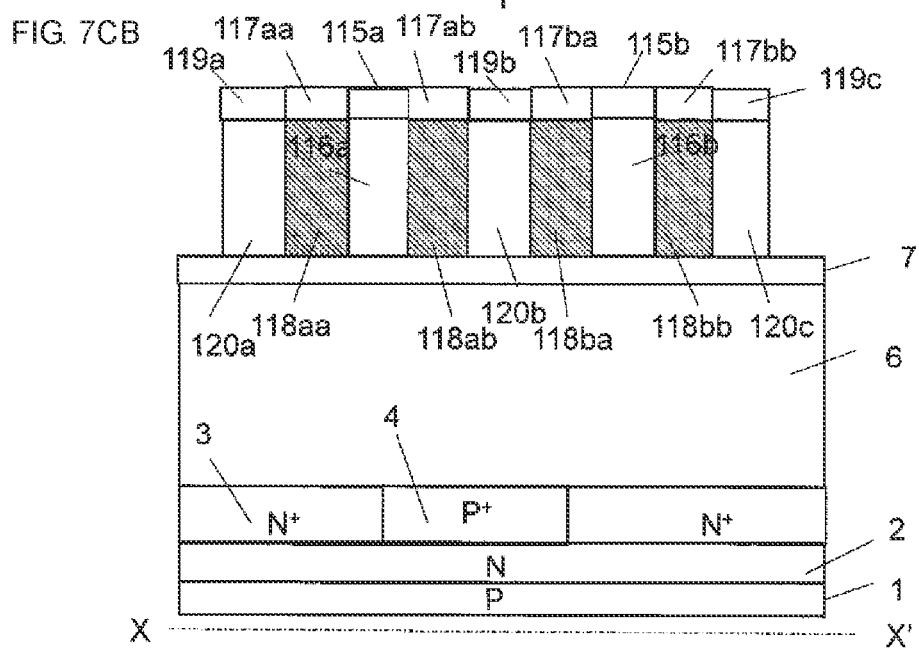
Figure 7C:
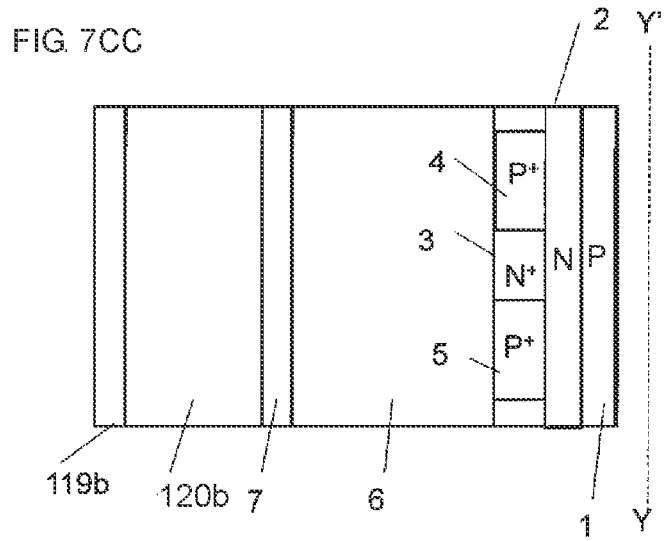

Next, as shown in FIGS. 7CA to 7CC, same process as described in FIGS. 1NA to 1NC is used to form band-like mask material layers 119*a*, 119*c* outside of the band-like mask material layers 117*aa*, 117*bb*. At the same time, a band-like mask material layer 119*b* is formed between the band-like mask material layers 117*ab* and 117*ba*. Then, band-like SiN layers 120*a*, 120*b*, 120*c* are formed under the band-like mask material layers 119*a*, 119*b*, 119*c*. In this case, a width of the band-like SiN layer 120*b*, a width of the band-like SiN layers 116*a*, 116*b*, and a width of the band-like SiN layers 120*a*, 120*c* is preferably made to be the same.

Figure 7D:
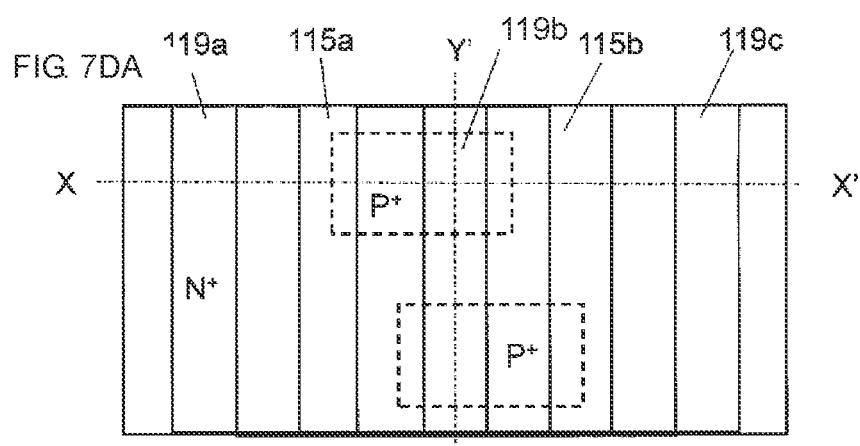
FIG. 7DA and FIGS. 7DB and 7DC are respectively a plane view and cross-sectional structural views for describing a manufacturing method of a pillar-shaped semiconductor device having SGTs according to the seventh embodiment of the present invention.
Figure 7D:
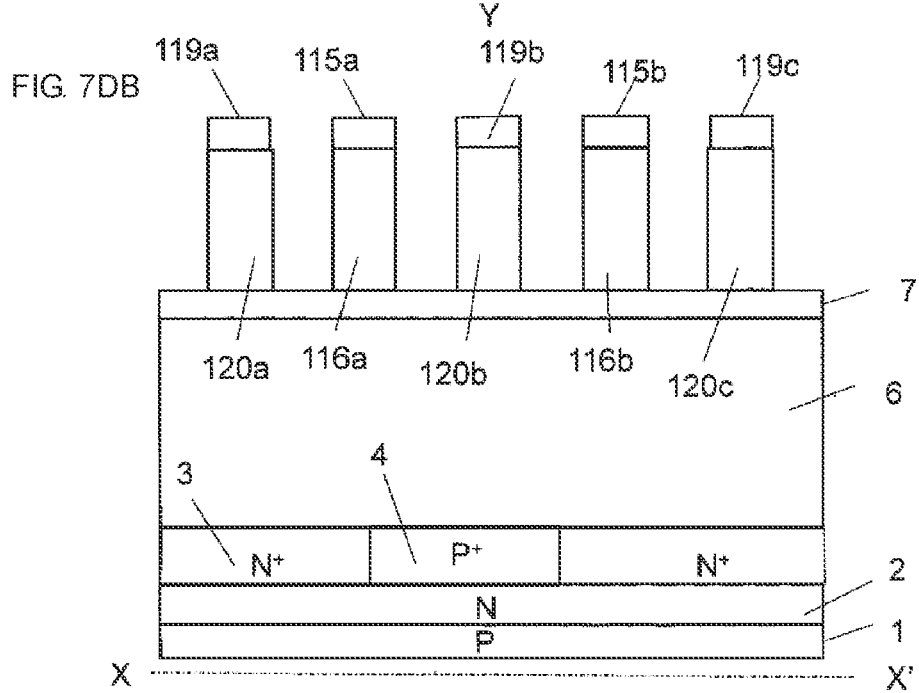
Figure 7D:
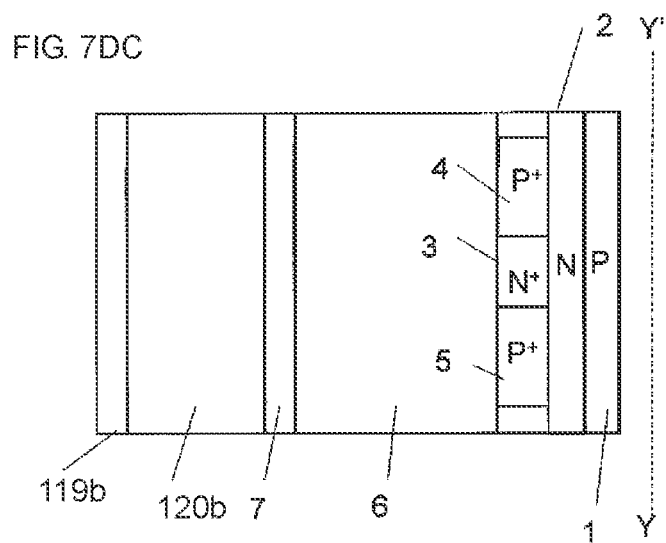

Next, as shown in FIGS. 7DA to 7DC, the band-like mask material layers 117*aa*, 117*ab*, 117*ba*, 117*bb* and the band-like SiGe layers 118*aa*, 118*ab*, 118*ba*, 118*bb* are removed. Thus, the band-like mask material layers 115*a*, 115*b*, 119*a*, 119*b*, 119*c* and the band-like SiN layers 116*a*, 116*b*, 120*a*, 120*b*, 120*c* extended in Y direction in planar view are formed on a mask material layer 7. Then, by performing processes of FIGS. 1PA to 1YYC, a SRAM cell consisting of eight SGTs same as FIGS. 1YYA to 1YYC is formed.

According to the manufacturing method of this embodiment, following features are provided. In the first embodiment, a process for forming band-like pillars is repeated four times on each side of a band-like SiN layer 8*a* to form band-like SiN layers 8*a*, 16*a*, 20*a*, 20*b* and band-like SiGe layers 12*aa*, 12*ab*, 18*a*, 18*b*. On the other hand, in this embodiment, band-like SiN layers 116*a*, 116*b*, 120*a*, 120*b*, 120*c* are formed by performing processes two times for forming band-like material layer, on each side of the band-like SiN layers 116*a*, 116*b* simultaneously formed. This makes it possible to simplify the processes.

Eighth Embodiment

Figure 8A:
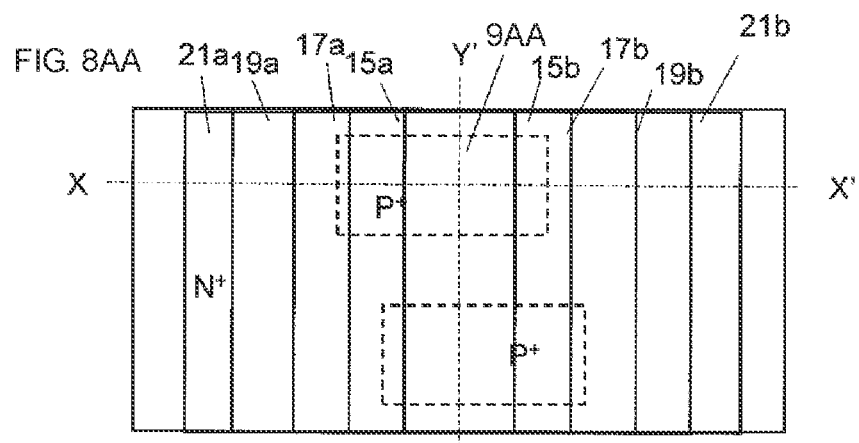
FIG. 8AA and FIGS. 8AB and 8AC are respectively a plane view and cross-sectional structural views for describing a manufacturing method of a pillar-shaped semiconductor device having SGTs according to the eighth embodiment of the present invention.
Figure 8A:
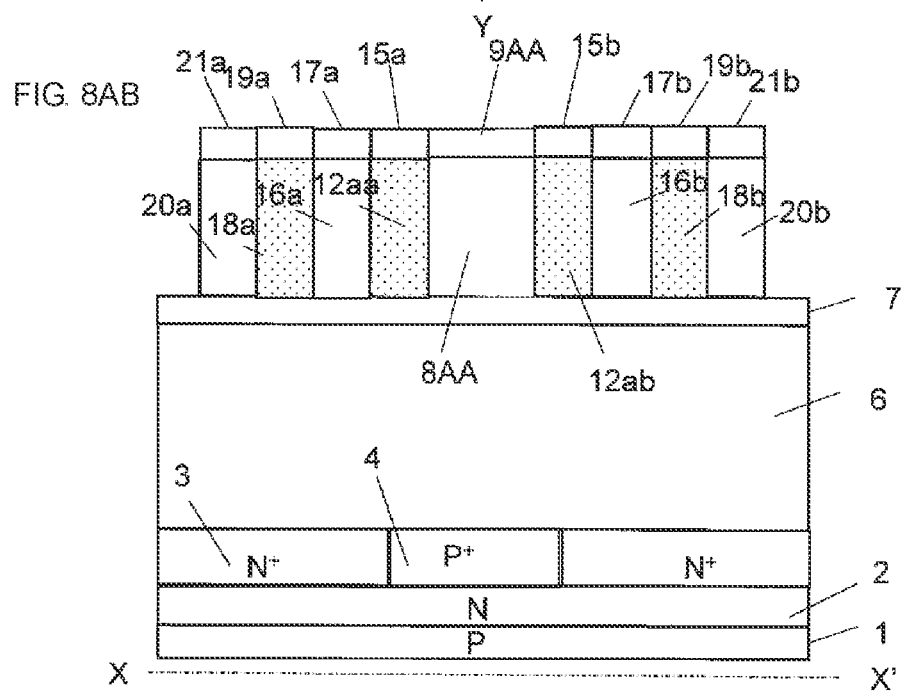
Figure 8A:
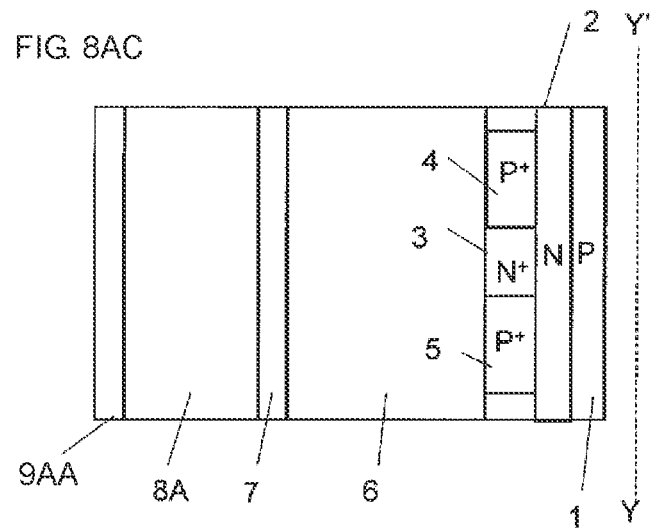

Hereinafter, a manufacturing method for an SRAM circuit using SGTs according to the eighth embodiment of the present invention is described with reference to FIGS. 8AA to 8BC. In the figures, figures suffixed with A are plan views, figures suffixed with B are cross-sectional structural views taken along lines X-X' in the corresponding figures suffixed with A, and figures suffixed with C are cross-sectional structural views taken along lines Y-Y' in the corresponding figures suffixed with A.

Processes in FIGS. 1AA to 1CC are performed to form a band-like mask material layer 9AA and a band-like SiN layer 8AA wider than the band-like mask material layer 9*a* and the band-like SiN layer 8*a* on a mask material layer 7. After that, processes in FIGS. 1DA to 1NC are performed. Thus, as shown in FIGS. 8AA to 8AC, band-like mask material layers 15*a*, 15*b*, 17*a*, 17*b*, 19*a*, 19*b*, 21*a*, 21*b*, band-like SiGe layers 12*aa*, 12*ab*, 18*a*, 18*b*, and band-like SiN layers 16*a*, 16*b*, 20*a*, 20*b* are formed on a mask material layer 7, on each side of the band-like mask material layer 9AA and the band-like SiN layer 8AA.

Figure 8B:
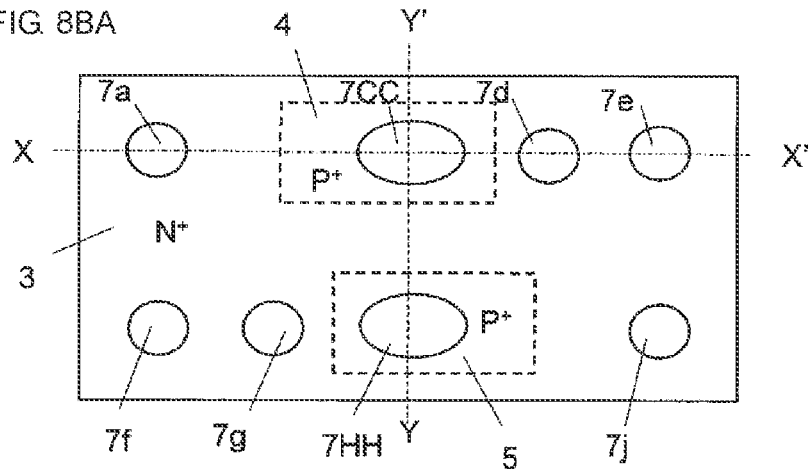
FIG. 8BA and FIGS. 8BB and 8BC are respectively a plane view and cross-sectional structural views for describing a manufacturing method of a pillar-shaped semiconductor device having SGTs according to the eighth embodiment of the present invention.
Figure 8B:
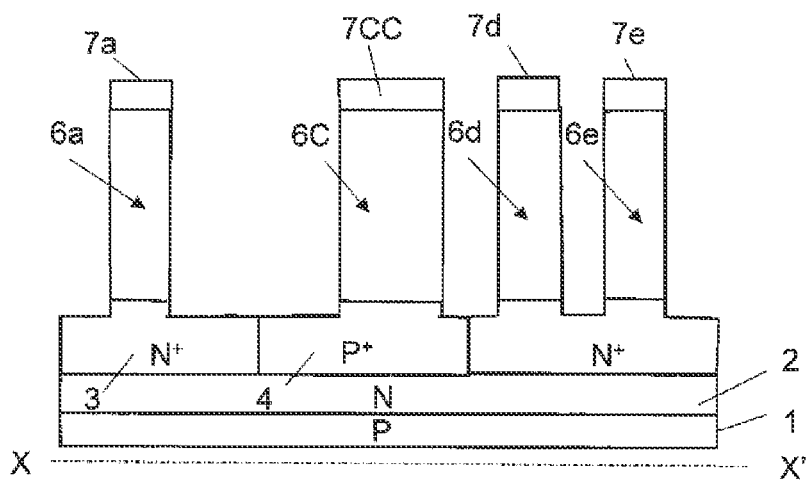
Figure 8B:
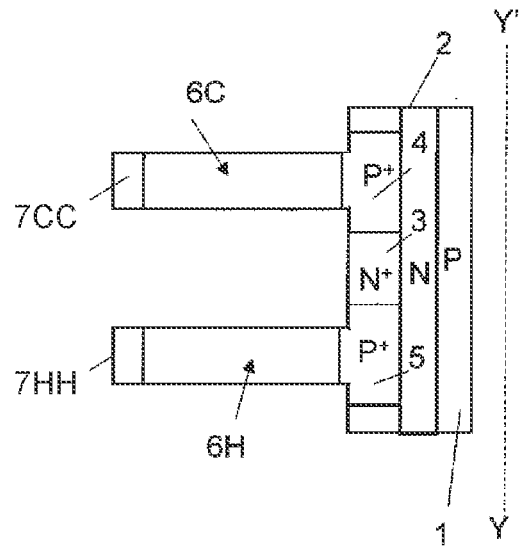
Figure 9:
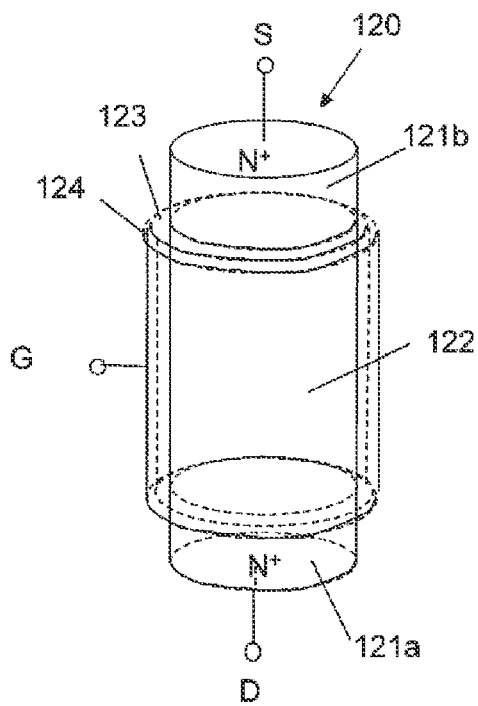
FIG. 9 is a schematic structural view showing a conventional SGT.
Figure 10:
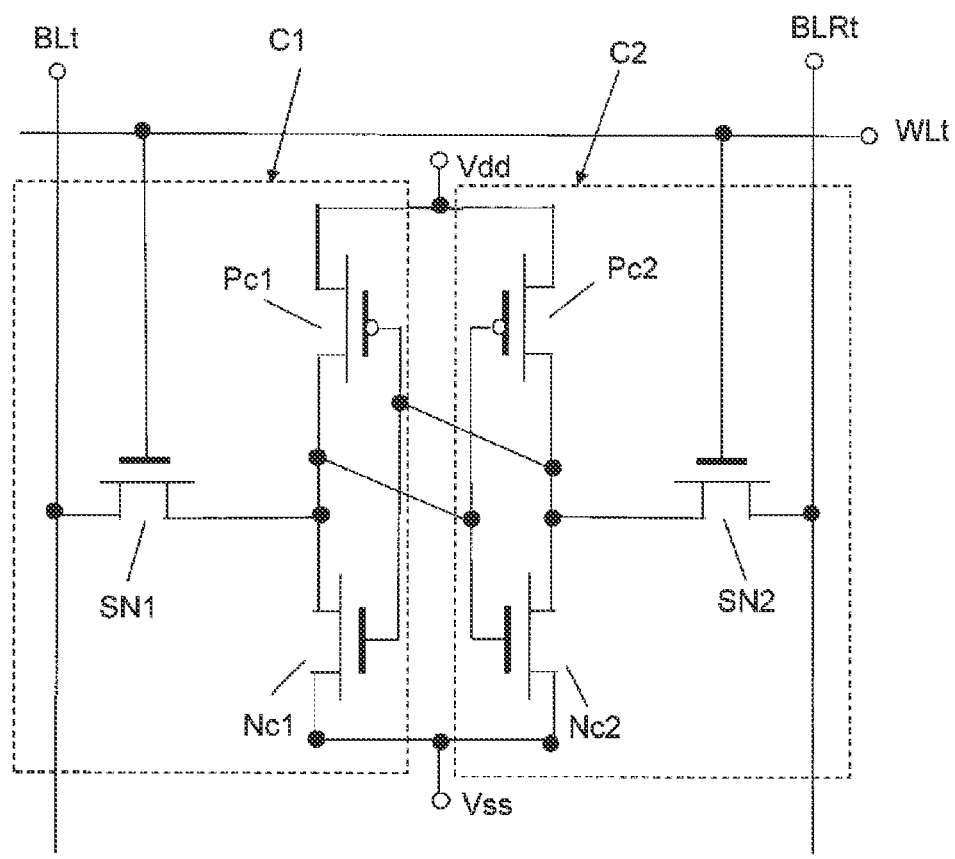
FIG. 10 is a circuit diagram of a SRMA cell using conventional SGTs.

Then, by performing processes in FIGS. 1OA to 1WC, in planar view, Si pillars 7CC, 7HH are made to be elliptic or elongated shape, while Si pillars 7*a*, 7*d*, 7*e*, 7*f*, 7*g*, 7*j* are made to be circular shape, as shown in FIGS. 8BA to 8BC. After that, by performing processes in FIGS. 1XA to 1YYC, a SRAM cell can be formed on a P layer substrate 1. In this case, a cross-sectional area of the Si pillars 7CC, 7HH is larger than that of the Si pillars 7*a*, 7*d*, 7*e*, 7*f*, 7*g*, 7*j*.

According to the manufacturing method of this embodiment, following features are provided.

Feature 1

Since the cross-sectional area of the Si pillars 7CC, 7HH aligned in Y direction for forming loading SGT can be easily made to be larger than the cross-sectional area of the Si pillars 7*a*, 7*d*, 7*e*, 7*f*, 7*g*, 7*j* forming driving and selection SGTs, it is possible to increase current flowing through the loading SGTs. Thus, operation margin of the SRAM cell can be increased. Similarly, it is also possible to increase driving current by making a shape in planar view of the Si pillars 7d, 7g forming driving SGT elliptic or elongated shape so as to increase cross-sectional area thereof. Thus, by making cross-section of specified Si pillars elliptic or elongated shape, performance can be improved while easily inhibiting cell footprint from increasing.

Feature 2

Similarly, for the second embodiment shown in FIGS. 2AA to 2FC, current flowing through loading SGTs formed at Si pillars 73c, 73f can also be increased. Similarly, it can be also applied to Si pillars 73a, 73d, 73e, 73h. It can be also applied to the fourth embodiment shown in FIGS. 4AA to 4CC. In above-mentioned cases, it is common that, by changing widths of simultaneously formed band-like mask material layers extended in Y direction for forming the Si pillars, shapes of Si pillars in planar view can be made circular, elliptic, or elongated shape depending on design requirements. It can also be applied to other embodiments.

In addition, in the embodiments according to the present invention, one SGT is formed at one semiconductor pillar, but the present invention can also be applied to any circuit formation in which two or more SGTs are formed.

Also, in the first embodiment, a mask material layer 7 is formed of a $SiO_2$ layer, an aluminum oxide ($Al_2O_3$, hereinafter referred as AlO) layer, and a $SiO_2$ layer. Then, a Silicon nitride (SiN) layer 8 is deposited. Then, a mask material layer 9 consisting of a $SiO_2$ layer is deposited. Then, a mask material layer 10 consisting of a SiN layer is deposited. For these mask material layers 7, 9, 10, and SiN layer 8, other material layers consisting of single or multiple layers including organic or inorganic materials may be used, as long as the materials are suitable for the purpose of the present invention. This is also applicable to other embodiments according to the present invention.

Also, in the first embodiment, a SiGe layer 12 is formed entirely over the band-like mask material layers 7, 8a, 9a by ALD method, as shown in FIGS. 1DA to 1DC. For this SiGe layer 12, other material layers consisting of single or multiple layers including organic or inorganic materials may be used, as long as the materials are suitable for the purpose of the present invention. This is also applicable to band-like SiGe layers 18a, 18b. In addition, base materials for band-like SiGe layers 12aa, 12ab and for band-like SiGe layers 18a, 18b may not be the same. This is also applicable to other embodiments according to the present invention.

Also, for band-like mask material layers 15a, 15b, 17a, 17b, 19a, 19b, 21a, 21b and band-like mask material layers 16a, 16b, 20a, 20b in the first embodiment, other material layers consisting of single or multiple layers including organic or inorganic materials may be used, as long as the materials are suitable for the purpose of the present invention. This is also applicable to other embodiments according to the present invention.

Also, in the first embodiment, band-like mask material layers 9a, 15a, 15b, 17a, 17b, 19a, 19b, 21a, 21b are formed such that each upper surface and bottom position comes to be same, but the each upper surface and bottom position may be different in vertical direction, as long as being suitable for the purpose of the present invention. This is also applicable to other embodiments according to the present invention.

Also, in the first embodiment, a thickness and a shape of band-like mask material layers 9a, 15a, 15b, 17a, 17b, 19a, 19b, 21a, 21b may be changed by CMP polishing, RIE etching, and cleaning. This change causes no problem when the change is within a range suitable for the purpose of the present invention. This is also applicable to other embodiments according to the present invention.

Also, in the first embodiment, for a $SiO_2$ layer 22, a SiN layer 24, a band-like SiGe layer 25, a band-like mask material layer 26 of SiN layer, and band-like mask material layers 27a, 27b, 28a, 28b shown in FIGS. 1QA to 1SC, other material layers consisting of single or multiple layers including organic or inorganic materials may be used, as long as the materials are suitable for the purpose of the present invention. This is also applicable to other embodiments according to the present invention.

Also, in the first embodiment, Si pillars 6b, 6i are removed. In this manner, any of formed Si pillars 6a to 6j may be removed by lithography and etching depending on a circuit design. In a circuit other than the SRAM cell circuit, once formed Si pillars may also be removed depending on a circuit design. Also, as in the fourth embodiment, any area of band-like mask material layers 27a, 27b, 28a, 28b in planar view may be etched so as not to form any of Si pillars 6a to 6j. A method provided by the embodiments can be applied to any circuit formation other than SRAM cells. This is also applicable to other embodiments according to the present invention.

Also, in the first embodiment, TiN layers 40a, 40b, 40c, 40d are used as a gate metal layer, as shown in FIGS. 1ZA to 1ZC. For the TiN layers 40a, 40b, 40c, 40d, other material layers consisting of single or multiple layers may be used, as long as the materials are suitable for the purpose of the present invention. The TiN layers 40a, 40b, 40c, 40d may be formed of a conductor layer such as a metal layer of single or multiple layers having at least desired work function. Outside of this, other conductive layers such as, for example, a W layer may be formed. In this case, the W layer serves as a metal line layer for linking gate metal layers. Any metal layers of single or multiple layers other than the W layer may be used. Although $HfO_2$ layer 35 is used as a gate insulating layer and TiN layers 40a, 40b, 40c, 40d are used as gate material layers, other material layers consisting of single or multiple layers may be used. This is also applicable to other embodiments according to the present invention.

In the embodiments, it is not necessary that X direction and Y direction are orthogonal. An angle formed by the X direction and the Y direction may be deviated from right angle, as long as a function as a circuit can be satisfied.

In the fifth embodiment, rectangular-shaped band-like Si pillars 97a, 97b, 97c in planar view are formed. Shapes of the band-like Si pillars 97a, 97b, 97c in planar view may be other shapes such as circular, elliptic, and square. This is also applicable to the sixth embodiment. Also, according to circuit areas, any shapes may be selected depending on circuit design requirements. Similarly, shapes of Si pillars 6a to 6j in planar view in the SRAM cell in the first embodiment may also be ellipse other than circle. Major and minor axes of this ellipse may not be matched with X and Y directions. Also, mixture of Si pillars having various shapes in planar view may be formed in a logic circuit area, depending on logic circuit design. These are also applicable to other embodiments according to the present invention.

Also, in the first embodiment, $N^+$ layers 3a, 3b, 3c, 3d and $P^+$ layers 4a, 4b are formed in connection with bottoms of Si pillars 6a to 6j. Metal or alloy layer such as silicide may be formed over upper surfaces of the $N^+$ layers 3a, 3b, 3c, 3d and $P^+$ layers 4a, 4b. Also, on periphery of bottoms of the Si pillars 6a to 6j, a $P^+$ or $N^+$ layer containing donor or acceptor impurity atoms may be formed by, for example, an epitaxial crystal growth method, to form source or drain impurity region of SGT. In this case, an $N^+$ or $P^+$ layer may or may not be formed inside of the Si pillars in contact with the N⁺ or P⁺ layer formed by the epitaxial crystal growth method. Alternatively, a metal or alloy layer extended in parallel with a P layer substrate 1 may be provided in contact with these P⁺ and N⁺ layers. This is also applicable to other embodiments according to the present invention.

Also, in the first embodiment, N⁺ layers 43a, 43c, 43d, 43e, 43f, 43h and P⁺ layers 43b, 43g are formed by using selective epitaxial crystal growth method as shown in FIGS. 1XXA to 1XXC. Then, N⁺ layers 44a, 44c, 44d, 44e, 44f, 44h and P⁺ layers 44b, 44g are formed on top of Si pillars 6a to 6j by heat diffusion. Since the N⁺ layers 43a, 43c, 43d, 43e, 43f, 43h and P⁺ layers 43b, 43g formed by selective epitaxial crystal growth method are single crystal layer, the layers become source or drain of SGT, even when the N⁺ layers 44a, 44c, 44d, 44e, 44f, 44h and P⁺ layers 44b, 44g formed on top of the Si pillars 6a to 6j by heat diffusion do not exist. As described above, the N⁺ layer and the P⁺ layer connected to the top or the bottom of the Si pillars 6a to 6j may also be formed by any method other than the method described herein, as long as a function as a source or drain can be obtained. This is also applicable to other embodiments according to the present invention.

Also, in the first embodiment, N⁺ layers 43a, 43c, 43d, 43e, 43f, 43h and P⁺ layers 43b, 43g shown in FIGS. 1XXA to 1XXC are formed by selective epitaxial crystal growth method. These N⁺ layers 43a, 43c, 43d, 43e, 43f, 43h and P⁺ layers 43b, 43g may also be formed by performing usual epitaxial crystal growth method and then lithography and etching. This is also applicable to other embodiments according to the present invention.

Also, in the first embodiment, SGTs are formed on a P layer substrate 1, but SOI (Silicon On Insulator) substrate may be used instead of the P layer substrate 1. Alternatively, any substrate of other materials may be used as long as it can serve as a substrate. This is also applicable to other embodiments according to the present invention.

Also, in the first embodiment, a SGT is described in which N⁺ layers 44a, 44c, 44d, 44f, 44h and P⁺ layers 44b, 44g, and N⁺ layers 3a, 3b, 3c, 3d and P⁺ layers 4a, 4b having conductivities of same polarity are used above and below of Si pillars 6a to 6j to configure source and drain, but the present invention may also be applicable to a tunnel-type SGT having source and drain of different polarities. This is also applicable to other embodiments according to the present invention.

Also, in the first embodiment, N⁺ layers 43a, 43c, 43d, 43e, 43f, 44a, 44c, 44d, 44e, 44f, 44h and P⁺ layers 43b, 43g, 44b, 44g are formed after forming a gate HfO₂ layer 35 and gate TiN layers 40a, 40b, 40c, 40d. On the other hand, the gate HfO₂ layer 35 and the gate TiN layers 40a, 40b, 40c, 40d may be formed after forming the N⁺ layers 43a, 43c, 43d, 43e, 43f, 44a, 44c, 44d, 44e, 44f, 44h and P⁺ layers 43b, 43g, 44b, 44g. This is also applicable to other embodiments according to the present invention.

Also, in each embodiment described above, examples, in which Si (silicon) is used as a semiconductor region such as a channel, source, and drain, are described. However, the technical ideas of the present invention may not be limited to this, and may also be applicable to any pillar-type semiconductor devices using semiconductor materials containing Si, such as SiGe, or semiconductor materials other than Si.

Also, in the first embodiment, Si pillars 6a to 6j are formed of a single Si layer, but channels of SGTs may be formed by laminating semiconductor layers consisting of different semiconductor base materials in vertical direction. This is also applicable to other embodiments according to the present invention.

Also, in a vertical-type NAND type flash memory circuit, a semiconductor pillar is made to be a channel, and multiple stage of memory cells configured by a tunnel oxide layer, a charge accumulation layer, an interlayer insulating layer, and a control conductor layer surrounding the semiconductor pillar are formed in a vertical direction. At the semiconductor pillars on each end of these memory cells, a source line impurity layer which corresponds to a source and a bit line impurity layer which corresponds to a drain exist. In addition, for one memory cell, when there are other memory cells on each side of the one memory cell, if one of the other memory cells is a source, then the other one serves as a drain. Thus, the vertical-type NAND type flash memory circuit is a type of SGT circuits. Therefore, the present invention may be applicable to a circuit in which NAND type flash memory circuit also exists.

In the present invention, various embodiments and modification will be possible without departing from the broader sprit and scope of the present invention. Also, the foregoing embodiments are intended to illustrate one example of the present invention and not intended to limit the scope of the present invention. The foregoing examples and variations may be arbitrarily combined. Furthermore, if necessary, even if a part of constituent features of the foregoing embodiments is removed, it will be within the technical idea of the present invention.

According to a manufacturing method of a pillar-shaped semiconductor device of the present invention, a high-density pillar-shaped semiconductor device can be obtained.

What is claimed is:

1. A pillar-shaped semiconductor device, in a SRAM (Static Random Access Memory) circuit consisting of SGTs (Surrounding Gate Transistor) configuring one cell from a first set of SGTs in which three or four SGTs are arranged on a first line, and a second set of SGTs in which three or four SGTs are arranged on a second line parallel to the first line, in planar view, on a substrate, wherein:
   a first selection SGT is present at a first semiconductor pillar on the substrate at one end on the first line within the first set of SGTs; and
   a second selection SGT is present at a second semiconductor pillar on the substrate at an end opposite to the one end on the second line within the second set of SGTs;
   the pillar-shaped semiconductor device comprising:
   a third semiconductor pillar of a third SGT for driving or loading having a center at a point where a first center line extending through a center of the first semiconductor pillar orthogonal to the first line and the second line cross;
   a fourth semiconductor pillar of a fourth SGT for driving or loading having a center at a point where a second center line extending through a center of the second semiconductor pillar orthogonal to the second line and the first line cross;
   a fifth semiconductor pillar of a fifth SGT for driving or loading having a center on the first line and being adjacent to the fourth semiconductor pillar;
   a sixth semiconductor pillar of a sixth SGT for driving or loading having a center on the second line and being adjacent to the third semiconductor pillar;
   wherein a first gate conductor layer of the linked third SGT and the sixth SGT is connected at side surface of entire first channel region of the third semiconductor pillar and the sixth semiconductor pillar in a vertical direction;

a first contact hole for electrically connecting a first impurity area extended on the first line and connected to each bottom of the first semiconductor pillar, the fourth semiconductor pillar, and the fifth semiconductor pillar, and the first gate conductor layer, at least a part being overlapped on a first band area, the first band area being an extension of insides of two tangential lines of periphery of the sixth semiconductor pillar, the two tangential lines being parallel to the first center line, in planar view;

wherein a second gate conductor layer of the linked fourth SGT and the fifth SGT is connected at side surface of entire second channel region of the fourth semiconductor pillar and the fifth semiconductor pillar in the vertical direction; and a second contact hole for electrically connecting a second impurity area extended on the second line and connected to each bottom of the second semiconductor pillar, the third semiconductor pillar, and the sixth semiconductor pillar, and the second gate conductor layer, at least a part being overlapped on a second band area, the second band area being an extension of insides of two tangential lines of periphery of the fifth semiconductor pillar, the two tangential lines being parallel to the second center line, in planar view;

wherein, in planar view, the first gate conductor layer is at least overlapped on the first band area and protrudes toward the first line, and the second gate conductor layer is at least overlapped on the second band area and protrudes toward the second line.

2. The pillar-shaped semiconductor device according to claim 1, wherein, in the SRAM circuit in which the first set of SGTs and the second set of SGTs each consists of the three SGTs:

when the third SGT is for driving, the fourth SGT is for driving, and the fifth SGT and the sixth SGT are for loading; and when the third SGT is for loading, the fourth SGT is for loading, and the fifth SGT and the sixth SGT are for driving.

3. The pillar-shaped semiconductor device according to claim 1, in the SRAM circuit in which the first set of SGTs and the second set of SGTs each consists of four SGTs, the pillar-shaped semiconductor device comprising:

a seventh semiconductor pillar of a seventh SGT between the fifth semiconductor pillar and the first contact hole, with its center on the first line;

an eighth semiconductor pillar of an eighth SGT between the sixth semiconductor pillar and the second contact hole, with its center on the second line;

wherein the center of the seventh semiconductor pillar and the center of the eighth semiconductor pillar are on a third center line parallel to the first center line;

wherein when the seventh SGT is for driving, the eighth SGT is for driving; or wherein when the seventh SGT is for loading, the eighth SGT is for loading;

wherein a third gate conductor layer of the linked third SGT, the sixth SGT, and the eighth SGT is connected at side surface of entire third channel region of the third semiconductor pillar, the sixth semiconductor pillar, and the eighth SGT in a vertical direction;

wherein a fourth gate conductor layer of the linked fourth SGT, the fifth SGT, and the seventh SGT is connected at side surface of entire fourth channel region of the fourth semiconductor pillar, the fifth semiconductor pillar, and the seventh SGT in a vertical direction; and a third impurity area connected to a bottom of the seventh semiconductor pillar linked to the first impurity area connected to each bottom of the first semiconductor pillar, the fourth semiconductor pillar, and the fifth semiconductor pillar, and a fourth impurity area connected to a bottom of the eighth semiconductor pillar linked to the second impurity area connected to each bottom of the second semiconductor pillar, the third semiconductor pillar, and the sixth semiconductor pillar.

4. The pillar-shaped semiconductor device according to claim 3, wherein:

in planar view, a center line orthogonal to the first line of the first contact hole is deviated to one side from a center point between the center of the first semiconductor pillar and the center of the fifth semiconductor pillar;

in planar view, a center line orthogonal to the second line of the second contact hole is deviated in a direction opposite to the one side from a center point between the center of the second semiconductor pillar and the center of the sixth semiconductor pillar; and deviation of the center line of the first contact hole on the first line and deviation of the center line of the second contact hole on the second line have a same length.

5. The pillar-shaped semiconductor device according to claim 3, wherein each planar shape of the seventh semiconductor pillar and the eighth semiconductor pillar is a circular shape, or an elliptic or elongated shape having a long side in the first line direction.

6. The pillar-shaped semiconductor device according to claim 1, wherein:

the pillar-shaped semiconductor device is in a logic circuit of one circuit area apart from the SRAM circuit on the substrate, and comprises a ninth semiconductor pillar and a tenth semiconductor pillar having space at least the same as that of the third semiconductor pillar and the sixth semiconductor pillar in a direction the same as the first line, or a direction orthogonal to the first line; and a fifth gate conductor layer linked to each of a ninth SGT formed in the ninth semiconductor pillar and a tenth SGT formed in the tenth semiconductor pillar is connected at side surface of entire third channel region of the ninth semiconductor pillar and the tenth semiconductor pillar in a vertical direction.

7. The pillar-shaped semiconductor device according to claim 6, wherein each shape of the ninth semiconductor pillar and the tenth semiconductor pillar in planar view is circular, rectangular, or elliptic.

8. The pillar-shaped semiconductor device according to claim 6, wherein:

in planar view, a linked second circuit area is present in a direction the same as the first line, or a direction orthogonal to the first line of the one circuit area;

the pillar-shaped semiconductor device comprising an eleventh semiconductor pillar and a twelfth semiconductor pillar having space at least the same as that of the third semiconductor pillar and the sixth semiconductor pillar in a direction the same as the first line or a direction orthogonal to the first line;

wherein a sixth gate conductor layer linked to each of an eleventh SGT formed in the eleventh semiconductor pillar and a twelfth SGT formed in the twelfth semiconductor pillar is connected at side surface of entire fourth channel region of the eleventh semiconductor pillar and the twelfth semiconductor pillar in a vertical direction.

9. The pillar-shaped semiconductor device according to claim 1, wherein a first connecting area linking the first impurity area being linked to each bottom of the first set of semiconductor pillars, and a second connecting area linking the second impurity area being linked to each bottom of the second set of semiconductor pillars are formed by a metal layer, an alloy layer, or a semiconductor layer containing donor or acceptor impurity atoms.

10. The pillar-shaped semiconductor device according to claim 1, wherein:
   the first semiconductor pillar, the second semiconductor pillar, the third semiconductor pillar, and the fourth semiconductor pillar are provided as a first set, and the fifth semiconductor pillar and the sixth semiconductor pillar are provided as a second set; and
   each planar shape of the first set and the second set is a circular shape, or an elliptic or elongated shape having a long side in the first line direction.

\* \* \* \* \*